(12) United States Patent
Ohmi et al.

(10) Patent No.: US 6,829,279 B1
(45) Date of Patent: Dec. 7, 2004

(54) LASER OSCILLATING APPARATUS, EXPOSURE APPARATUS USING THE SAME AND DEVICE FABRICATION METHOD

(75) Inventors: Tadahiro Ohmi, 1-17-301, Komegafukuro 2-chome, Aoba-ku, Sendai-shi, Miyagi-ken (JP); Nobumasa Suzuki, Utsunomiya (JP); Hiroshi Ohsawa, Utsunomiya (JP); Nobuyoshi Tanaka, Tokyo (JP); Toshikuni Shinohara, Sendai (JP); Masaki Hirayama, Sendai (JP)

(73) Assignees: Canon Kabushiki Kaisha, Tokyo (JP); Tadahiro Ohmi, Sendai (JP)

( * ) Notice: Subject to any disclaimer, the term of this patent is extended or adjusted under 35 U.S.C. 154(b) by 0 days.

(21) Appl. No.: 09/494,945

(22) Filed: Feb. 1, 2000

(30) Foreign Application Priority Data

| Feb. 1, 1999 | (JP) | 11-023902 |
| Feb. 26, 1999 | (JP) | 11-051807 |
| Feb. 26, 1999 | (JP) | 11-051808 |
| Feb. 26, 1999 | (JP) | 11-051809 |
| Feb. 26, 1999 | (JP) | 11-051810 |
| Feb. 26, 1999 | (JP) | 11-051812 |
| Feb. 26, 1999 | (JP) | 11-051813 |

(51) Int. Cl.$^7$ .............................................. H01S 5/00
(52) U.S. Cl. ............................. 372/50; 372/55; 372/57; 372/92
(58) Field of Search .................... 372/50, 55, 57, 372/92

(56) References Cited

U.S. PATENT DOCUMENTS 5,050,181 A 9/1991 Gekat
5,224,117 A 6/1993 Krüger et al.
5,487,875 A * 1/1996 Suzuki .................. 422/186.05
5,517,608 A 5/1996 Suzuki et al.
6,049,170 A * 4/2000 Hochi et al. ................. 315/248
6,331,994 B1 * 12/2001 Ohmi et al. ................. 372/100
6,497,783 B1 * 12/2002 Suzuki et al. .......... 156/345.34
6,603,786 B1 * 8/2003 Ohmi et al. ................... 372/57
6,650,678 B1 * 11/2003 Ohmi et al. ................... 372/82
6,690,702 B1 * 2/2004 Ohmi et al. ................... 372/57

FOREIGN PATENT DOCUMENTS

| DE | 263 648 | 1/1989 |
| DE | 39 12 569 | 10/1990 |
| EP | 0 674 471 | 9/1995 |
| EP | 0 820 132 | 1/1998 |
| EP | 1026796 A2 * | 1/2000 |
| JP | 02-237183 | 9/1990 |
| JP | 10-163547 | 6/1998 |

* cited by examiner

*Primary Examiner*—Don Wong
*Assistant Examiner*—Delma R. Flores-Ruiz
(74) *Attorney, Agent, or Firm*—Fitzpatrick, Cella, Harper & Scinto

(57) ABSTRACT

In a laser oscillating apparatus for exciting a laser gas in a laser tube by introducing an electromagnetic wave from a waveguide into the laser tube through a plurality of slots formed in a waveguide wall, and generating a laser beam by resonating light emitted from the laser gas, the slots are formed in a line such that their longitudinal direction is consistent with the longitudinal direction of the waveguide, and a metal wall is so formed as to surround these slots. This metal wall forms a gap as a microwave passage from the slots to a window in the laser tube wall, thereby spacing the laser tube wall apart from the slots by a predetermined distance.

42 Claims, 57 Drawing Sheets

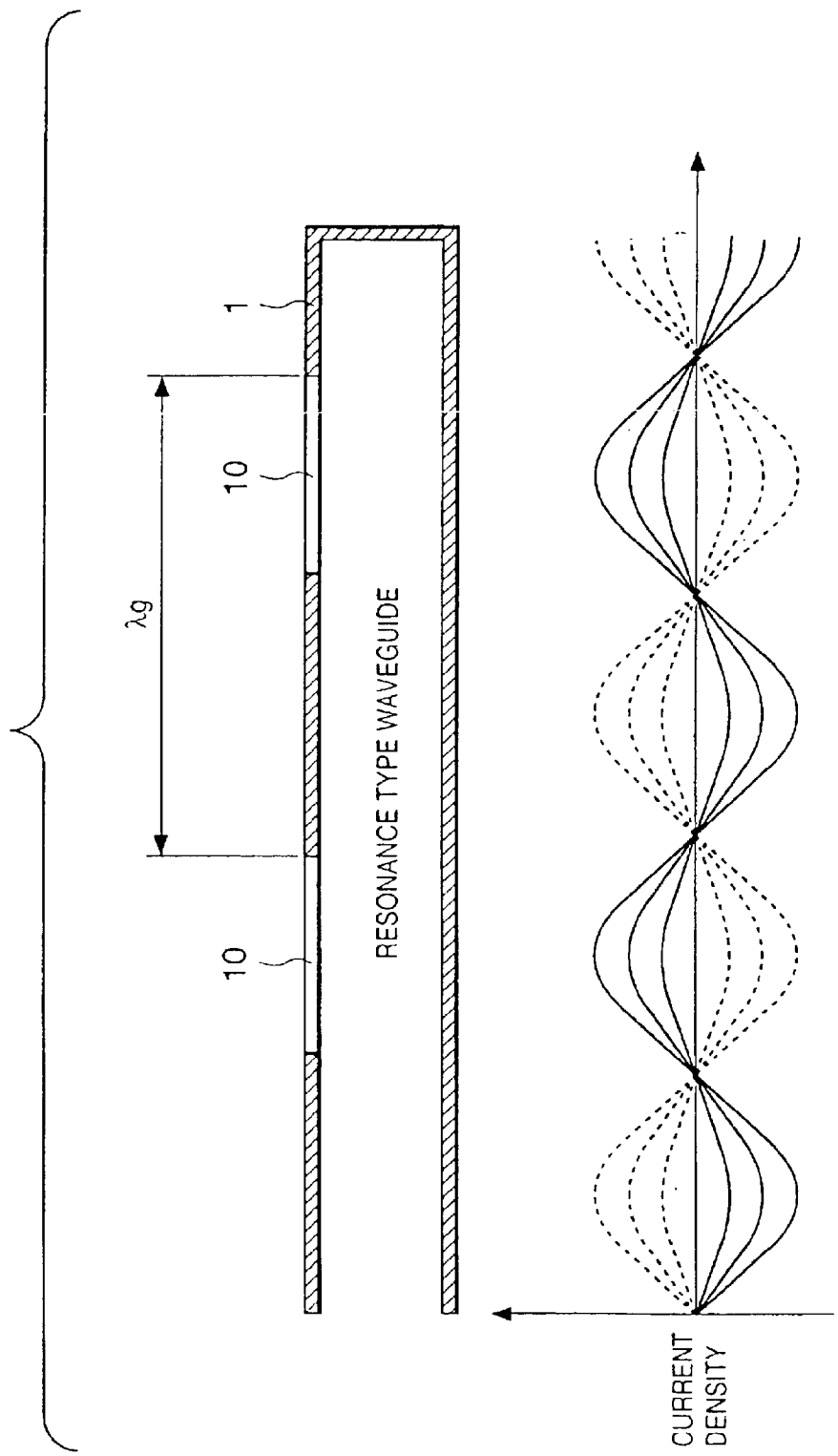

II-II' SECTION

I-I' SECTION

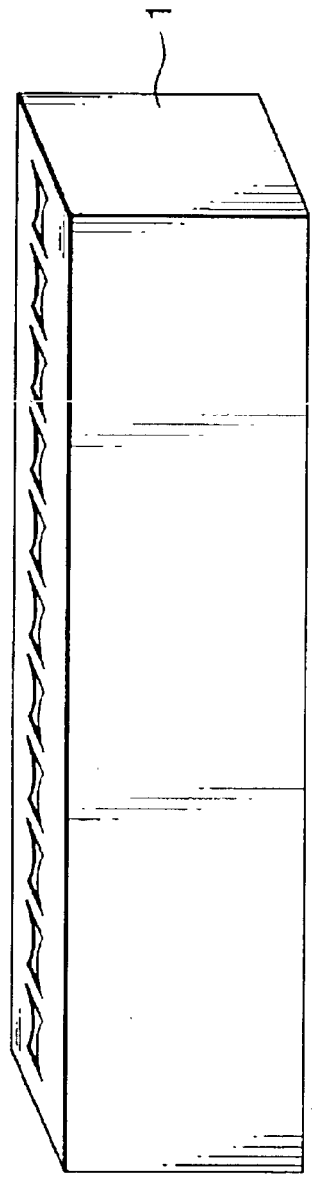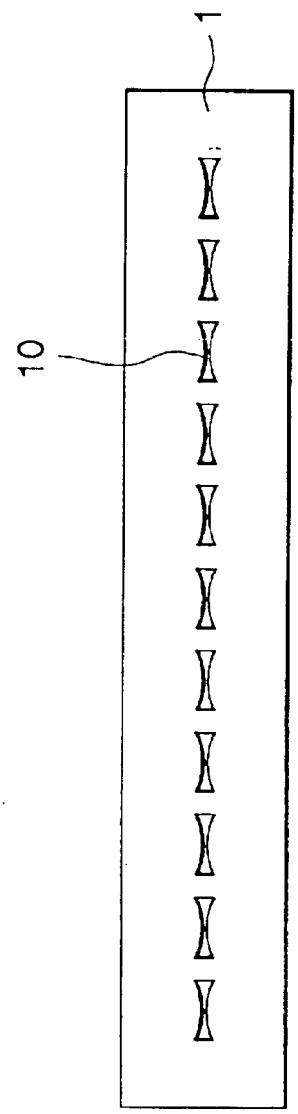
FIG. 15A
FIG. 15B

10

POSITIONAL RELATIONSHIP OF
IMPEDANCE CHANGING AIR GAP

SECTIONAL VIEW ( I - I' ) OF
IMPEDANCE CHANGING AIR GAP

POSITIONAL RELATIONSHIP OF
$\lambda g/4$-LONG AIR-GAP STRUCTURE

POSITIONAL RELATIONSHIP OF
λg/2-LONG AIR-GAP STRUCTURE

RESONANCE LENGTH SLOT $\lambda g/2$-PITCH
H-PLANE ANTENNA STRUCTURE

RESONANCE LENGTH SLOT $\lambda g$-PITCH
E-PLANE ANTENNA STRUCTURE

TAPERED SLOT

TAPER STRUCTURE

TAPERED SLOT

TAPER STRUCTURE

SLOT WITH LENS

217 DIELECTRIC LENS

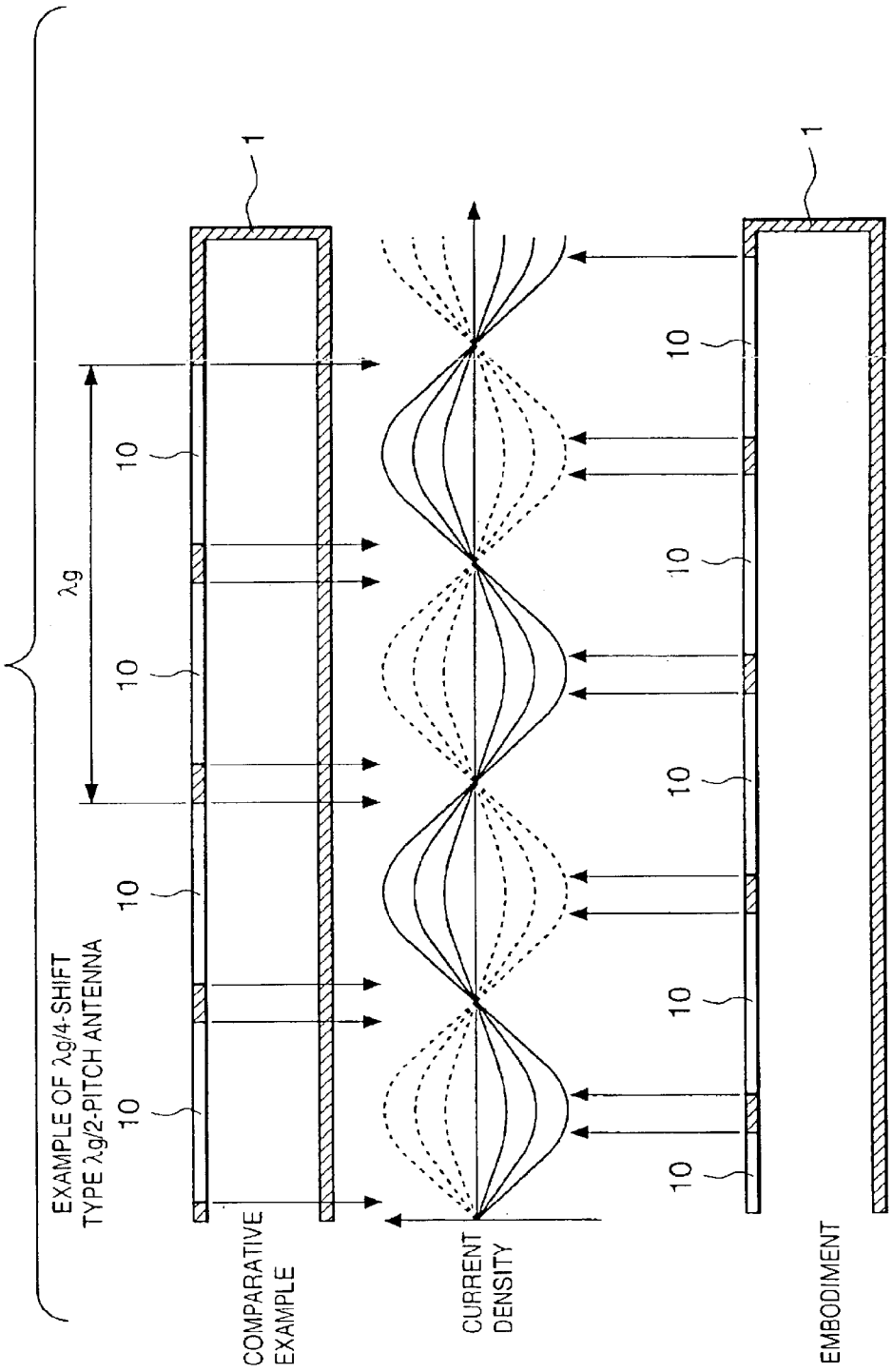

SECTION VIEWED IN DIRECTION
PERPENDICULAR TO SLOT LONG-AXIS DIRECTION

PLAN VIEW OF NOZZLE SHIELD

OUTLINE OF NOZZLE SHIELD

SECTION VIEWED IN SLOT SHORT-AXIS DIRECTION

POSITIONAL RELATIONSHIP BETWEEN SOLENOID AND LASER OSCILLATION DIRECTION

POSITIONAL RELATIONSHIP OF LASER OSCILLATION DIRECTION WHEN MAGNETS ARE USED

SECTION VIEWED IN SLOT SHORT-AXIS DIRECTION
( DIRECTION OF MAGNETIC FIELD IS
PERPENDICULAR TO PAPER SURFACE )

NOZZLE SLOT-MAGNETIC FIELD COMPOSITE
TYPE CONFINING STRUCTURE

WHEN SLOT WIDTH IS SMALL

WHEN SLOT WIDTH IS SMALL

WHEN SLOT WIDTH IS SMALL

EXAMPLE OF ELECTRIC FIELD INTENSITY NEAR SLOT

PLASMA WAVE INTENSITY (ALONE)

LASER OSCILLATING APPARATUS, EXPOSURE APPARATUS USING THE SAME AND DEVICE FABRICATION METHOD

BACKGROUND OF THE INVENTION

1. Field of the Invention

The present invention relates to a laser oscillating apparatus for generating a laser beam by introducing an electromagnetic wave from a waveguide into a laser tube through a plurality of fine gaps formed in the waveguide wall and, more specifically, to a laser oscillating apparatus using a microwave as an electromagnetic wave for exciting a laser gas, an exposure apparatus using the same, and a device fabrication method.

2. Description of the Related Art

Recently, a so-called excimer laser has attracted attention as the only high-output laser which oscillates in the ultraviolet region. This excimer laser is expected to be applied to the electronic, chemical, and energy industries, particularly processing and chemical reactions of metals, resins, glass, ceramics, and semiconductors.

The principle of function of an excimer laser oscillator will be described below. First, laser gases such as Ar, Kr, Ne, $F_2$, He, Xe, and $Cl_2$ contained in a laser tube are excited by electron beam irradiation or discharge. Excited F atoms bond to inert Kr and Ar atoms in the ground state to generate KrF and ArF as molecules existing only in an excited state. These molecules are called excimers. Since excimers are unstable, they immediately emit ultraviolet rays and fall to the ground state. This phenomenon is called spontaneous emission. An excimer laser oscillator uses this to amplify as an in-phase beam in an optical resonator constructed of a pair of reflecting mirrors and extract as a laser beam.

In the case of excimer laser emission, an excitation source using microwaves is known as a laser gas exciting source as described above. Microwaves are electromagnetic waves having an oscillation frequency of a few hundred MHz to several tens of GHz. As a laser gas exciting method using this microwave, a method has been proposed by which a microwave is introduced from a waveguide into a laser tube through a gap (slot) formed in the waveguide wall, thereby exciting a laser gas in the laser tube into a plasma.

In this excitation method, even if the intensity distribution of microwaves emitted through the slots is uniform, a slot array structure in which a plurality of slots are arrayed in the long-axis direction of a resonator must be formed in order to supply a microwave to a long space meeting the resonator length of a laser beam. This structure is shown in FIG. 55. Referring to FIG. 55, a plurality of fine gaps (slots) 9202 are formed at equal intervals in a waveguide wall 9201. For convenience, the interior of a laser tube is schematically shown as an emission space.

When this slot array structure is used, regions (hatched elliptic regions in FIG. 55) between adjacent slots 9202 are necessarily microwave non-irradiation regions. Accordingly, when a laser gas existing in the emission space is to be excited by a microwave, the existence of these non-irradiation regions produces variations in the microwave intensity. This generates plasma discharge having a nonuniform distribution as a whole.

As described above, it is difficult to uniformize the radiation characteristic of an electromagnetic wave from a slot formed in a waveguide wall in an entire region over the slot. Usually, the distribution is a sinusoidal distribution in the slot long-axis direction or a similar distribution. That is, as shown in FIG. 56A, an electric field intensity distribution in the center along the slot long-axis direction is largest, and the field intensity distribution at the ends in the slot long-axis direction is smallest.

Additionally, as shown in FIG. 56B, an excited plasma has a property of concentrating to the center in the slot long-axis direction with respect to the microwave field intensity distribution. This promotes the nonuniform distribution of the field intensity in the slot long-axis direction. This is a great cause of preventing a uniform distribution of a plasma excited in the slot longitudinal direction.

This phenomenon is caused by the property that a plasma is easily excited in a central position along the slot longitudinal direction because the intensity of an electromagnetic wave as an excitation source is a maximum in this central position, and by the property that the excited plasma readily concentrates into the form of a sphere having the smallest surface area. This plasma excited in the central position forms a region having a low spatial impedance in the center of the slot. This portion preferentially consumes energy. Also, the plasma functions as a shield to reduce the slot length, which is designed to be the one by which a microwaves is emitted, to half that required by a microwave. This makes it difficult to emit a microwave outside the slot. By these two factors, a plasma is readily formed only in the center of a slot, and it is very difficult to excite a uniform plasma over the slot.

Furthermore, a plasma is generated immediately close to the microwave emission surface over a slot. However, in a plasma sheath formed over the slot a microwave can propagate. As a consequence, a microwave extends in the slot short-axis direction via this sheath region and disperses the input power. This makes it impossible to satisfy energy density necessary to excite an excimer laser. The reason for this is that when a plasma is diffused in a wide space, energy used to generate the plasma disperses, and this makes it difficult to realize enough energy density to excite an excimer.

FIG. 57 is a schematic view showing the way a microwave propagates via a plasma sheath. That is, FIG. 57 is a sectional view taken along a direction perpendicular to the longitudinal direction of a slot.

Although a plasma is not electrically grounded over the slot, the outside of the plasma is basically grounded directly to a waveguide 1. This results in a sheath potential difference and a sheath width difference between them. Therefore, if the plasma density is insufficient, the thickness of the sheath increases, and this results in easy nonuniform outward leakage of a microwave. Consequently, the plasma is thin immediately above the open end of the slot and thick on the outside.

SUMMARY OF THE INVENTION

The present invention has been made in consideration of the above situation, and has as its object to provide a laser oscillating apparatus which uses a slot array structure and yet realizes electromagnetic wave radiation uniform as a whole over the length of a laser tube and allows uniform laser emission with minimum energy loss, a high-performance exposure apparatus including this laser oscillating apparatus, and a high-quality device fabrication method using this exposure apparatus.

It is another object of the present invention to provide a laser oscillating apparatus which uses a slot array structure and yet suppresses diffusion of a plasma generated over a slot and allows uniform laser emission with minimum energy loss, a high-performance exposure apparatus including this laser oscillating apparatus, and a high-quality device fabrication method using this exposure apparatus.

A laser oscillating apparatus for achieving the above objects according to the present invention is a laser oscillating apparatus for exciting a laser gas in a laser tube by introducing an electromagnetic wave from a waveguide into the laser tube through a plurality of fine gaps formed in a waveguide wall, and generating a laser beam by resonating light emitted from the laser gas, wherein the fine gaps and a wall of the laser tube are spaced apart by a predetermined distance to form an electromagnetic wave passage.

According to one aspect of the laser oscillating apparatus of the present invention, the distance from the fine gaps to the laser tube wall is an integral multiple of the half-wave length of an electromagnetic wave introduced from the waveguide.

According to another aspect of the laser oscillating apparatus of the present invention, an electromagnetic wave introduced from the waveguide is a microwave.

According to still another aspect of the laser oscillating apparatus of the present invention, a conductor is so formed as to surround the passage including the fine gaps, and the passage is an air gap with a predetermined width.

According to still another aspect of the laser oscillating apparatus of the present invention, the air gap is filled with a dielectric member.

According to still another aspect of the laser oscillating apparatus of the present invention, the width of the air gap is an integral multiple of the half-wave length of an electromagnetic wave introduced from the waveguide.

According to still another aspect of the laser oscillating apparatus of the present invention, only a distal end portion of the air gap is narrowed, and the air gap has the shape of a slit over the length of the laser tube in a portion where the air gap is in contact with the laser tube.

According to still another aspect of the laser oscillating apparatus of the present invention, the air gap is widened only in the vicinity of a distal end portion, and the width is substantially equal to the wavelength or the half-wave length of an electromagnetic wave introduced from the waveguide.

According to still another aspect of the laser oscillating apparatus of the present invention, the width near the distal end portion of the air gap changes along a longitudinal direction of the air gap by reflecting an intensity distribution of electromagnetic waves emitted from the fine gaps.

According to still another aspect of the laser oscillating apparatus of the present invention, dielectric lenses each having a symmetrical shape with respect to the fine gap are formed in the passage in at least a portion above the plurality of fine gaps.

According to still another aspect of the laser oscillating apparatus of the present invention, the waveguide is filled with a dielectric member.

In the laser oscillating apparatus described above, the fine gaps (slots) formed in the waveguide wall and the laser tube wall are spaced apart by a predetermined distance to form a passage for the electromagnetic wave. In this structure, the wavefront of an electromagnetic wave emitted from each fine gap is flattened near the laser tube wall, so the electromagnetic wave propagates in the form of an approximately plane wave as a whole in the laser tube. Accordingly, an electromagnetic wave in the form of a substantially uniform plane wave reaches a laser gas in the laser tube. This realizes uniform plasma discharge over the length of the laser tube and helps uniformize laser emission.

More specifically, the distance from the fine gaps to the laser tube wall is an integral multiple of the half-wave length, in the tube, of an electromagnetic wave introduced from the waveguide. Consequently, an electromagnetic wave emitted from each fine gap reaches the laser tube without interfering with a reflected wave or weakening each other.

Also, a conductor is so formed as to surround the passage including the fine gaps, and the passage is formed as a gap having a predetermined width (preferably, an integral multiple of the half-wave length of the electromagnetic wave in the tube). This can minimize energy loss. Preferably, the width is an integral multiple of the half-wave length of the electromagnetic wave in the tube. This makes it possible to give resonance conditions in a direction perpendicular to the fine gaps and set a high electric field in the slit.

Furthermore, by filling the gap with a dielectric member it is possible to prevent the generation of a plasma in the passage and reliably bring about plasma discharge only in the laser tube.

A laser oscillating apparatus for achieving the above objects according to the present invention is a laser oscillating apparatus for exciting a laser gas in a laser tube by introducing an electromagnetic wave from a waveguide into the laser tube through a plurality of fine gaps formed in a waveguide wall, and generating a laser beam by resonating light emitted from the laser gas, wherein the width of longitudinal end portions of the fine gap is made larger than the width of a central portion thereof.

According to still another aspect of the laser oscillating apparatus of the present invention, the end portions have circular shapes with a diameter larger than the width of the central portion.

A laser oscillating apparatus according to the present invention is a laser oscillating apparatus for exciting a laser gas in a laser tube by introducing an electromagnetic wave from a waveguide into the laser tube through a plurality of fine gaps formed in a waveguide wall, and generating a laser beam by resonating light emitted from the laser gas, wherein the fine gaps are formed apart from a central axis along a longitudinal direction of the waveguide, and each of the fine gaps is curved such that end portions are closer to the central axis than a central portion.

According to still another aspect of the laser oscillating apparatus of the present invention, the electromagnetic wave is radiated from the waveguide in the direction of a long end face of the waveguide.

A laser oscillating apparatus according to the present invention is a laser oscillating apparatus for exciting a laser gas in a laser tube by introducing an electromagnetic wave from a waveguide into the laser tube through a plurality of fine gaps formed in a waveguide wall, and generating a laser beam by resonating light emitted from the laser gas, wherein an air-gap structure is formed in the waveguide wall in which the fine gaps are formed.

According to still another aspect of the laser oscillating apparatus of the present invention, in the vicinities of end portions of the fine gap, the air-gap structure is formed within a range from the end portions to a distance of $\lambda g/4$ ($\lambda g$ is the waveguide wavelength of the electromagnetic wave).

According to still another aspect of the laser oscillating apparatus of the present invention, in the vicinities of end portions of the fine gap the air-gap structure is formed within a range from the end portions to a distance of λg/2 (λg is the waveguide wavelength of the electromagnetic wave).

According to still another aspect of the laser oscillating apparatus of the present invention, an air-gap portion of the air-gap structure in a central portion of the fine gap is made smaller than an air-gap portion near end portions of the fine gap.

According to still another aspect of the laser oscillating apparatus of the present invention, in a direction perpendicular to a longitudinal direction of the fine gap, the air-gap structure is formed with a width equal to an integral multiple of λg/2 (λg is the waveguide wavelength of the electromagnetic wave).

A laser oscillating apparatus for achieving the above objects according to still another aspect of the present invention is a laser oscillating apparatus for exciting a laser gas in a laser tube by introducing an electromagnetic waves from a waveguide into the laser tube through a plurality of fine gaps formed in a waveguide wall, and generating a laser beam by resonating light emitted from the laser gas, wherein a dielectric lens or a structure substantially equivalent to a lens, for the electromagnetic wave, is formed in the waveguide in a portion close to the fine gap.

A laser oscillating apparatus according to the present invention is a laser oscillating apparatus for exciting a laser gas in a laser tube by introducing an electromagnetic waves from a waveguide into the laser tube through a plurality of fine gaps formed in a waveguide wall, and generating a laser beam by resonating light emitted from the laser gas, wherein the width of longitudinal end portions of the fine gap is made smaller than the width of a central portion thereof.

A laser oscillating apparatus for achieving the above objects according to the present invention is a laser oscillating apparatus for exciting a laser gas in a laser tube by introducing an electromagnetic wave from a waveguide into the laser tube through a plurality of fine gaps formed in a waveguide wall, and generating a laser beam by resonating light emitted from the laser gas, wherein the fine gap is formed in a portion where an emission characteristic of an electromagnetic wave depending on the fine gap is contrary to an intensity distribution of an electromagnetic wave propagating in the waveguide.

According to still another aspect of the laser oscillating apparatus of the present invention, the fine gap is formed such that a minimum value of an intensity distribution of an electromagnetic wave propagating in the waveguide is in substantially the center of the fine gap.

According to still another aspect of the laser oscillating apparatus of the present invention, the fine gaps are formed in a line at a pitch equal to the waveguide wavelength or the half-wave length of an electromagnetic wave in the waveguide.

According to still another aspect of the present invention, an electromagnetic wave introduced from the waveguide is a microwave.

In the laser oscillating apparatus of the present invention described above, each fine gap is formed in a portion where the emission characteristic of an electromagnetic wave from this fine gap is contrary to the intensity distribution of an electromagnetic wave propagating in the waveguide. The emission characteristic of an electromagnetic wave depending upon the fine gap exhibits a distribution in which, as described above, the electromagnetic wave intensity is a maximum in the central portion of the fine gap and decreases toward the end portions of the fine gap. Therefore, when each fine gap is formed in a position where the intensity distribution of an electromagnetic wave propagating in the waveguide is contrary to this, the intensity distribution of the electromagnetic wave propagating in the waveguide is influenced by the intensity distribution due to the emission characteristic of an electromagnetic wave depending on the fine gap. Consequently, the uniformity of the intensity distribution of an electromagnetic wave emitted from each fine gap actually increases over the whole region of each fine gap.

More specifically, when fine gaps are to be formed in a line at a pitch equal to the guide wavelength, or its half-wave length, of an electromagnetic wave in the waveguide by assuming an E-plane antenna, each fine gap is so formed that a minimum value of the intensity distribution of an electromagnetic wave propagating in the waveguide is positioned in substantially the center of the fine gap. That is, these fine gaps are formed in portions where they are equally deviated by λg/4 (λg: the waveguide wavelength) from positions at which a maximum value of the emission intensity distribution of an electromagnetic wave comes to the center of each fine gap in accordance with the intensity distribution of an electromagnetic wave propagating in the waveguide. By this relatively simple method, it is possible to further uniformize the intensity distribution of an electromagnetic wave emitted from each fine gap.

A laser oscillating apparatus for achieving the above objects according to still another aspect of the present invention is a laser oscillating apparatus for generating a plasma by exciting a laser gas in a laser tube by introducing an electromagnetic wave from a waveguide into the laser tube through a plurality of fine gaps formed in a waveguide wall, and generating a laser beam by resonating light emitted from the plasma, comprising a shielding structure in the laser tube in order to prevent the plasma excited above the fine gaps from diffusing from a predetermined region.

According to still another aspect of the laser oscillating apparatus of the present invention, the shielding structure is formed to prevent diffusion of the electromagnetic wave and the plasma in a direction perpendicular to a longitudinal direction of the fine gaps.

According to still another aspect of the laser oscillating apparatus of the present invention, the shielding structure comprises a metal wall spaced apart from the fine gaps by a predetermined distance.

According to still another aspect of the laser oscillating apparatus of the present invention, the shielding structure is made from a mesh-like plate member.

According to still another aspect of the laser oscillating apparatus of the present invention, the shielding structure comprises a plurality of nozzles having predetermined openings.

According to still another aspect of the laser oscillating apparatus of the present invention, the nozzle is a passage of the laser gas.

According to still another aspect of the laser oscillating apparatus of the present invention, the shielding structure is formed by a magnetic field.

A laser oscillating apparatus for achieving the above objects according to still another aspect of the present invention is a laser oscillating apparatus for generating a plasma by exciting a laser gas in a laser tube by introducing an electromagnetic wave from a waveguide into the laser tube through a plurality of fine gaps formed in a waveguide wall, and generating a laser beam by resonating light emitted from the plasma, wherein the width in a short-side direction of the fine gap is made smaller than the thickness of a sheath serving as a passage of the electromagnetic wave extending from an opening of the fine gap in the short-side direction.

According to still another aspect of the laser oscillating apparatus of the present invention, the width in the short-side direction is 10 to 100 μm.

A laser oscillating apparatus according to still another aspect of the present invention is a laser oscillating apparatus for generating a plasma by exciting a laser gas in a laser tube by introducing an electromagnetic wave from a waveguide into the laser tube through a plurality of fine gaps formed in a waveguide wall, and generating a laser beam by resonating light emitted from the plasma, wherein each of the fine gaps comprises a plurality of rows of slits.

According to still another aspect of the laser oscillating apparatus of the present invention, the width of slits in end rows is smaller than the width of slits in rows near the center.

According to still another aspect of the laser oscillating apparatus of the present invention, the length of slits in end rows is smaller than the length of slits in rows near the center.

According to still another aspect of the laser oscillating apparatus of the present invention, a shielding structure for suppressing diffusion of the plasma is formed on the side of an opening edge of the fine gap facing the laser tube.

A laser oscillating apparatus for achieving the above objects according to still another aspect of the present invention is a laser oscillating apparatus for exciting a laser gas in a laser tube by introducing an electromagnetic wave from a waveguide into the laser tube through a plurality of fine gaps formed in a waveguide wall, and generating a laser beam by resonating light emitted from the laser gas, comprising a pair of waveguides formed to sandwich the laser tube such that formation surfaces of the fine gaps oppose each other, identical electromagnetic waves being supplied to the pair of waveguides to excite a laser gas in two opposite directions in the laser tube. In this apparatus, the pair of waveguides are constructed such that intensity distributions of electromagnetic waves introduced therefrom are shifted from each other.

According to still another aspect of the laser oscillating apparatus of the present invention, the formation surfaces of the fine gaps are short-end faces of the waveguides, and the fine gaps are formed in a line at equal intervals in a longitudinal direction of the fine gaps.

According to still another aspect of the laser oscillating apparatus of the present invention, the waveguides are arranged such that fine gaps corresponding to each other between the opposing formation surfaces are shifted relative to each other by a predetermined distance.

According to still another aspect of the laser oscillating apparatus of the present invention, the apparatus further comprises phase adjusting means for shifting phases of electromagnetic waves supplied into the waveguides relative to each other.

According to still another aspect of the laser oscillating apparatus of the present invention, each of the waveguides comprises tuning means for tuning an electromagnetic wave.

According to still another aspect of the laser oscillating apparatus of the present invention, an electromagnetic wave introduced from the waveguide is a microwave.

In the laser oscillating apparatus of the present invention described above, a pair of waveguides are so formed as to sandwich the laser tube such that the formation surfaces of the fine gaps (slots) oppose each other, and laser gas excitation is performed in two opposite directions in the laser tube. In accordance with various demands, the spatial positions of the two waveguides are adjusted such that the fine gaps in the opposing formation surfaces are shifted a predetermined distance relative to each other. Alternatively, the phases of electromagnetic waves supplied to these waveguides are shifted relative to each other. Consequently, variations of the wavefront of an electromagnetic wave resulting from the discontinuity of the fine gaps compensate for each other, so the light emission region substantially increases to flatten the wavefront. Accordingly, an electromagnetic wave substantially uniformly reaches the whole of a laser gas in the laser tube. This realizes uniform plasma discharge over the length of the laser tube and helps uniformize laser emission.

According to still another aspect of the present invention, the above laser oscillating apparatus is an excimer laser oscillator in which the laser gas is at least one inert gas selected from Kr, Ar, and Ne or a gas mixture of this inert gas and $F_2$ gas.

Also, according to the present invention, there is provided an exposure apparatus comprising the aforementioned laser oscillating apparatus as a light source for emitting illuminating light, a first optical system for irradiating a reticle on which a predetermined pattern is formed with the illuminating light from the laser oscillating apparatus, and a second optical system for irradiating a surface to be irradiated with the illuminating light passing through the reticle, wherein the surface to be irradiated is exposed by projecting the predetermined pattern of the reticle.

Furthermore, according to the present invention, there is provided a device fabrication method comprising the steps of coating a surface to be irradiated with a photosensitive material, exposing the surface to be irradiated coated with the photosensitive material to a predetermined pattern by using the exposure apparatus described above, and developing the photosensitive material exposed to the predetermined pattern.

According to one aspect of the device fabrication method of the present invention, the surface to be irradiated is a wafer surface, and a semiconductor device is formed on the wafer surface.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 4 is a view showing the relationship between the slot positions in the waveguide and the current density produced by a microwave;

FIGS. 15A and 15B are schematic views showing a practical structure of a waveguide of the excimer laser oscillator according to the second embodiment;

FIG. 31 is a schematic view showing the relationship between the slot formation portions in a waveguide and the density of a current flowing through the wall surface of the waveguide according to a modification of the fifth embodiment;

DETAILED DESCRIPTION OF THE PREFERRED EMBODIMENTS

Preferred embodiments of the present invention will now be described in detail in accordance with the accompanying drawings.

First Embodiment

Figure 1:
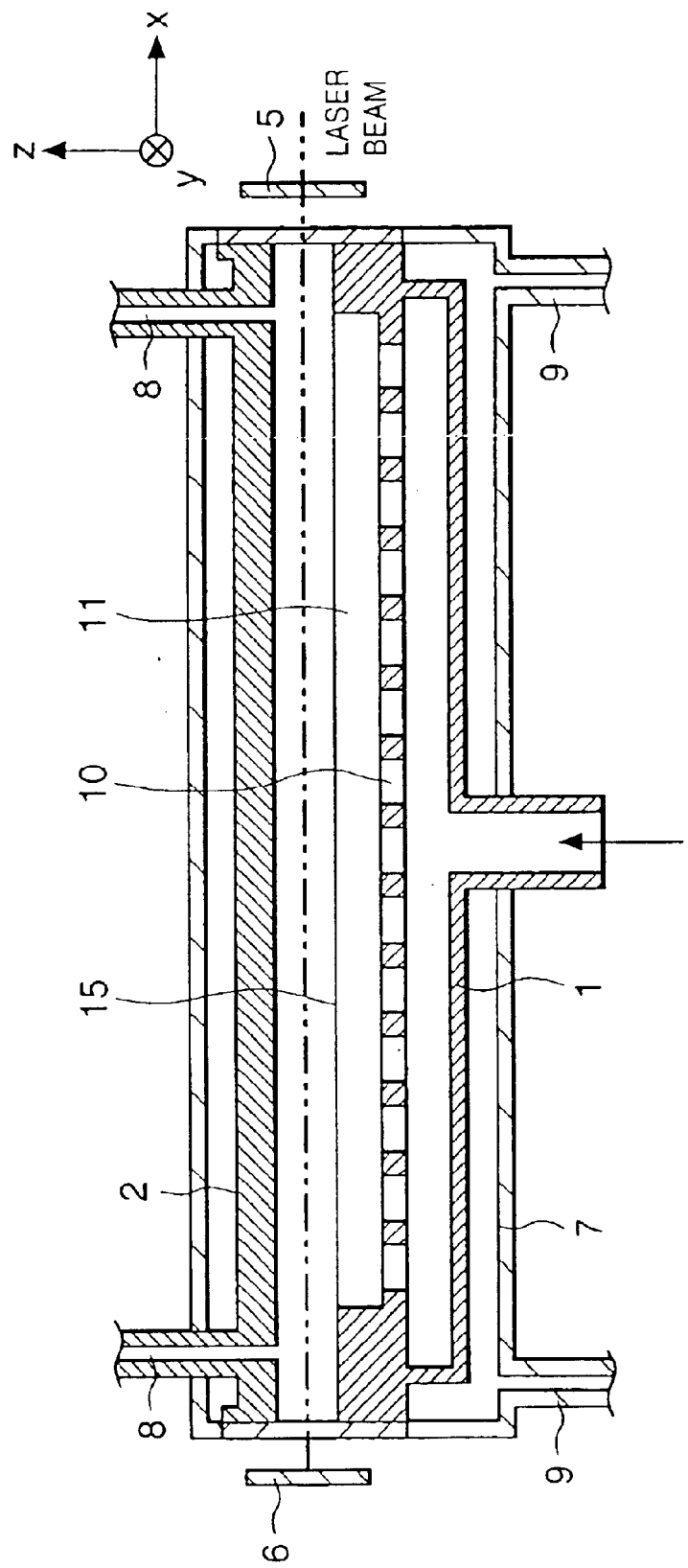
FIG. 1 is a schematic view showing the major components of an excimer laser oscillator according to the first embodiment.

The first embodiment will be described below. In this embodiment, an excimer laser oscillator which emits a so-called excimer laser beam will be explained. FIG. 1 is a schematic view showing the main parts of the excimer laser oscillator of this embodiment.

As shown in FIG. 1, this excimer laser oscillator includes a laser tube 2, waveguide 1, and cooling vessel 7. The laser tube 2 emits a laser beam by resonating light emission due to excitation of an excimer laser gas. The waveguide 1 excites the excimer laser gas in the laser tube 2 to generate a plasma. The cooling vessel 7 has cooling water inlet/output ports 9 for cooling the waveguide 1.

The excimer laser gas as a material for generating an excimer laser beam is at least one inert gas selected from Kr, Ar, Ne and He, or a gas mixture of at least one inert gas described above and $F_2$ gas. These gases can be appropriately selected and used in accordance with the wavelength of interest. For example, KrF is used when a laser beam with a wavelength of 248 nm is to be generated; $ArF_2$ is used when a laser beam with a wavelength of 193 nm is to be generated; and $F_2$ is used when a laser beam with a wavelength of 157 nm is to be generated. Also, $Kr_2$ is used when a laser beam with a wavelength of 147 nm is to be generated, ArKr is used when a laser beam with a wavelength of 134 nm is to be generated, and $Ar_2$ is used when a laser beam with a wavelength of 126 nm is to be generated.

The laser tube 2 has laser gas inlet/output ports 8 through which the excimer laser gas is introduced into the tube, and reflecting structures 5 and 6 at the two end portions. These reflecting structures 5 and 6 equalize the phases of light by plasma discharge and generate a laser beam.

The waveguide 1 is a means for supplying a microwave to the laser gas in a gas supply passage structure 11. As shown in FIG. 1, a plurality of long and narrow slots 10 are formed in the upper surface. When a microwave with a frequency of a few hundred MHz to several tens of GHz is introduced from the lower portion of the waveguide 1 shown in FIG. 1, this microwave propagates in the waveguide 1 and is emitted from the slots 10 to the outside of the waveguide 1. The emitted microwave is introduced into the laser tube 2 through a window 15 formed in this laser tube 2. The microwave thus introduced excites the excimer laser gas in the laser tube 2, thereby generating an excimer laser beam by resonance.

In this embodiment, the waveguide 1 has a conductor plate, i.e., a metal wall 12 (FIGS. 2A, 2B, 3A, and 3B), in a portion between the waveguide wall and the laser tube wall. This metal wall 12 separates the waveguide wall from the laser tube wall by a predetermined distance.

Figure 2A:
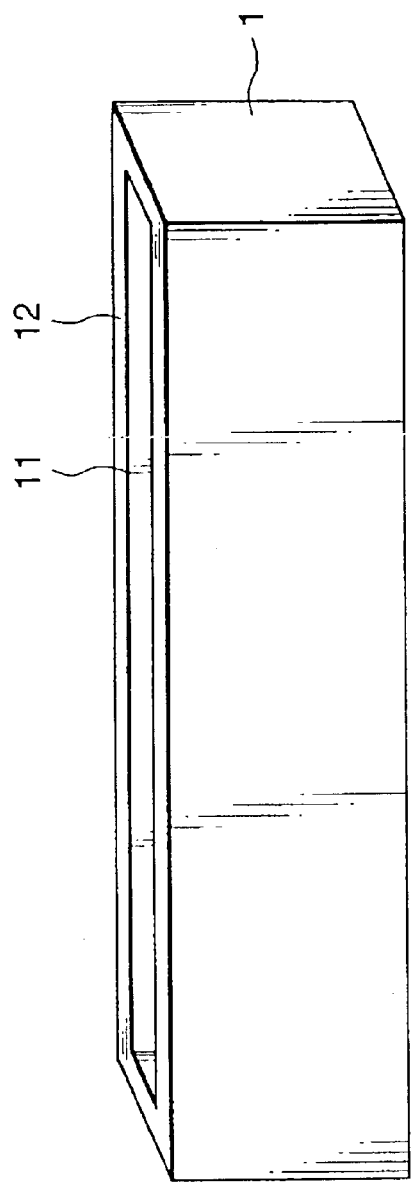
FIGS. 2A and 2B are schematic views showing a practical structure of a waveguide according to the first embodiment.
Figure 2B:
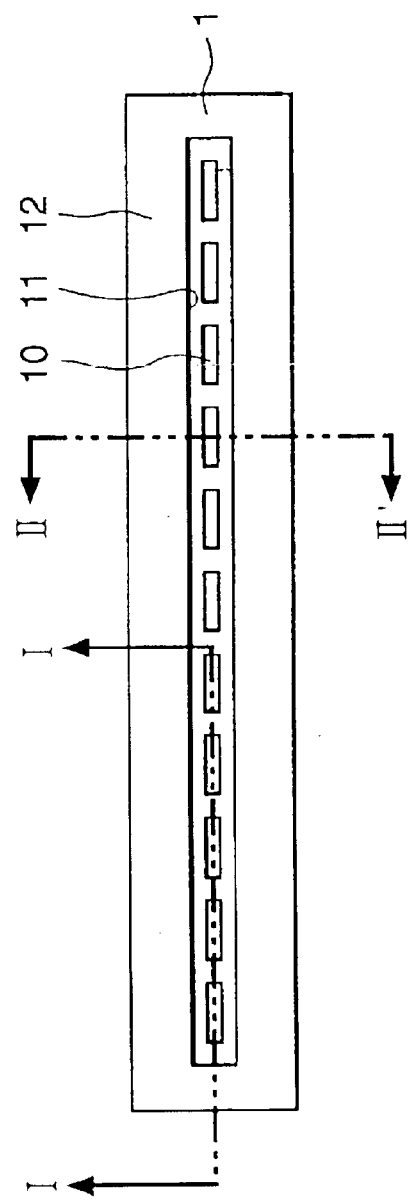
Figure 3A:
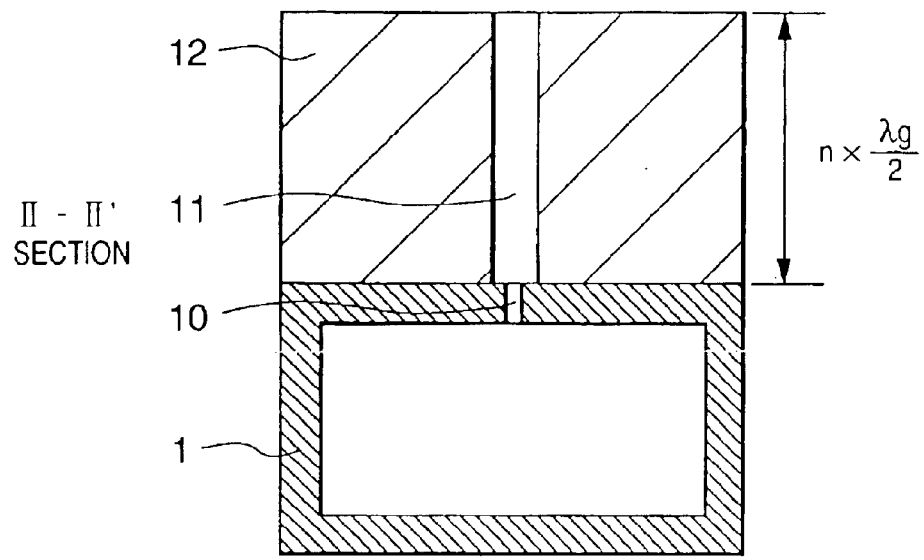
FIGS. 3A and 3B are schematic sectional views showing a practical structure of the waveguide.
Figure 3B:
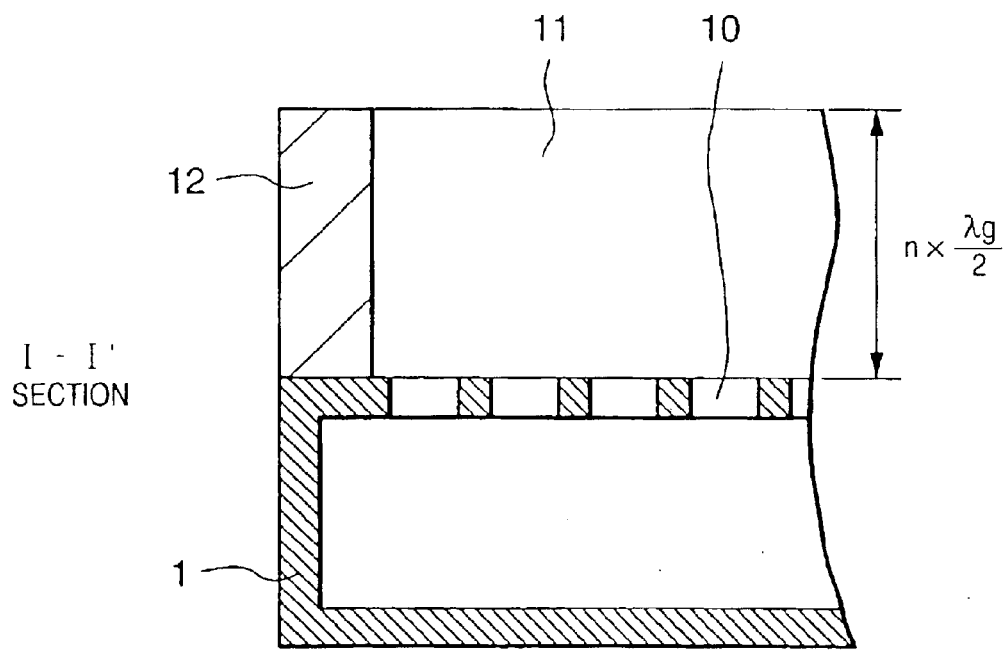

FIGS. 2A, 2B, 3A, and 3B show practical structures of the waveguide 1. FIG. 2A is a schematic perspective view of the waveguide 1. FIG. 2B is a plan view of the waveguide 1. FIG. 3A is a sectional view taken along a line II–II' of FIG. 2B. FIG. 3B is a sectional view taken along a line I–I' of FIG. 2B.

As shown in FIG. 2B, the slots 10 are arranged in a line such that their longitudinal direction is consistent with the longitudinal direction of the waveguide 1. The metal wall 12 is so formed as to surround these slots 10. As shown in FIG. 3A, between the slots 10 and the window 15 in the laser tube wall, this metal wall 12 forms a space which covers the entire area of the waveguide 1 in the longitudinal direction of the laser tube 2. This space is a microwave passage 11.

In this embodiment, the slots 10 are formed in a so-called E plane of the waveguide 1. To form the slits 10 in an H plane, a metal wall must be formed so that a passage corresponding to the formation portion of the slits 10 is formed.

The E plane is a plane parallel to the direction of the electric field of a $TE_{10}$ modemicrowave. The H plane is a plane perpendicular to this microwave field direction.

The distance from the slots 10 to the window 15 of the laser tube wall is an integral multiple of the waveguide half-wave length of a microwave introduced from the waveguide 1, i.e., is a distance d represented by $$d = n \times \lambda g / 2 \quad (1)$$

where λg is the waveguide wavelength of a microwave, and n is an integer.

Accordingly, the passage 11 functions as a resonator to prevent a microwave emitted from each slot 10 from interfering with a reflected wave from the laser tube 2 and weakening each other.

The integer n can take any arbitrary value. However, if this value is too large, when a microwave propagates in the passage 11, the loss by absorption of the microwave to the metal wall 12 increases, as will be described later. Hence, the integer n is most preferably set to about 1 to 3 as will be explained later.

For the same reason as above, the width of the passage 11 is an integral multiple of the waveguide half-wave length of a microwave introduced from the waveguide 1, i.e., is a width w represented by $$w = n \times \lambda g / 2 \quad (2)$$

The function of the waveguide 1 including the passage 11 will be described below.

When a microwave propagates in the waveguide 1, an electric current flows through the waveguide wall. A microwave exists as a standing wave in a propagation space defined by the distance in the longitudinal direction of the waveguide 1. Owing to this standing wave, the current in the waveguide wall also takes the form of a standing wave. However, the form of the standing wave of a microwave is three-dimensional and complicated. Therefore, it is convenient to consider, as an index, the standing wave of an electric current in a general distributed constant line.

Figure 5:
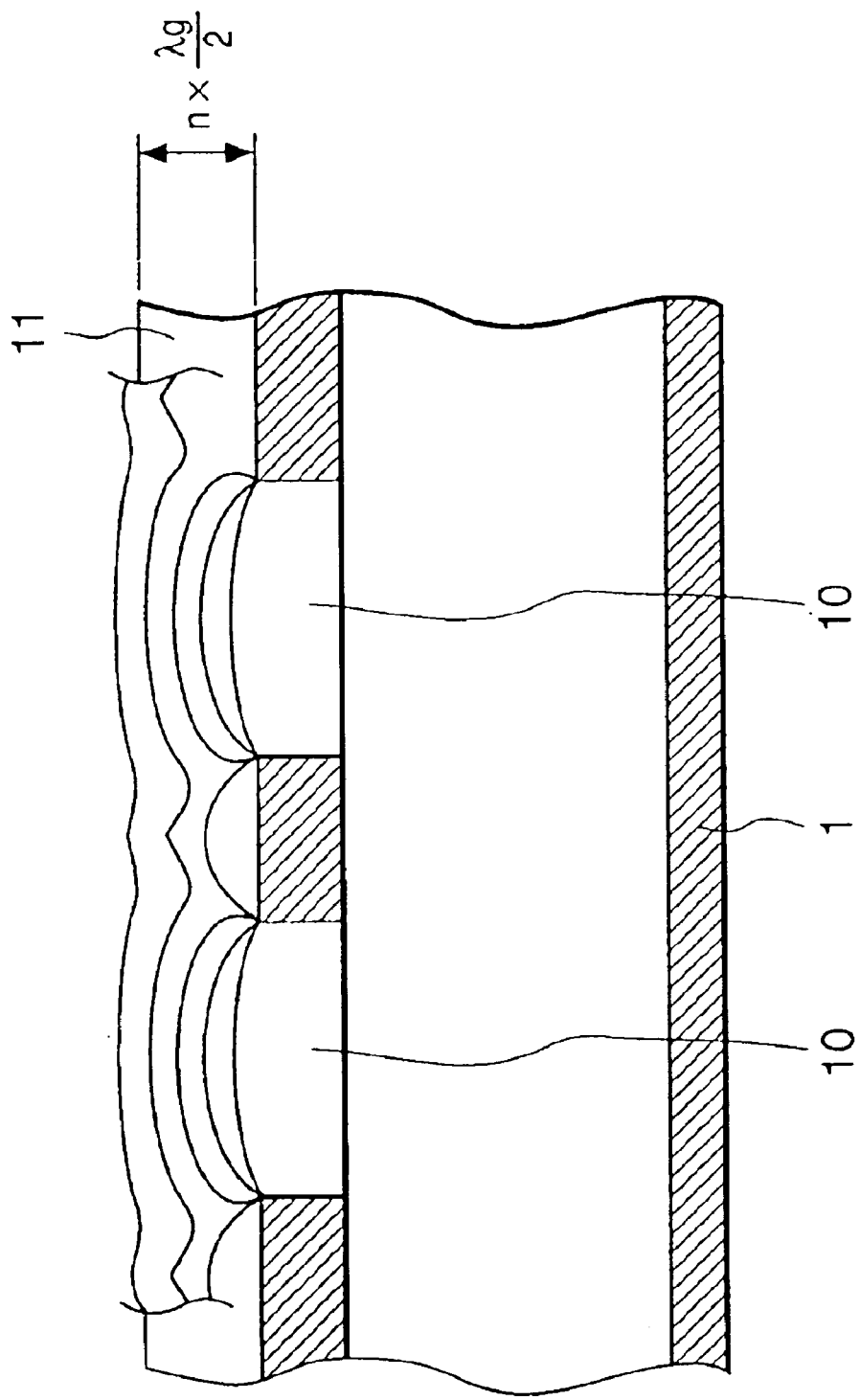
FIG. 5 is a schematic sectional view showing the way a microwave is emitted from slots.

FIG. 4 shows an example using the current standing wave described above as an index. In this example, the slots 10 are formed so that their formation portions correspond to the antinodes of the standing wave of a current (i.e., the standing wave of a microwave). Accordingly, as shown in FIG. 5, immediately after the microwave is emitted from the slots 10, the wavefront of the microwave assumes a discontinuous curved shape corresponding to the slots 10 owing to the array structure of the slots 10. The microwave gradually approaches a plane wave as it propagates, from each slot 10, in the passage 11 regulated by the metal wall 12. When the microwave is emitted outside (i.e., into the laser tube) through the passage 11, its wavefront assumes a substantially plane-wave shape over the entire formation region of the slots 10.

Accordingly, a microwave in the form of a substantially uniform plane wave reaches the excimer laser gas in the laser tube 2. This realizes uniform plasma discharge over the length of the laser 2 and helps uniformize laser emission.

Modifications of the first embodiment will be described below. Note that the same reference numerals as in the above embodiment denote the same parts, and a detailed description thereof will be omitted.

Modification 1

Figure 6A:
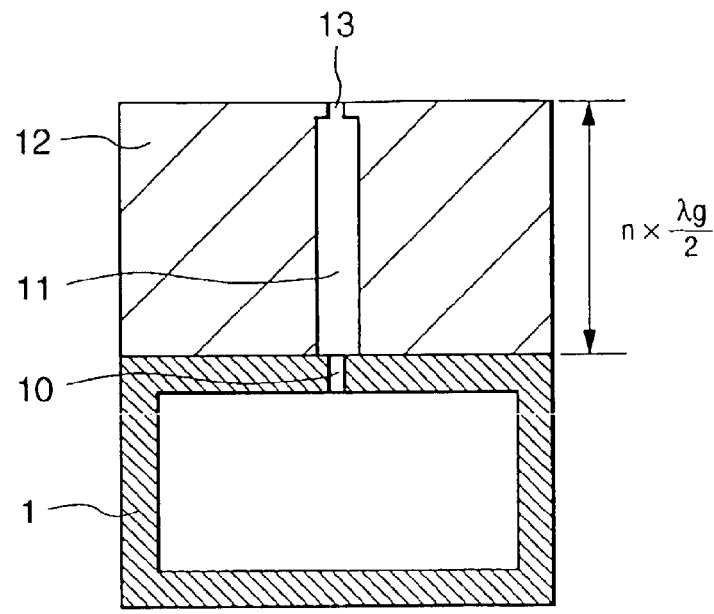
FIGS. 6A and 6B are schematic sectional views showing a practical structure of a waveguide in Modification 1.
Figure 6B:
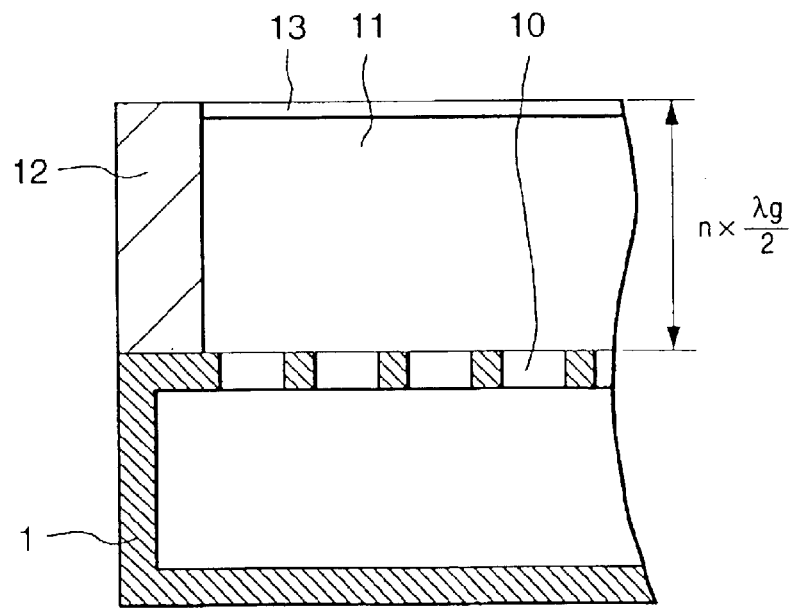

In this Modification 1, as shown in FIGS. 6A and 6B (sectional views similar to FIGS. 3A and 3B), the metal wall 12 is formed such that only an end portion 13 of the passage 11 is narrowed. This end portion 13 of the passage 11 is slit over the length of the laser tube 2 in a portion (i.e., the window 15) where the end portion 13 is in contact with the laser tube 2.

When the passage 11 is formed into this shape, unintentional energy scattering can be further suppressed when a microwave is emitted into the laser tube 2.

Modification 2

Figure 7:
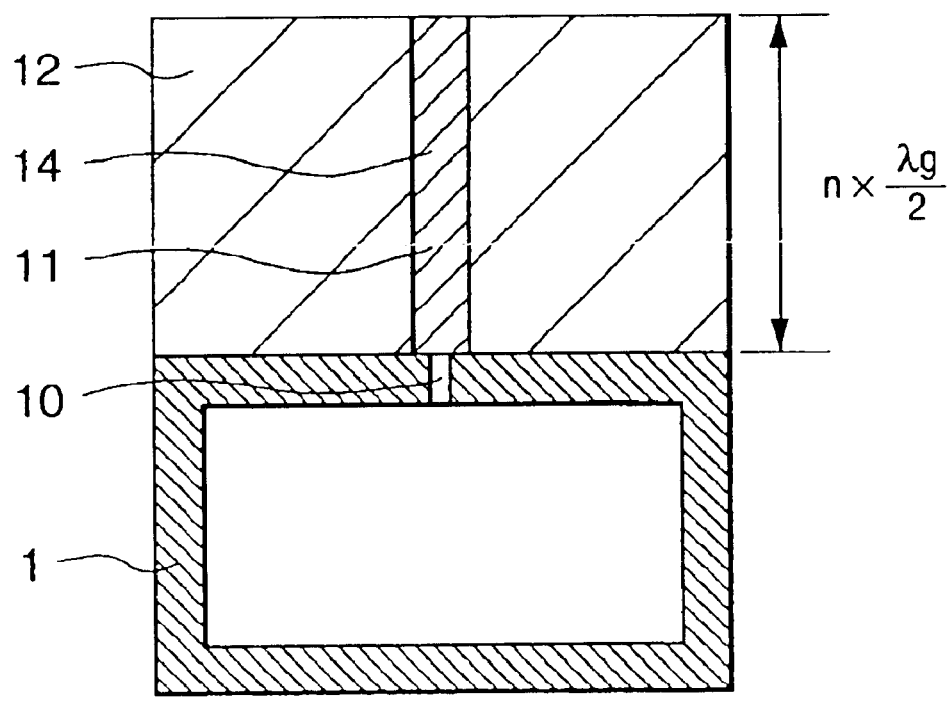
FIG. 7 is a schematic sectional view showing a practical structure of a waveguide in Modification 2.
Figure 8:
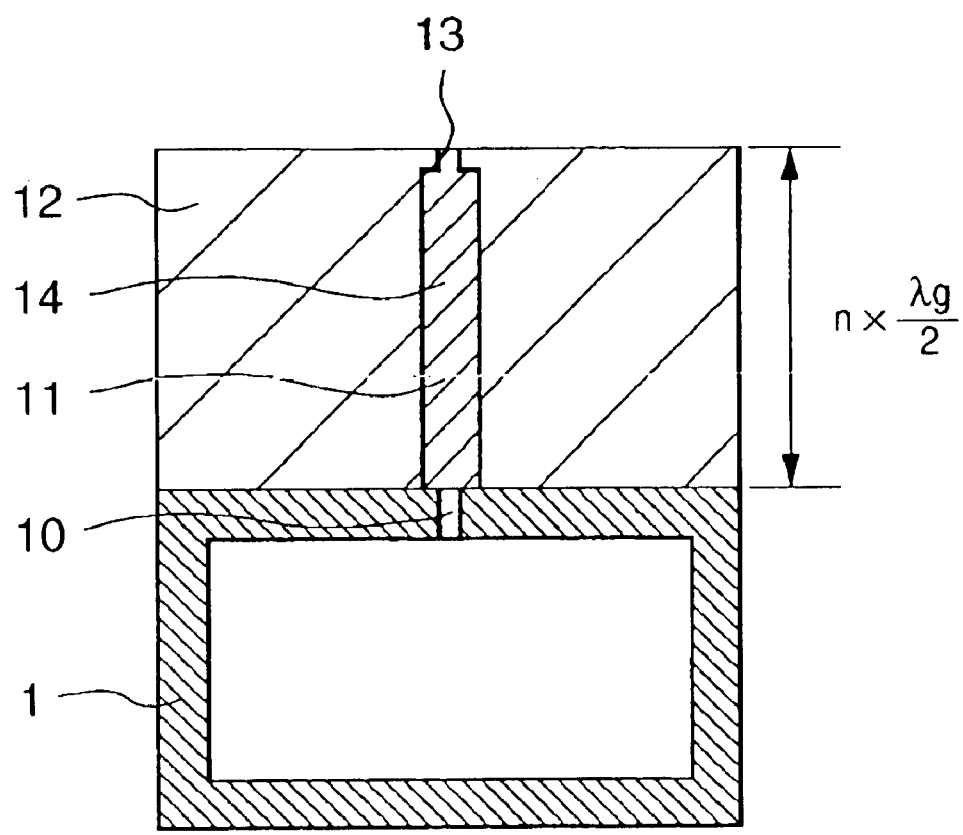
FIG. 8 is a schematic sectional view showing a practical structure of the waveguide in Modification 2.

In this Modification 2, the passage 11 is filled with a dielectric member 14 as shown in FIGS. 7 and 8 in the structures shown in FIGS. 3A and 6A, respectively. Suitable materials of this dielectric member 14 are quartz, calcium fluoride, aluminum nitride, alumina, and zirconia.

By filling the passage 11 with the dielectric member 14, the generation of a plasma in the passage 11 can be prevented. This dielectric member 14 used desirably has a high dielectric constant and a small dielectric loss for more efficient propagation of a microwave.

Furthermore, the dielectric member 14 can be composed of a plurality of different members made from a plurality of different dielectric substances having different dielectric constants. That is, when the resistance against fluorine gas or a plasma having high reactivity or the transmittance of a microwave is taken into consideration, the dielectric member shown in FIG. 7 can be composed of a plurality of different dielectric substances having different physical characteristics or different dielectric constants. For example, the end portion 13 and the other portion of the dielectric member 14 shown in FIG. 8 can be constructed of a plurality of different dielectric substances having different dielectric constants.

To rapidly emit large amounts of heat simultaneously generated in plasma to the outside, the dielectric member 14 is required to have high thermal conductivity. Additionally, since the dielectric member 14 is exposed to an ambient, such as an excimer laser, containing $F_2$ which is highly reactive and the like, it is important for this dielectric member 14 to have high resistance against corrosive gases. The surface in contact with the emission end of a microwave, i.e., a plasma is in very severe environment at a high temperature of 100 to 1,000° C. (depending on the incident energy) plus sputtering by ion irradiation of a few eV to a few hundred eV (depending on the plasma potential) from the plasma. Accordingly, AlN or alumina having high thermal conductivity and a relatively high $F_2$ resistance is used as the material of the dielectric member 14. Also, the surface (the interface with the plasma) of this dielectric member 14 is coated with a fluoride, such as $CaF_2$, $LiF_2$, $AlF_3$ or $MgF_2$, having a thickness of a few am to a few hundred $\mu$m. Consequently, it is possible to simultaneously achieve high thermal conductivity, high resistance to corrosive gases, and high sputtering resistance.

The energy loss in the passage 11 is roughly divided into two losses: dielectric loss in the packed dielectric member and loss on the waveguide wall. An attenuation constant a by the dielectric loss is represented by $$\alpha = \omega \mu \sigma / 2\beta \qquad (3)$$

($\omega$: angular frequency/$\mu$: permeability/$\sigma$: electrical conductivity/$\beta$: phase constant). Focusing attention on the TE10 mode, the loss on the waveguide wall is given by $$\alpha = \frac{1}{\xi_b \delta \sigma} \frac{1 + \frac{2b}{a}\left(\frac{\lambda}{2a}\right)^2}{\sqrt{1 - \left(\frac{\lambda}{2a}\right)^2}}$$

($\zeta$: electric wave impedance/$\delta$: skin depth)

The dominating one of these two losses need only be smaller than the energy supplied by a plasma. That is, letting r be the absorptivity of microwaves by a plasma, r <<1. When round trip (multiple reflection) between the slot surface and the plasma interface is taken into consideration, the maximum length of the uniformized line can be defined by using n meeting $$\exp(-2\alpha \cdot n\lambda g/2) < r \qquad (4)$$

In respect of the efficiency of a microwave, however, it is important to set the loss to be as small as possible compared to the absorption r. It is preferable to design the loss to be about 1/10 to 1/100 of r (with this design, a system having smaller loss can be designed).

A practical experiment conducted by filling the passage 11 with the dielectric member 14 will be described below.

An E-surface emission antenna having a=42 mm, b=21 mm, and a waveguide resonator length (in the longitudinal direction, i.e., the laser oscillation direction) of 220.8 mm was used to manufacture a 2.45-GHz microwave emission antenna having an Al alloy housing in which the metal wall 12 was formed in front of the slots. A waveguide resonator, i.e., the passage 11 was filled with alumina with a dielectric constant of 9.8. The wavelength in the waveguide resonator was 44.2 mm. Accordingly, the slot pitch was also set to 44.2 mm.

A microwave emitted from the slots was emitted into the passage 11. This passage 11 was approximately a parallel-plate waveguide. Under the approximation, the wavelength was 39.1 mm, equal (inside the dielectric member) to the wavelength in a free space. In effect, the waveguide was a rectangular waveguide whose a was a length of 235.3 mm in the laser oscillation direction of the passage 11. The waveguide wavelength was 39.2 mm, different from the wavelength in a free space by only about $3.5 \times 10^{-3}$. Hence, in this structure wavelength approximation of the free space length is also usable. The half-wave length was 19.6 mm. The distance from the slot surface 10 of the passage 11 to the emission surface was given by 19.6 mm, 39.2 mm, 58.8 mm, . . . , for n: 1, 2, 3, . . . .

Loss in the resonator will be considered below. $\alpha$ by the dielectric loss was $5.22 \times 10^{-7}$ dB/m when the resistivity of alumina was $10^{-11}$ Ω·cm. The loss by waveguide wall absorption was 0.234 dB/m when the resistivity of alumina was $2.65\times10^{-6}$ Ω·cm. In this case, the dominating loss was the absorption by the wall. Therefore, a loss of 0.053% was produced with respect to energy propagating in the waveguide for each progress of 19.6 mm. Accordingly, to suppress loss caused by round trip in the passage 11 to be about 0.2% of the input energy, n was set to 1 to 3 which was smaller than 4 (loss: 0.21%) and by which the best uniformizing effect was obtained. Since multiple reflection occurs in practice, it is necessary to suppress to this low loss level.

Modification 3

Figure 9A:
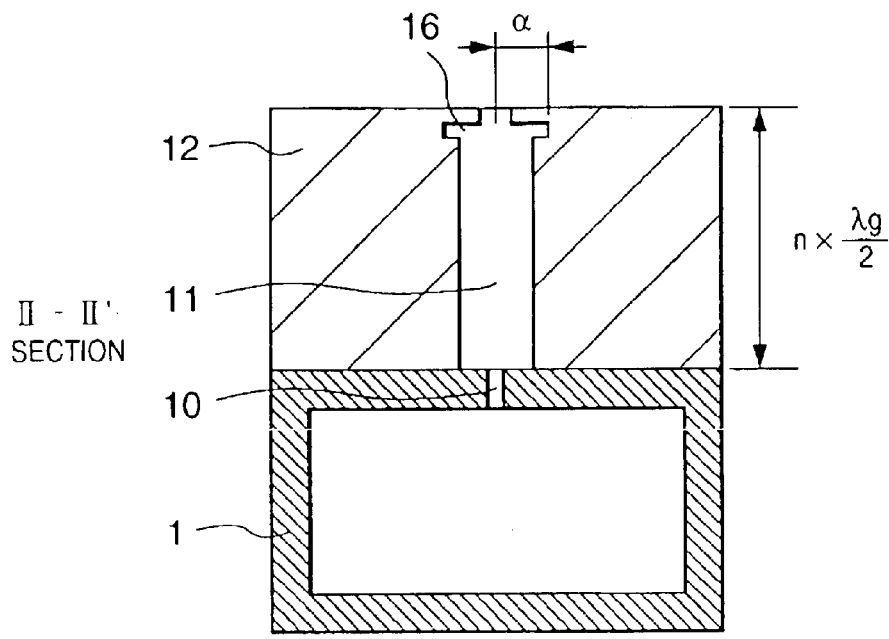
FIGS. 9A and 9B are schematic sectional views showing a practical structure of a waveguide in Modification 3.
Figure 9B:
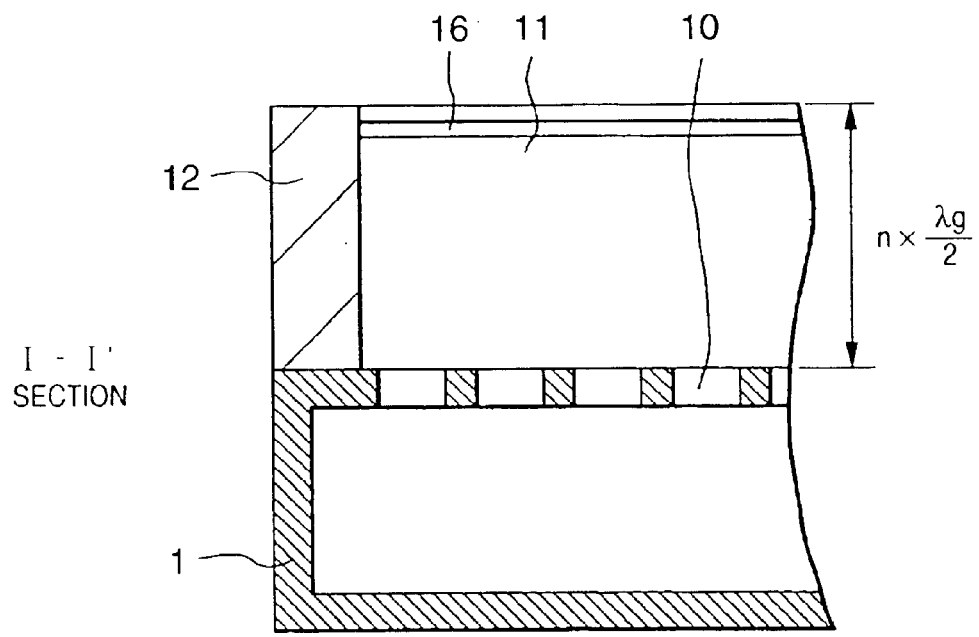

In this Modification 3, as shown in FIGS. 9A and 9B (sectional views similar to FIGS. 3A and 3B), only the end portion 13 of the passage 11 is widened. More specifically, the metal wall 12 is formed so that the passage 11 has a wide portion 16 whose half-width α satisfies α=λg/4 or α=λg/2.

In this structure, the wide portion 16 is formed by the passage 11 over the entire area of the waveguide 1 in the longitudinal direction of the laser tube 2. Since this wide portion 16 is formed to have the width as described above, the resonance energy of a microwave can be efficiently concentrated in this wide portion 16.

As in Modification 2 described above, a dielectric member with which the wide portion 16 shown in FIGS. 9A and 9B is filled can be made from a material having a different dielectric constant from that of a dielectric member in the other portion.

A waveguide was manufactured by adding this structure to the waveguide having the structure explained in Modification 2. α was 19.6 mm and 39.2 mm for λg/4 and λg/2, respectively, and the height of the wide portion 16 was 5 mm. The thickness of the passage 11 was 4 mm. Energy existing in the wide portion 16 was 31.3% and 47.7% of energies existing in the passage 11 and the wide portion 16, respectively. This indicates that energy was concentrated into a portion (i.e., the wide portion 16) close to the window 15. This comparison seems to demonstrate that energy was more concentrated when α was λg/2. However, the energy of a microwave existing within a distance of λg/4 from the center of the wide portion 16 (i.e., in the vicinity of a slot 10) was 31.3% and 23.8% of energies existing in the passage 11 and the wide portion 16, respectively. Therefore, the effect of concentrating energy to the vicinity of the slot 10 was larger when α was λg/4.

Figure 10:
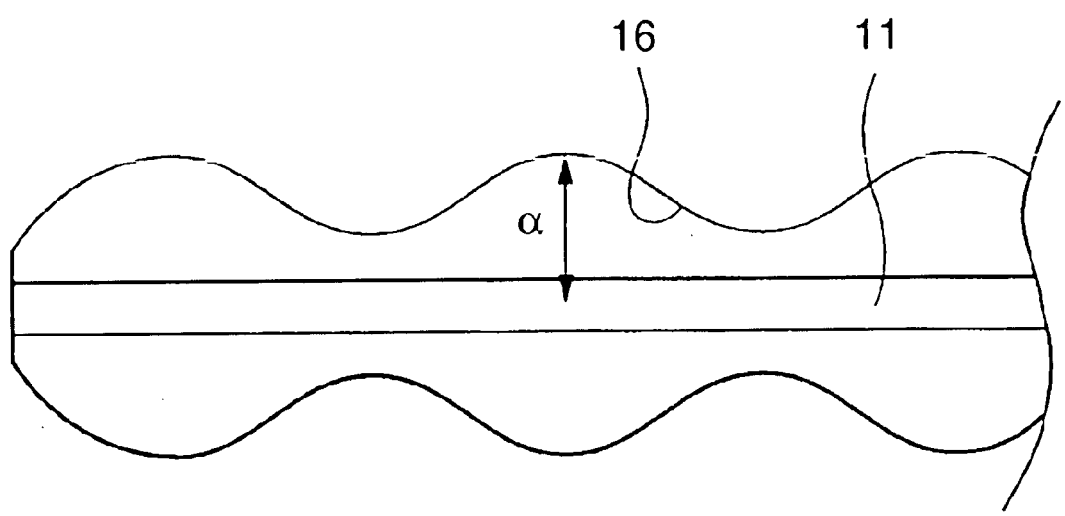
FIG. 10 is a schematic plan view showing a practical structure of another waveguide in Modification 3.

Another form of Modification 3 is shown in FIG. 10. In this structure, the width of the wide portion 16 is changed along the longitudinal direction of the laser tube 2 by reflecting the intensity distribution of a microwave emitted from the slot 10. That is, in addition to forming the passage 11 by forming the metal wall 12, the width (or the half-width α) of the wide portion 16 is changed in accordance with the nonuniformity in a microwave emission portion of the passage 11 to further improve the uniformity, in order to uniformize the wavefront of a microwave.

Consequently, a microwave formed into a more uniform plane wave reaches the excimer laser gas in the laser tube 2. This realizes uniform plasma discharge over the length of the laser tube 2 and contributes to further uniformization of laser emission.

This effect is due to the intrinsic property of microwaves by which the characteristics of a propagation path can be changed by changing a spatial gap shape. Impedance Z of a terminally short-circuited waveguide with length L and characteristic impedance $Z_0$ is $$Z=jZ_0 \tan(2\pi L/\lambda g)$$

This shows that an inductive element (an inductance or coil as a discrete element) and a capacitive element (a capacitance or capacitor as a discrete element) having any arbitrary value can be formed by only changing L. Changing the half-width α in the slot line direction is equivalent, for an electromagnetic wave, to additionally changing the impedance of a slot (in equivalent circuit, coils and capacitors having various values are connected in parallel with a slot). As a consequence, the distribution of an electromagnetic wave emitted from the slot can be controlled.

Modification 4

Figure 11:
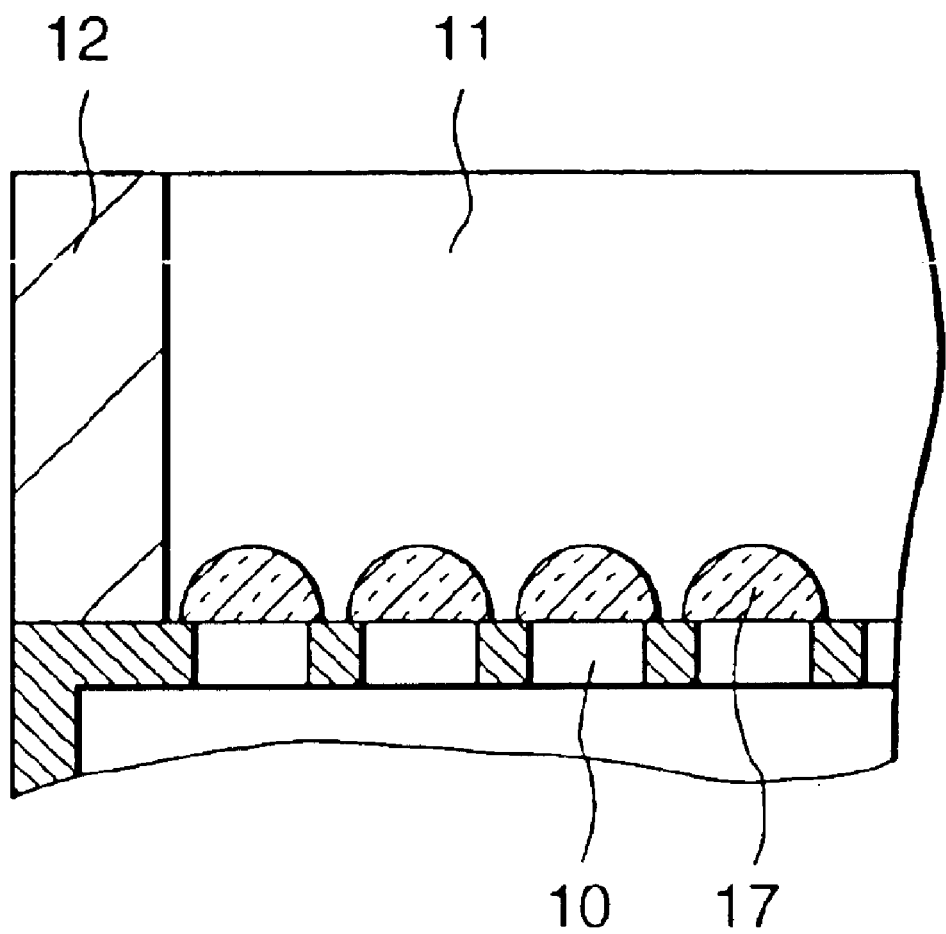
FIG. 11 is a schematic sectional view showing a practical structure of a waveguide in Modification 4.

In this Modification 4, as shown in FIG. 11, on each slot 10 in the passage 11, a dielectric lens 17 having a symmetrical curved surface with respect to the slot 10 is formed. This curved surface shape can be a combination of a spherical surface, an aspherical surface (e.g., an elliptic or hyperbolic shape), and a rectangular shape in accordance with the shape and size of the slot 10 and a microwave emitted. The illustrated curved surface shape is spherical. Lenses applicable as this dielectric lens 17 include all structures having a lens effect with respect to microwaves, such as a zoning lens.

The dielectric lens 17 has a dielectric constant and the curved surface which cancel a phase shift due to the path length difference between microwaves passing through the slots 10 when the wavefront shape of microwaves is to be uniformized. Generally, the propagation velocity of a microwave in a dielectric substance is lower than that in a vacuum (or air). By designing the dielectric lens 17 as described above, therefore, the wavefront can be adjusted in proportion to the path length difference and uniformized.

The dielectric constant and the curved surface shape are preferably optimized by taking account of multiple reflection, i.e., reflection by the plasma generated. Alternatively, to minimize this reflection, the lens thickness of the dielectric lens 17 is desirably set to an integral multiple of λg/2 (when the dielectric constants of both dielectric members before and after the lens are high/low) or an odd-number multiple of λg/4 (in other cases).

Figure 12:
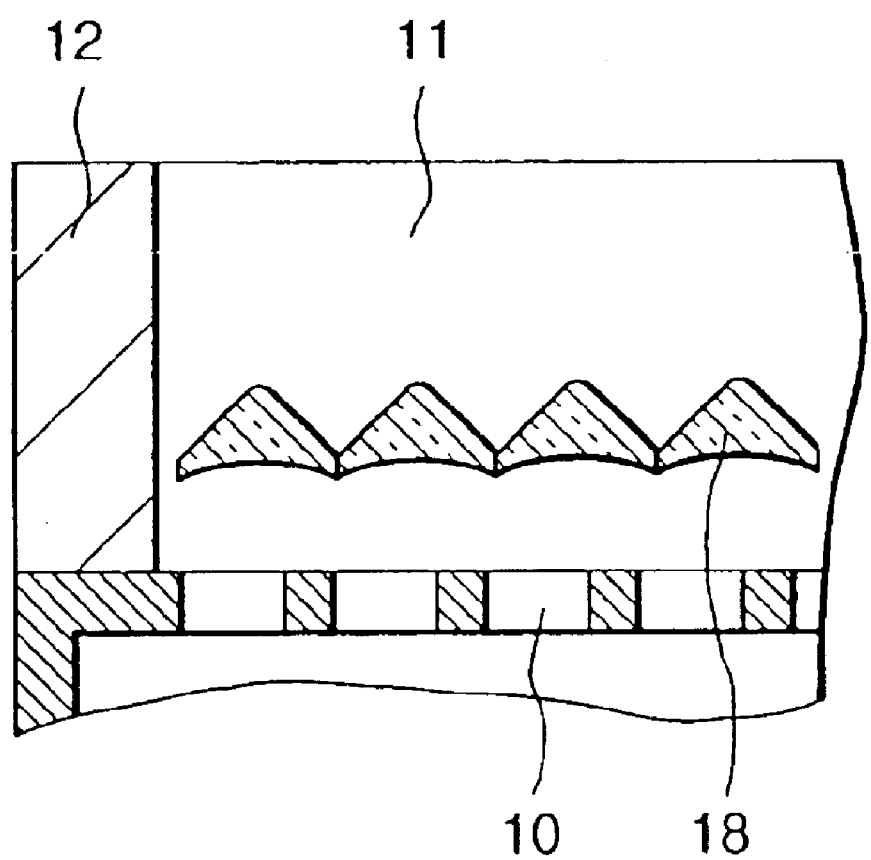
FIG. 12 is a schematic sectional view showing a practical structure of still another waveguide in Modification 4.

Another form of Modification 4 is shown in FIG. 12 (a sectional view analogous to FIG. 11). In this structure, dielectric lenses 18 are not formed on the individual slots 10; the dielectric lenses 18 are arranged at predetermined distances in the passage 11, and their curved surfaces are aspherical surfaces.

In FIGS. 11 and 12, when the passage 11 is filled with a dielectric member, a similar effect can naturally be achieved by forming gaps having the shapes of the dielectric lenses 17 and 18 in the dielectric member in the passage 11, instead of forming the dielectric lenses 17 and 18.

Modification 5

Figure 13A:
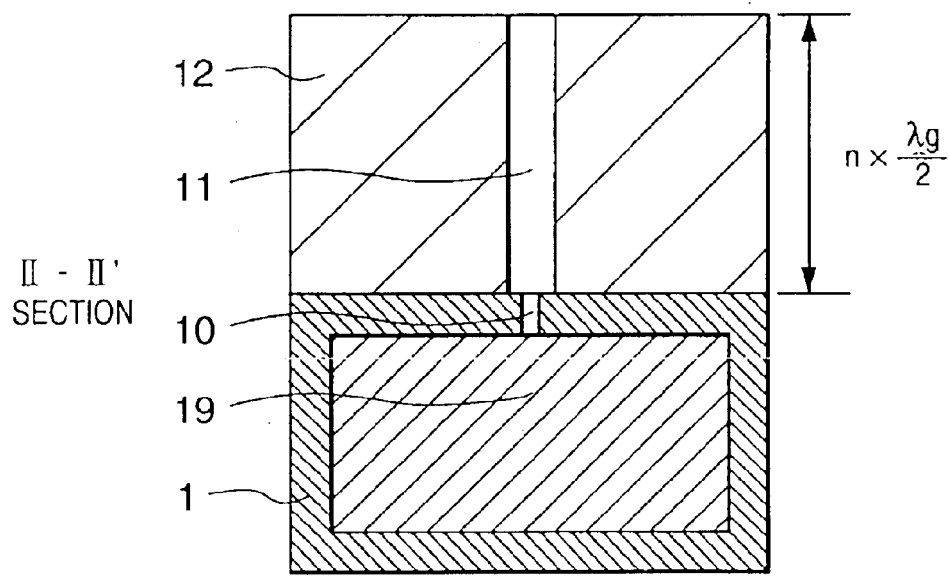
FIGS. 13A and 13B are schematic views showing a practical structure of a waveguide in Modification 5.
Figure 13B:
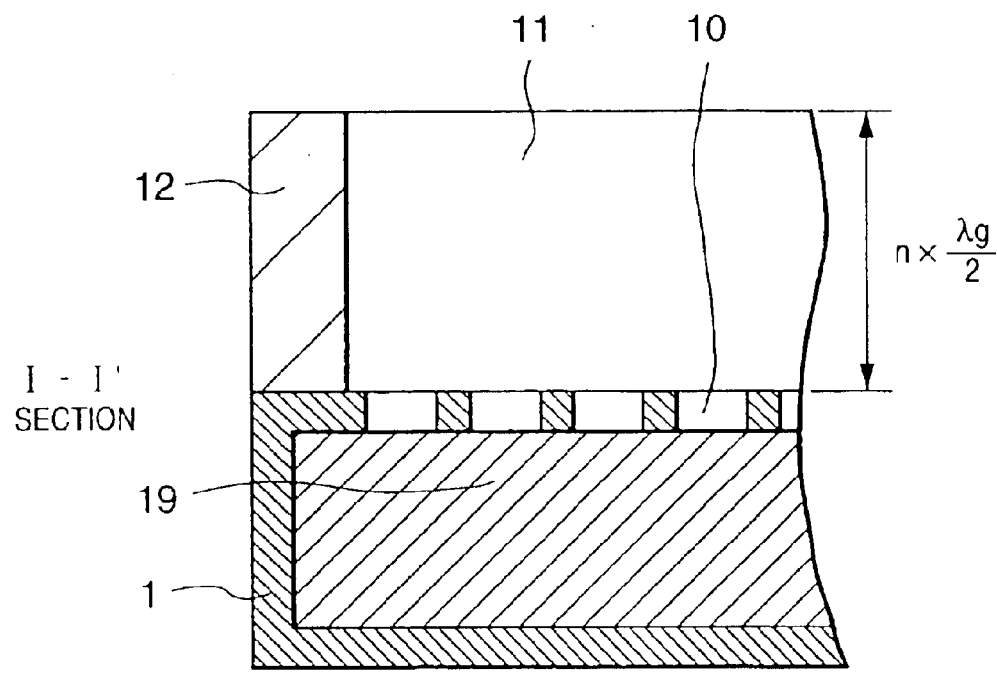

In this Modification 5, as shown in FIGS. 13A and 13B (identical with FIGS. 3A and 3B), the waveguide 1 is filled with a dielectric member 19. Letting λc be the cutoff frequency, the relationship between wavelength λ and waveguide wavelength λg of a microwave emitted is represented by $$\lambda g = \frac{1}{\sqrt{(1/\lambda)^2 - (1/\lambda c)^2}}$$

That is, in E-plane radiation the interval between slots 10 is λg or λg/2. Therefore, when the waveguide 1 is filled with a dielectric member having a high dielectric constant and if this dielectric member 19 is not a ferromagnetic member, the wavelength λ decreases in inverse proportion to the square of the dielectric constant, and the pitch of the waveguide wavelength λg narrows. This allows a more uniform emission of microwaves.

Examples of usable dielectric substances are as shown in Table 1 below. However, dielectric loss generally increases when a dielectric constant increases, so the material must be chosen by taking this into consideration.

TABLE 1

|  | Dielectric constant | Ratio [%] of wavelength λ normalized in the absence of dielectric substance |
| --- | --- | --- |
| Air | 1 | 1.000 |
| Quartz | 3.6 | 0.527 |
| Calcium fluoride | 6.76 | 0.385 |
| Aluminum nitride | 8.8 | 0.337 |
| Alumina | 9.8 | 0.319 |
| Zirconia | 12.5 | 0.283 |

When the waveguide 1 is filled with these dielectric substances, the guide wavelength of in the waveguide 1 decreases at the wavelength ratios described in Table 1. This makes it possible to sufficiently uniformize the wavefront of a microwave.

Modification 6

In this Modification 6, a microwave with a frequency of about 4.9 GHz is used to double the pitch in the waveguide 1 having high frequency, e.g., 2.45 GHz. Consequently, the wavelength λ changes in inverse proportion to this frequency, and this narrows the pitch of the slots 10.

Modification 7

In this Modification 7, the H-plane width of the waveguide 1 is made as large as possible. As a cutoff frequency λc of the waveguide 1 is increased within the range in which microwaves of an excitation frequency band are not cut off, the waveguide wavelength λg approaches the wavelength λ. Accordingly, when only the TE10 mode propagates in the waveguide 1, the pitch of the slots 10 can be narrowed by making the H-plane width as large as possible. The condition by which only the TE10 mode propagates is a<λ (<2a) where $\underline{a}$ is the H-plane width, so this H-plane width is given by (λ/2<) a<λ. The term in ( ) is the condition which eliminates the conditions by which microwaves of all modes cannot propagate. Therefore, by setting the H-plane width $\underline{a}$ to about the wavelength λ, the waveguide wavelength λ g can be set to a minimum value $\frac{2}{3}^{1/2}\lambda$ ($\approx$1.15 λ). Note that when multi-mode excitation is permitted, the waveguide wavelength λg approaches the minimum value λ. However, this is unrealistic because a→∞ in this case.

As described above, the excimer laser oscillators according to this embodiment and its modifications employ a slot array structure and yet realize electromagnetic wave radiation uniform as a whole over the length of a laser tube and allow uniform laser emission with minimum energy loss.

In the first embodiment as described above, although a slot array structure is used, it is possible to realize electromagnetic wave radiation uniform as a whole over the length of a laser tube and emit uniform a laser beam with minimum energy loss.

Second Embodiment

Figure 14:
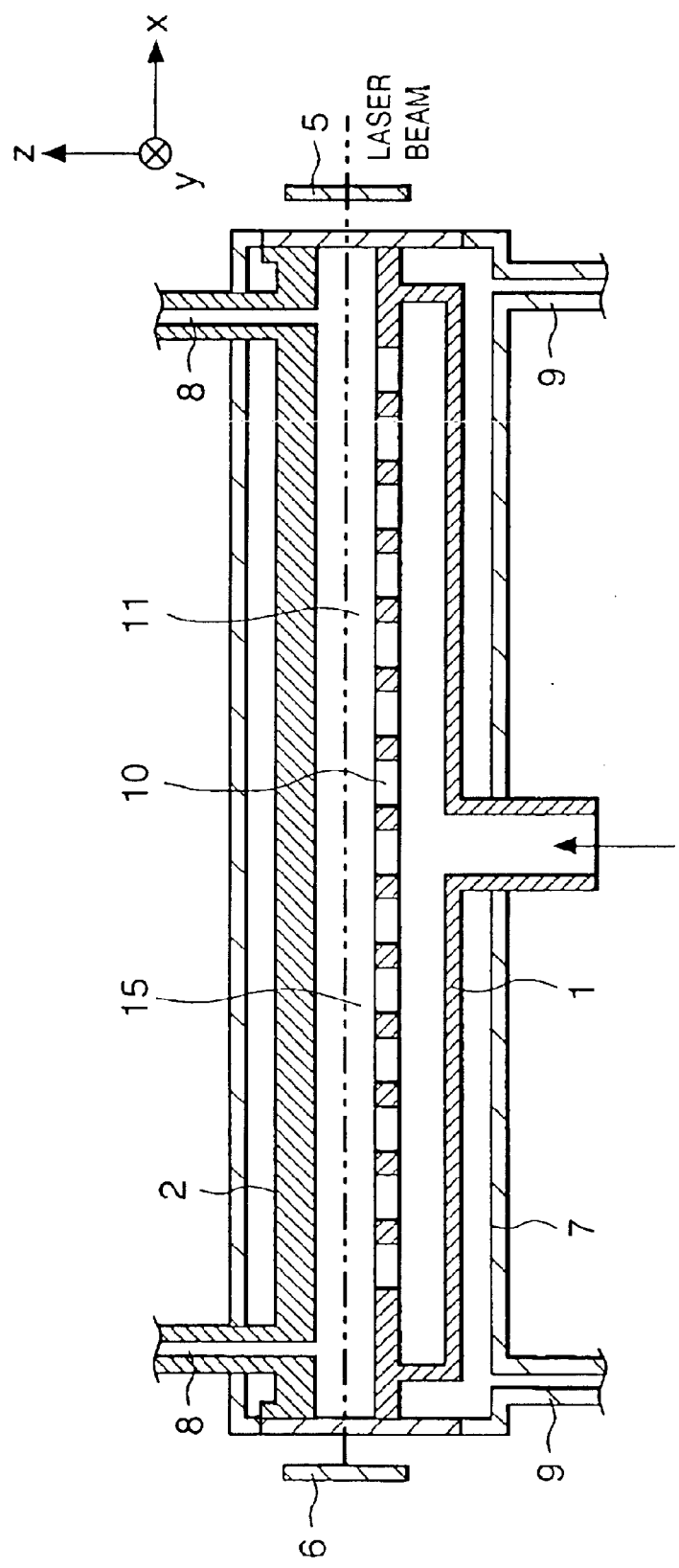
FIG. 14 is a schematic view showing the main components of an excimer laser oscillator according to the second embodiment.

The second embodiment will be described next. FIG. 14 is a view showing a laser oscillating apparatus according to the second embodiment. In FIG. 14, the same reference numerals as in FIG. 1 denote parts having the same functions.

A waveguide 1 is a means for supplying a microwave to a laser gas in a gas supply passage structure 11. A plurality of long and narrow slots 10 are formed in the upper surface in FIG. 14. When a microwave with a frequency of a few hundred MHz to several tens of GHz is introduced from the upper portion of the waveguide 1, this microwave propagates in the waveguide 1 and is emitted from the slots 10 to the outside of the waveguide 10. The emitted microwave is introduced into a laser tube 2. The microwave thus introduced excites an excimer laser gas in the laser tube 2, thereby emitting an excimer laser beam by resonance.

FIGS. 15A and 15B show a practical structure of the waveguide 1 according to the second embodiment. FIG. 15A is a schematic perspective view of the waveguide 1. FIG. 15B is a plan view of the waveguide 1.

As shown in FIG. 15B, the slots 10 are arranged in a line such that their longitudinal direction is consistent with the longitudinal direction of the waveguide 1. These slots 10 are arranged along the longitudinal direction of the waveguide 1, and each slot 10 has a shape extending in the longitudinal direction of the waveguide 1. In this second embodiment, the present invention is applied to the slot 10 which emits a microwave emitted from the E plane as the short end face of the waveguide 1.

Figure 19A:
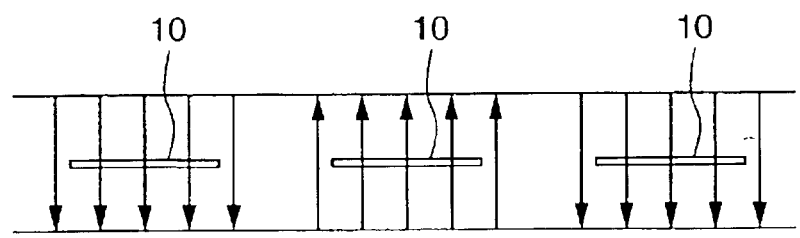
FIGS. 19A to 19C are schematic views showing electric currents generated in a waveguide wall by a microwave on the E and H planes.

FIG. 19A is a schematic view showing electric currents generated on the inner wall surface of the waveguide 1. As shown in FIG. 19A, electric currents are generated in a direction perpendicular to the slots 10 on the inner wall surface of the waveguide 1. FIG. 19C is a schematic view showing the E and H planes of the waveguide 1. The E plane is the short end face (the surface parallel to the direction of an electric field generated by a microwave) of the waveguide 1. The H plane is the long end face (the surface perpendicular to the direction of an electric field generated by a $TE_{10}$ mode microwave) of the waveguide 1.

Figure 16A:
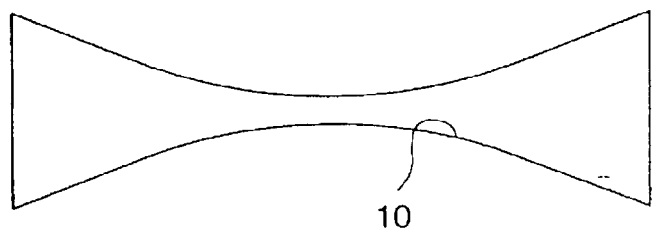
FIGS. 16A to 16D are schematic views showing a slot according to the second embodiment and radiation energy.

FIG. 16A is a schematic plan view showing the shape of one arbitrary slot 10. As shown in FIG. 16A, the slot 10 widens toward its end portions in the longitudinal direction.

Figure 16B:
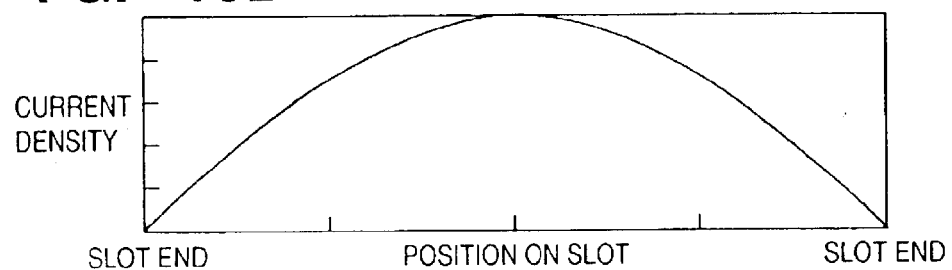
Figure 16C:
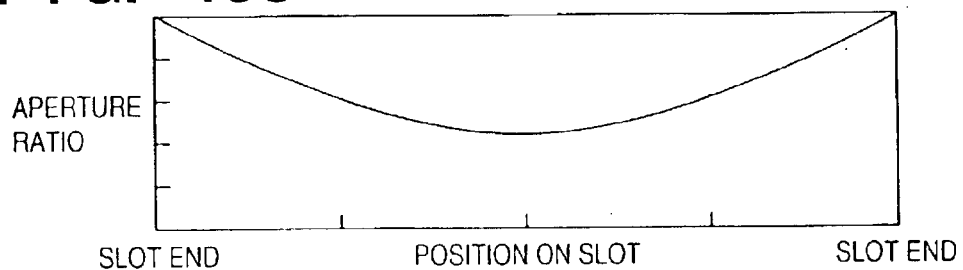

FIG. 16C is a graph showing the relationship between the longitudinal position on the slot 10 shown in FIG. 16A and the aperture ratio of the slot 10. As shown in FIGS. 16A and 16C, the aperture ratio increases toward the end portions of the slot 10.

Figure 16D:
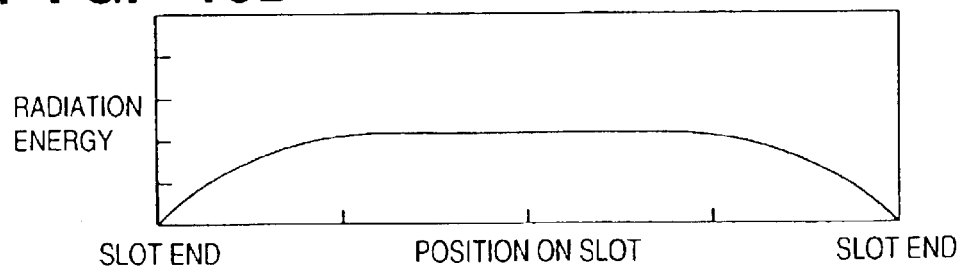

FIG. 16D is a graph showing the intensity of radiation energy when a microwave is radiated through the slot 10 shown in FIG. 16A. As shown in FIG. 16D, radiation energy in particularly the end portions of the slot 10 can be increased by the use of the slot 10 having a large aperture ratio in its end portions. That is, by changing the width of the slot 10 with respect to the current density across the slot 10 as shown in FIG. 16B, the radiation energy of a microwave emitted can be controlled in each longitudinal portion of the slot 10. Consequently, uniform radiation as shown in FIG. 16D is realized.

Note that the distribution of a microwave in actual emission is very difficult to measure or analyze owing to interference with a plasma and the like. Accordingly, in FIG. 16D, the uniformity is evaluated by evaluating the uniformity from a slit with no plasma being excited.

This slot 10 having a centrally symmetrical shape is suitably used for microwaves emitted to the E plane by which the density distribution of an electric current is symmetrical in the short-axis direction of the slot 10.

As described above, the width of the slot 10 is changed along its longitudinal direction; the width in the end portions along the longitudinal direction is made larger than that in the central portion. Accordingly, the radiation of a microwave can be increased particularly in the end portions of the slot 10. This makes uniform microwave emission as shown in FIG. 16D feasible.

Figure 17A:
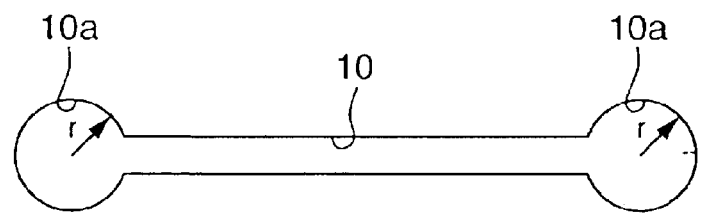
FIGS. 17A to 17C are schematic views showing a slot according to the second embodiment and radiation energy.

FIG. 17A is a schematic plan view showing another example of the shape of the slot 10. The two end portions in the longitudinal direction of this slot 10 shown in FIG. 17A are locally widened circularly into the shape of a dumbbell.

Figure 17B:
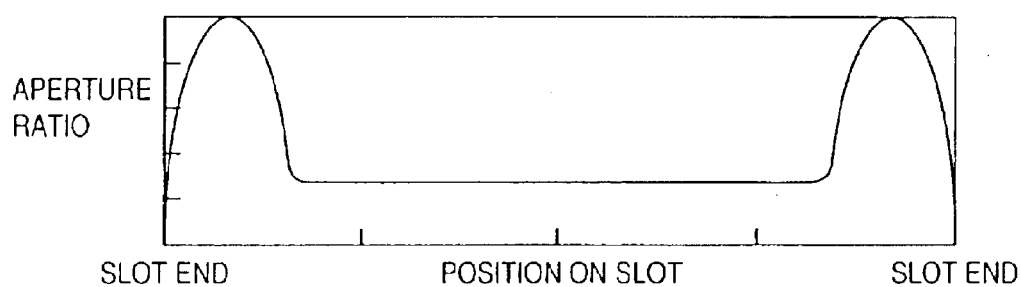

FIG. 17B is a graph showing the relationship between the longitudinal position on the slot 10 shown in FIG. 17A and the aperture ratio of the slot 10. As shown in FIGS. 17A and 17B, the aperture ratio increases in the end portions of the slot 10.

Figure 17C:
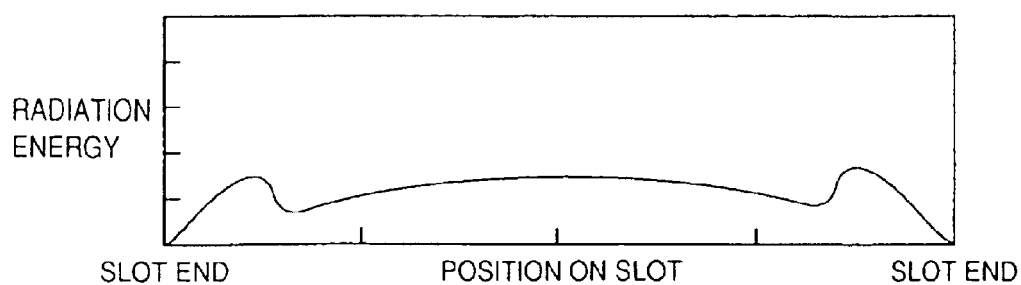

FIG. 17C is a graph showing the intensity of radiation energy when a microwave is emitted through the slot 10 shown in FIG. 17A. As shown in FIG. 17C, by the use of the slot 10 having a large aperture ratio in the end portions, it is possible to enhance the emission of a microwave in circular portions 10a and increase the radiation energy particularly in the end portions of the slot 10. That is, by changing the width of the slot 10 with respect to the current density across the slot 10 as shown in FIG. 19A, the intensity of a microwave emitted can be controlled in each longitudinal portion of the slot 10. This realizes uniform radiation as shown in FIG. 17C.

Also, the length of the slot 10 can be equivalently increased by increasing the radius r by adding a circle with the radius r to each end of the slot 10. Consequently, Q can be decreased without substantially setting the slot length to λg/2. Furthermore, since the end portions of the slot 10 are circular, mechanical processing for forming the slot 10 can be easily and precisely performed.

Figure 18A:
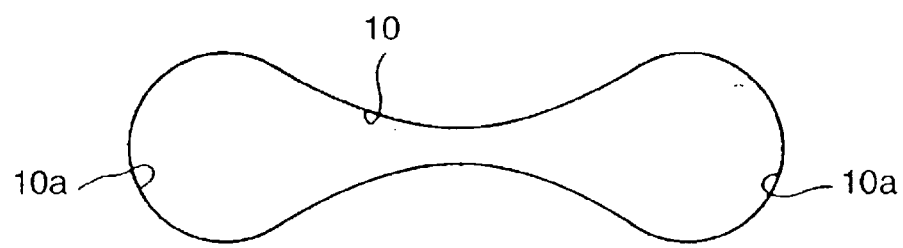
FIGS. 18A to 18C are schematic views showing a slot according to the second embodiment and radiation energy.

FIG. 18A shows a slot 10 having a shape connecting the two circles of the slot 10 shown in FIG. 17A with smoother curves.

Figure 18B:
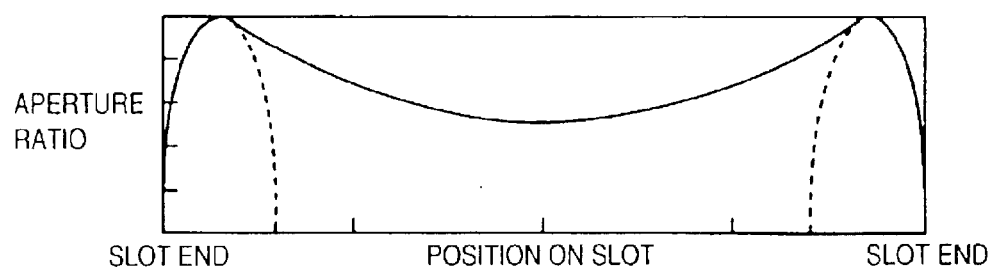

FIG. 18B is a graph showing the relationship between the longitudinal position on the slot 10 shown in FIG. 18A and the aperture ratio of the slot 10. As shown in FIGS. 18A and 18B, the aperture ratio increases toward the end portions of the slot 10.

Figure 18C:
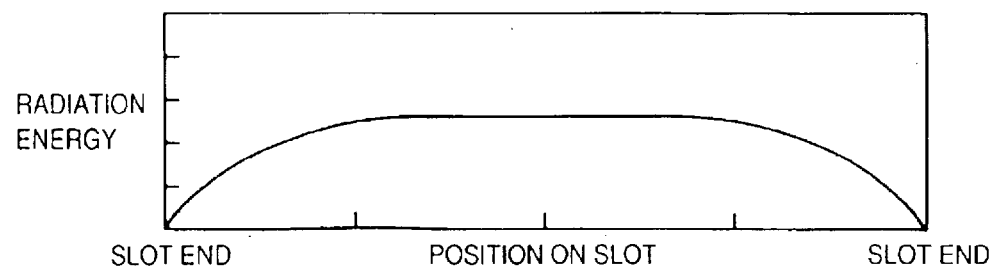

FIG. 18C is a graph showing the intensity of radiation energy when a microwave is radiated through the slot 10 shown in FIG. 18A. As shown in FIG. 18C, by the use of the slot having a large aperture ratio in the end portions, it is possible to enhance the emission of a microwave in circular portions 10a and increase the radiation energy particularly in the end portions of the slot 10. This realizes uniform radiation as shown in FIG. 18C.

The slot 10 shown in FIG. 18A has the circular end portions similar to those of the slot 10 shown in FIG. 17A. Hence, it is possible to equivalently increase the length of the slot 10 and easily and precisely perform mechanical processing.

When the slots 10 having the shapes shown in FIGS. 16A, 17A, and 18A are used, the uniformity of a microwave emitted improves in the order of the slot 10 shown in FIG. 17A, the slot 10 shown in FIG. 16A, and the slot 10 shown in FIG. 18A. The maximum intensity of a microwave also increases in the order of the slot 10 shown in FIG. 17A, the slot 10 shown in FIG. 16A, and the slot 10 shown in FIG. 18A. In practice, however, this tendency changes in accordance with the size of the slot 10, the size relationship with the waveguide as an exciting source, and the shape of a curve. Note that the aperture ratio distribution described above is set by making great account of the uniformity in as a wide range as possible. However, it is of course also possible to cause strong excitation in the end portions and weaken the intensity in the central portion by decreasing the aperture ratio in the central portion.

Figure 23:
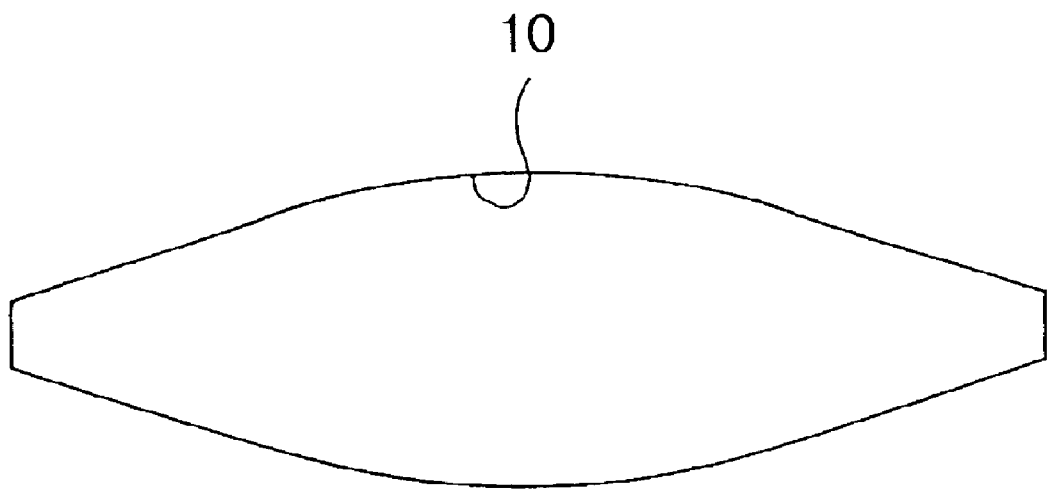
FIG. 23 is a schematic view showing still another shape of the slot according to the third embodiment.

FIG. 23 shows a slot 10 whose width in the central portion in the longitudinal direction is larger than that in the end portions. In the waveguide 1, a nonuniform electric field also distributes in a direction perpendicular to the longitudinal direction of the waveguide 1. When this electric field is taken into consideration, the slot 10 having the shape shown in FIG. 23 can uniformize the intensity of a microwave emitted through the slot 10.

In the second embodiment as described above, the width of the slot 10 is changed along its longitudinal direction such that the aperture in the end portions of the slot 10 increases. This makes it possible to increase the intensity of microwaves radiated from the end portions of the slot 10. Accordingly, uniform radiation of microwaves is possible in the entire region on the slot 10.

Third Embodiment

The third embodiment of the present invention will be described below. In this third embodiment, the present invention is applied to a slot which emits microwaves from the long end face (H plane) of a waveguide 1. Note that the overall structure of an excimer laser oscillator according to the third embodiment is identical with the second embodiment, so a detailed description thereof will be omitted. Note also that in the drawings for explaining the third embodiment, the same reference numerals as in the second embodiment denote substantially the same parts, and a detailed description thereof will be omitted.

Figure 19B:
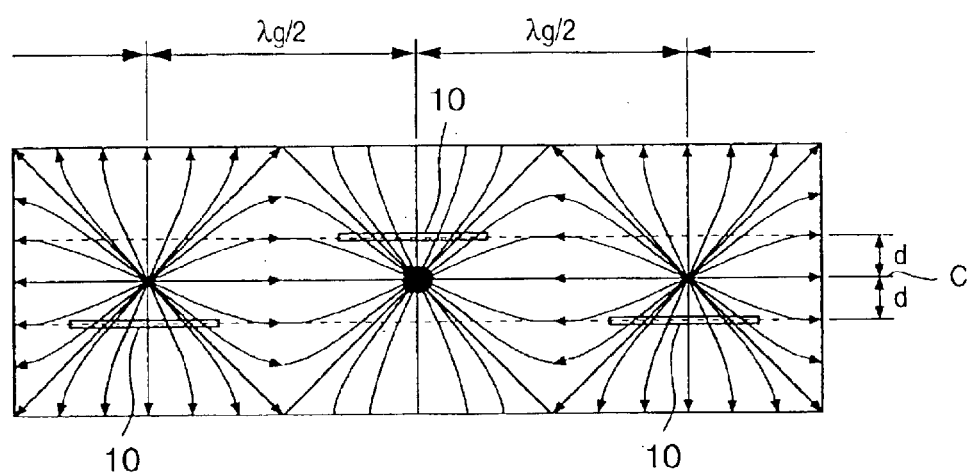
Figure 19C:
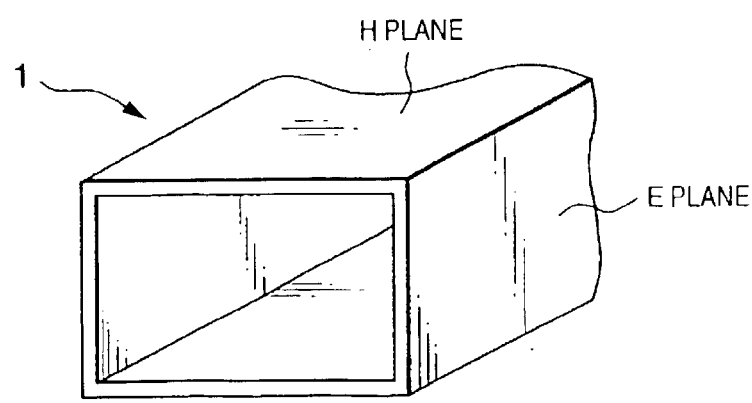

FIG. 19B is a schematic view showing the directions of electric currents generated in the waveguide wall by a microwave on the H plane. As shown in FIG. 19B, each electric current flowing along the inner wall surface of the waveguide on the H plane flows from a node in the center of the width in a direction perpendicular to the longitudinal direction of the waveguide 1 toward a node separated by λg/2.

Hence, when slots 10 are alternately formed at a pitch of λg/2 in positions apart by d from a central line (an alternate long and short dashed line C) of the width in the direction perpendicular to the longitudinal direction of the waveguide 1, radiations from all the slots 10 are in phase with each other.

Figure 20A:
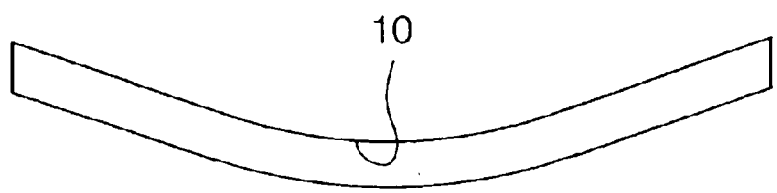
FIGS. 20A and 20B are views showing a slot according to the third embodiment and the arrangement of slots in a waveguide.
Figure 20B:
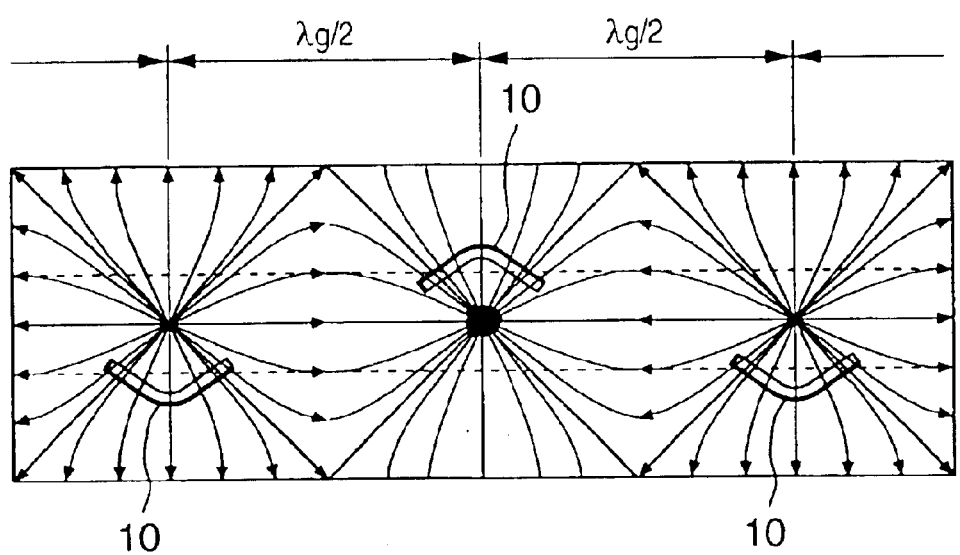

FIGS. 20A and 20B show the shape of a slot 10 suitably used for microwaves emitted from the H plane. As explained in FIG. 19B, electric currents generated by a microwave are radially emitted from a node. So, a direction along which the slot 10 extends is made perpendicular to the current directions. That is, when the slots 10 having the shape shown in FIG. 20A are formed in positions shown in FIG. 20B, the extending directions of these slots 10 can be made perpendicular to the current directions. This allows efficient emission of a microwave from these slots 10.

Figure 21A:
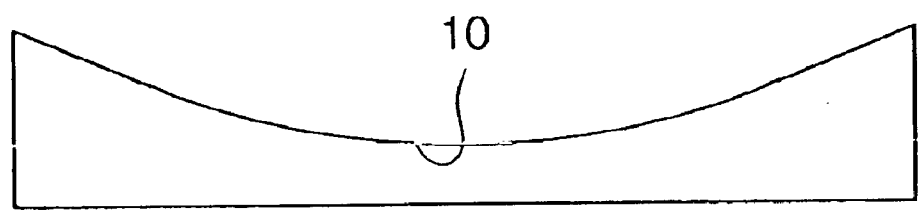
FIGS. 21A and 21B are schematic views showing other shapes of the slot according to the third embodiment.
Figure 21B:
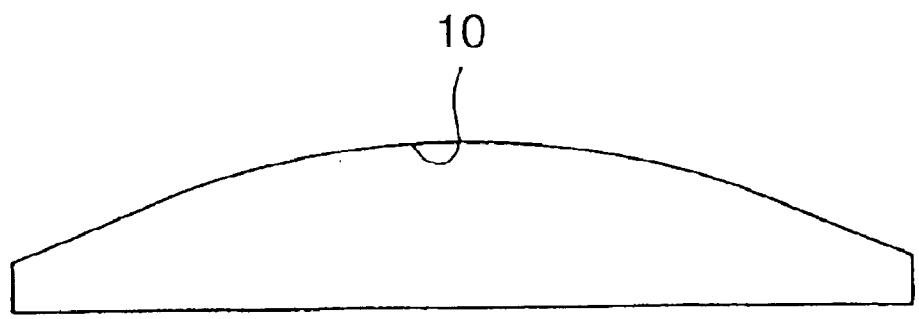

FIGS. 21A and 21B are plan views showing other examples of the shape of the slot 10 used for the H plane. A slot 10 shown in FIG. 21A has an increased opening width in its end portions. Therefore, by forming these slots 10 in the positions shown in FIG. 20B, the radiation of a microwave in the end portions of the slot 10 can be increased. Consequently, it is possible to uniformize the intensity of a microwave radiated above the slot 10.

A slot 10 shown in FIG. 21B has a larger opening width in the central portion than in the end portions same as a slot 10 shown in FIG. 23.

Figure 22A:
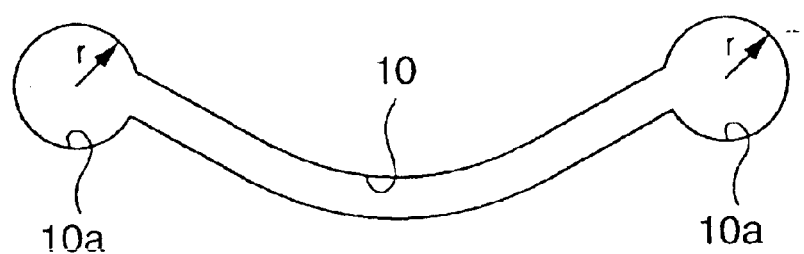
FIGS. 22A and 22B are schematic views showing other shapes of the slot according to the third embodiment.
Figure 22B:
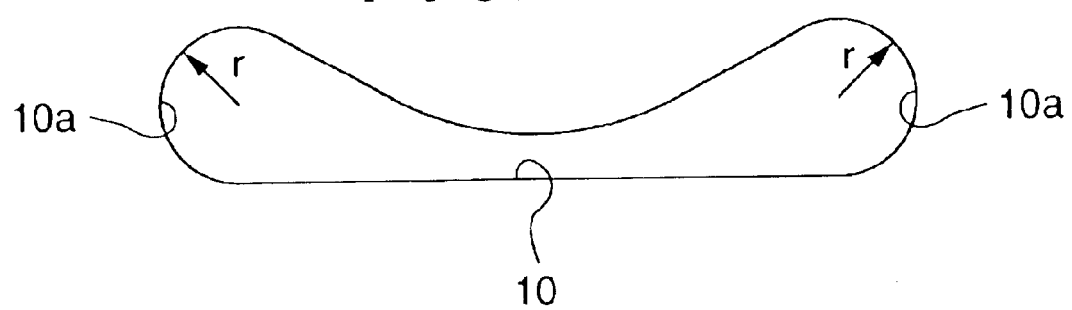

Slots 10 shown in FIGS. 22A and 22B have circles with a radius r in their end portions, like the slots 10 explained with reference to FIGS. 17A and 18A in the second embodiment. As in the second embodiment, it is possible with these shapes to enhance the emission of a microwave in circular portions 10a and uniformize a microwave radiated over the slot 10.

Also, the length of the slot 10 can be equivalently increased by increasing the radius r by adding a circle with the radius r to each end of the slot 10. Consequently, Q can be decreased without substantially setting the slot length to $\lambda g/2$. Furthermore, since the end portions of the slot 10 are circular, mechanical processing for forming the slot 10 can be easily and precisely performed.

In the third embodiment of the present invention as described above, with respect to a microwave emitted from the H plane, the slots 10 are formed in positions spaced apart by a predetermined distance d from the center (the central line C in FIG. 19B) of the waveguide 1. Consequently, a microwave can be radiated in phase from these slots 10.

Also, the shape of the slot 10 is curved, and this curved slot 10 is extended in a direction perpendicular to the directions of currents generated on the wall surface of the waveguide 1. This allows more efficient radiation of a microwave.

Furthermore, the width of the slot 10 is increased in its end portions. This makes it possible to enhance the radiation of a microwave in the end portions of the slot 10 and uniformize the intensity of a microwave radiated in the entire area over the slot 10.

Fourth Embodiment

The fourth embodiment of the present invention will be described below. Note that the overall structure of an excimer laser oscillator according to this fourth embodiment is identical with the second embodiment, so a detailed description thereof will be omitted. Note also that in the drawings for explaining the fourth embodiment the same reference numerals as in the second embodiment denote substantially the same parts, and a detailed description thereof will be omitted.

According to the characteristic feature of the fourth embodiment, in order to uniformize the radiation of a microwave, the opening shape of a slot 10 is a normal rectangular shape, and the internal shape of the wall of a waveguide 1 in which this slot 10 is formed is made different from the opening shape of the slot 10, thereby forming an air-gap structure 215. As will be described later with reference to FIG. 24B, this air-gap structure 215 is an air gap formed in the wall surface of the waveguide 1 in which the slot 10 is formed.

Figure 25A:
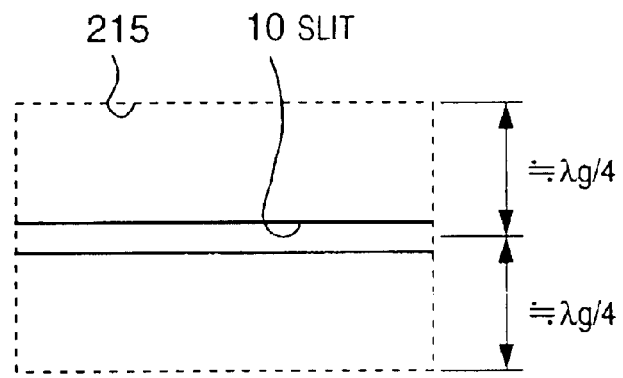
FIGS. 25A and 25B are schematic views showing another air-gap structure according to the fourth embodiment.
Figure 25B:
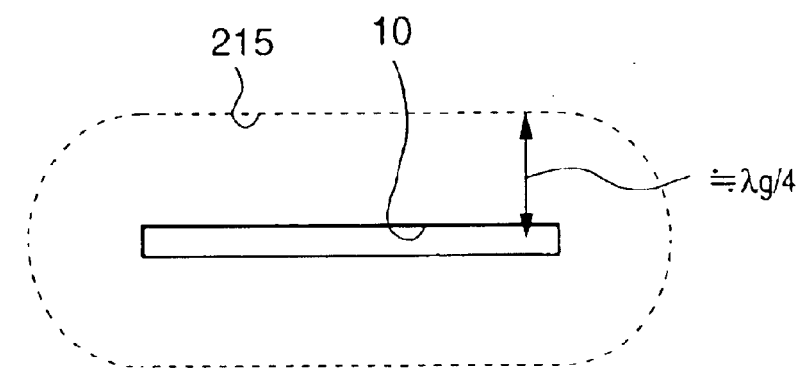

FIGS. 25A and 25B show an example of the air-gap structure 215. In this example, the entire region of the air-gap structure 215 is spaced apart by $\lambda g/4$ from the slot 10. Consequently, in this air-gap structure, the length of a space in a direction perpendicular to the slot 10 is $\lambda g/2$. Accordingly, it is possible to resonate a microwave in the air-gap structure 215 and increase the radiation efficiency.

Figure 26A:
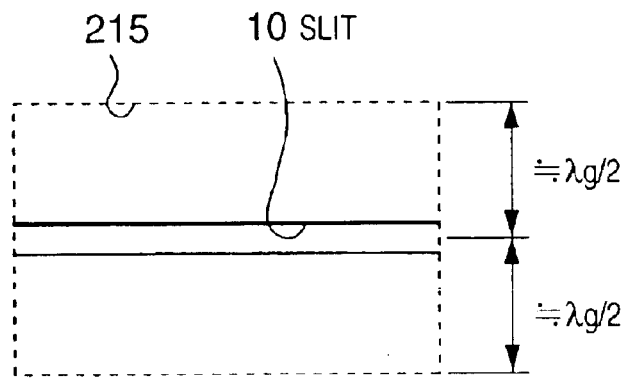
FIGS. 26A and 26B are schematic views showing still another air-gap structure according to the fourth embodiment.
Figure 26B:
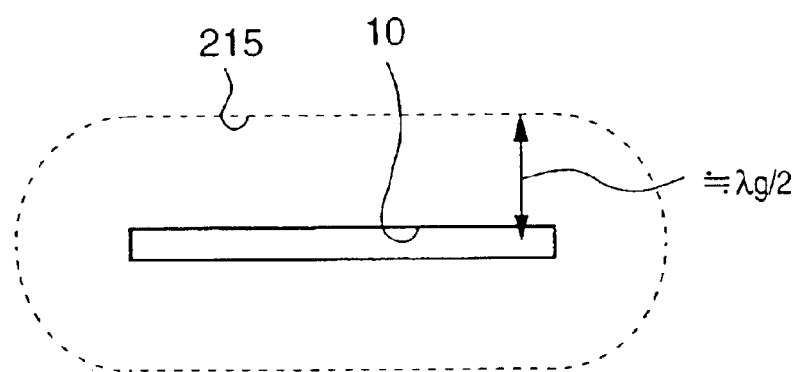

Referring to FIGS. 26A and 26B, the entire region of the air-gap structure 215 is spaced apart by $\lambda g/2$ from the slot 10. In this air-gap structure 215, the length of a space in a direction perpendicular to the slot 10 is also $\lambda g$. So, it is possible to resonate microwaves in the air-gap structure 215 and improve the radiation efficiency.

Figure 24A:
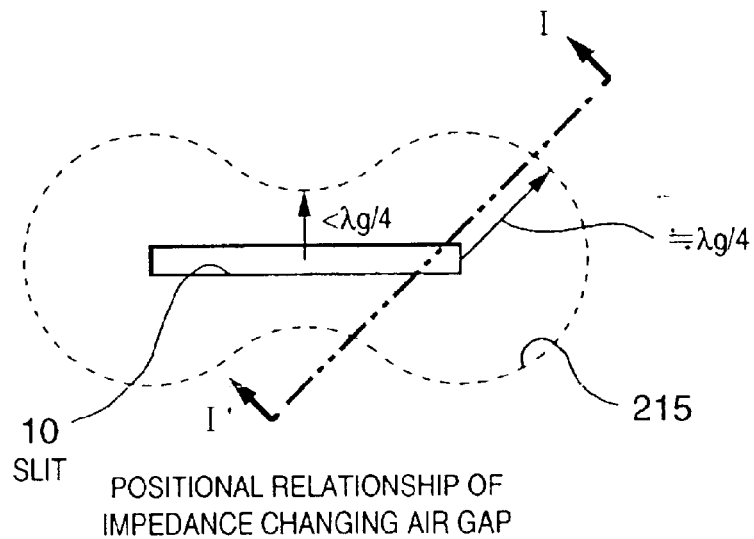
FIGS. 24A and 24B are schematic views showing an air-gap structure according to the fourth embodiment.
Figure 24B:
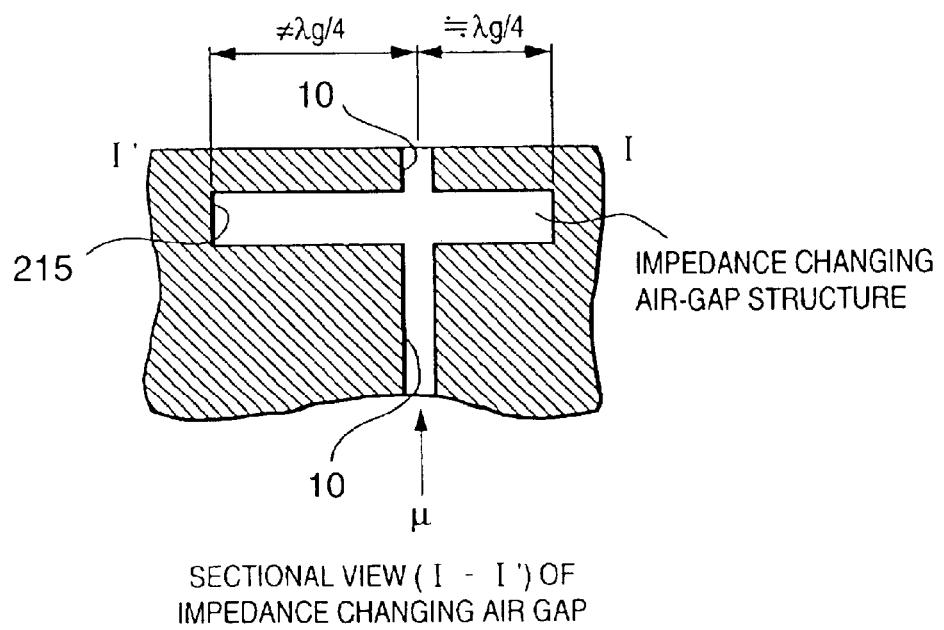

FIG. 24A is a plan view showing the slot 10 and the air-gap structure 215 according to a modification of the fourth embodiment. FIG. 24B is a schematic sectional view showing a section taken along an alternate long and short dashed line I—I' shown in FIG. 24A.

As shown in FIG. 24A, the slot 10 according to the fourth embodiment has a rectangular shape, and its longitudinal direction is the same as the longitudinal direction of the waveguide 1.

The impedance changing air-gap structure 215 is so formed as to surround this rectangular slot 10. As shown in FIG. 24B, this air-gap structure 215 is formed in the inner wall of the waveguide 1 in which the slot 10 is formed. The air-gap structure 215 extends to a region indicated by the dotted line shown in FIG. 24A.

As shown in FIG. 24A, each end of the air-gap structure 215 is formed into a circle having a radius of $\lambda g/4$ from the end portion of the slot 10. In the central portion in the longitudinal direction of the slot 10, the distance from the end portion of the slot 10 is $\lambda g/4$ or less.

As shown in FIG. 24A, by changing the distance between air-gap end and the slot 10 in the long-axis direction of the slot 10, the emission characteristic of a microwave in the long-axis direction of the slot 10 can be changed.

This effect is due to the state in which resonance conditions do not hold in each portion of the slot 10 and to the intrinsic property of microwaves that the characteristics of a propagation path can be changed by changing the shape of a spatial gap. Impedance Z of a terminally short-circuited waveguide with length L and characteristic impedance $Z_0$ is $$z = jZ_0 \tan(2\pi \cdot L / \lambda g)$$

This indicates that a inductive element (a coil as a discrete element) and a capacitive element (a capacitor as a discrete element) having any arbitrary value can be formed by only changing L. Changing the half-width a in the slot line direction is equivalent, for an electromagnetic wave, to additionally changing the impedance of a slot (in an equivalent circuit, coils and capacitors having various values are connected in parallel with a slot). As a consequence, the distribution of an electromagnetic wave emitted from the slot can be controlled.

By using this property, the radiation of a microwave in the longitudinal center of the slot 10 can be suppressed. So, the intensity of a microwave radiated over the slot 10 can be uniformized.

Figure 27A:
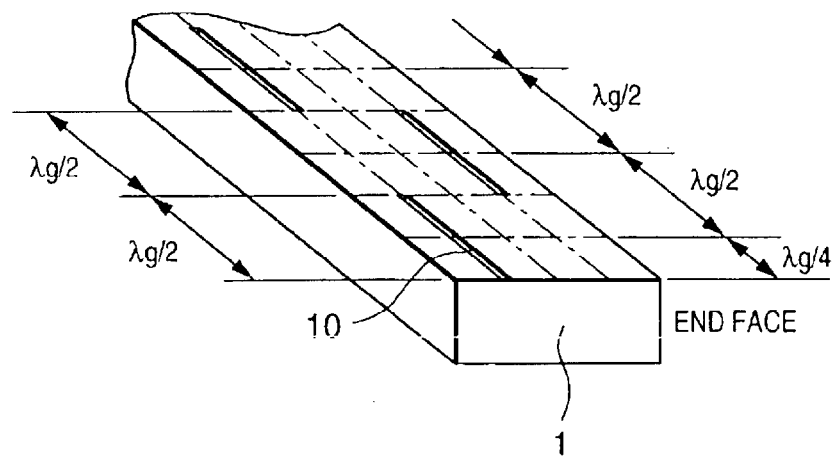
FIGS. 27A and 27B are perspective views showing waveguides and slots according to the fourth embodiment.
Figure 27B:
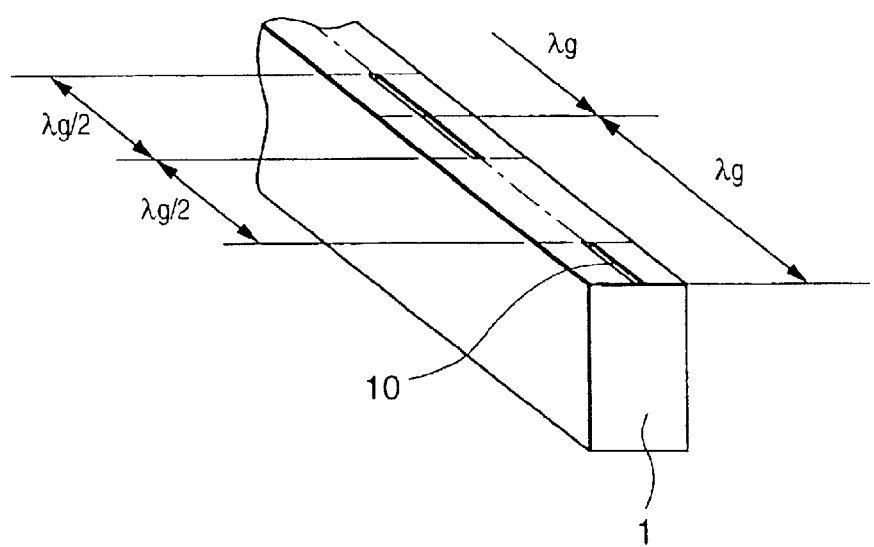

FIGS. 27A and 27B show structures in which in order to increase the radiation efficiency of a microwave, the longitudinal length of the slot 10 is set to $\lambda g/2$. FIG. 27A shows a structure applied to the H plane. FIG. 27B shows a structure applied to the E plane. Since the length of the slot 10 is $\lambda g/2$, it is possible to resonate a microwave in the longitudinal direction of the slot 10 and improve the radiation efficiency of the microwave.

Figure 28A:
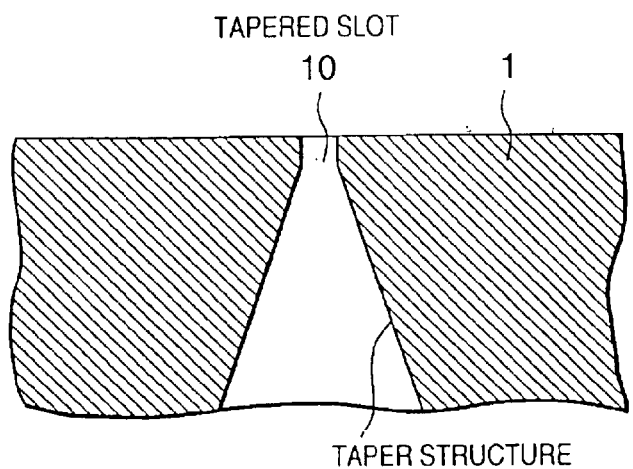
FIGS. 28A to 28C are schematic sectional views showing the shapes of slots according to the fourth embodiment.

FIG. 28A shows a slot 10 having a tapered sectional shape which widens toward the inside of the waveguide 1. Since the taper which widens toward the lower portion of the slot 10 is formed, the spatial impedance moderately changes, so reflection hardly occurs. Consequently, a larger amount of a microwave can be introduced into the slot 10, and this increases the radiation efficiency of a microwave from the slot 10.

Figure 28B:
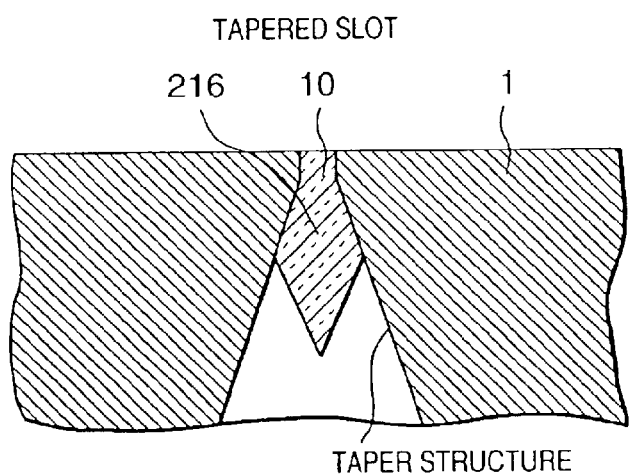

FIG. 28B shows an example in which a dielectric lens 216 is inserted into the tapered portion of the slot 10 shown in FIG. 28A. This dielectric lens 216 can concentrate a microwave into the slot 10 and thereby increase the radiation efficiency of a microwave from the slot 10.

Figure 28C:
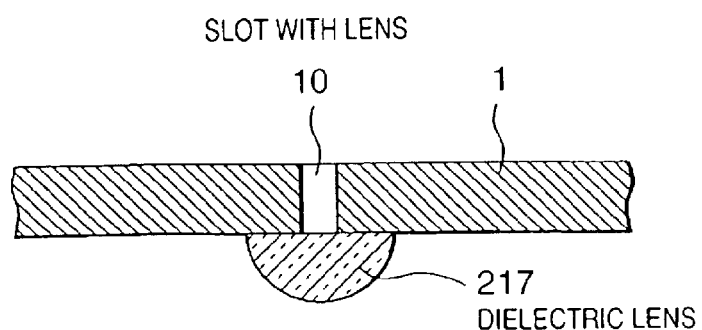

Also, as shown in FIG. 28C, a dielectric lens 217 can be placed immediately below the normal slot 10. This also makes it possible to concentrate a microwave into the slot 10 and increase the radiation efficiency of a microwave from the slot 10.

In the fourth embodiment as described above, the air-gap structure 215 having a shape different from the opening shape of the slot 10 is formed in the wall surface of the waveguide 1 in which the slot 10 is formed. This allows the impedance in the slot 10 to vary. Accordingly, the formation of this air-gap structure 215 realizes uniform microwave emission over the slot 10. Also, by setting the air-gap region 215 to a predetermined size, a microwave can be resonated in this air-gap region 215, so the radiation characteristic of a microwave can be improved.

Furthermore, when the sectional shape of the slot 10 is tapered such that the slot 10 widens toward the inside of the waveguide 1, a larger amount of a microwave can be introduced into the slot 10, so the radiation efficiency can be increased. The radiation efficiency of a microwave can also be increased by placing a dielectric lens in, or below, the slot 10.

As described above, the second to fourth embodiments can realize uniform plasma excitation over the length of each individual slot. Therefore, it is possible to provide a laser oscillating apparatus capable of uniform laser emission with minimum energy loss, a high-performance exposure apparatus including this laser oscillating apparatus, and a high-quality device fabrication method using this exposure apparatus.

Fifth Embodiment

The fifth embodiment will be described next. The arrangement of a laser oscillating apparatus according to this fifth embodiment is identical with the second embodiment (FIG. 14), so its illustration and detailed description will be omitted.

Figure 33A:
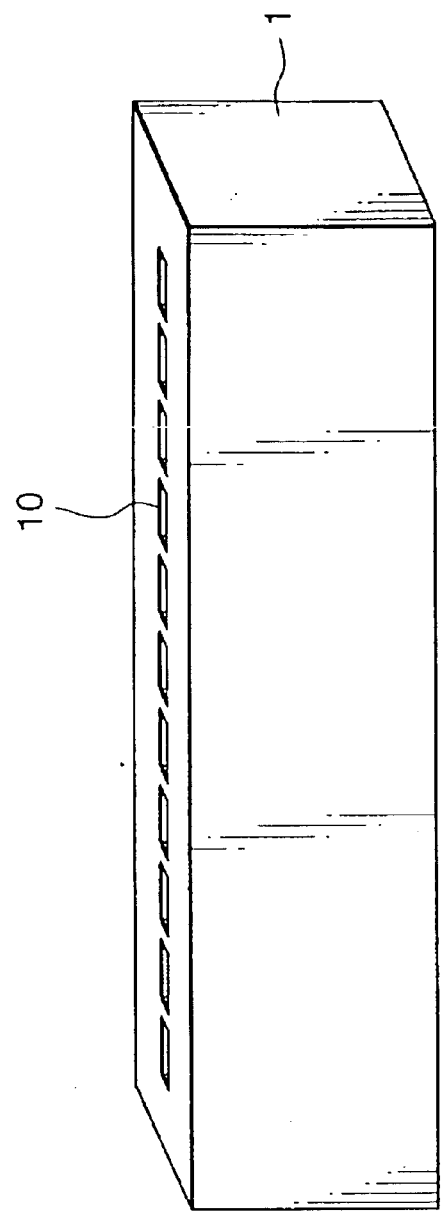
FIGS. 33A and 33B are schematic views showing a practical structure of a waveguide of an excimer laser oscillator according to the fifth and sixth embodiments.
Figure 33B:
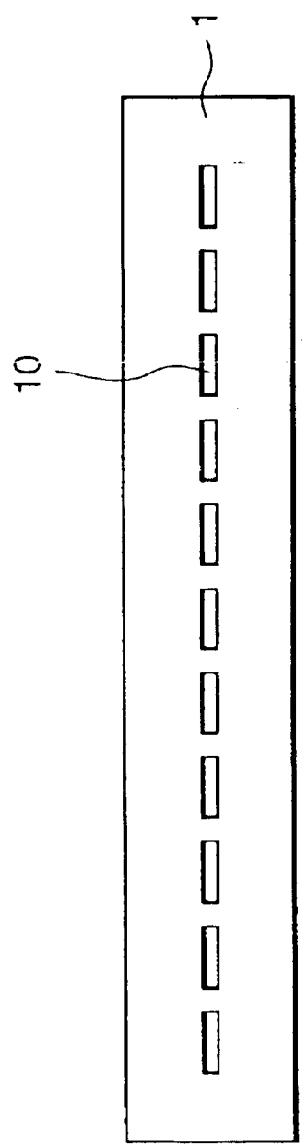

FIGS. 33A and 33B show a practical structure of a waveguide 1 according to the fifth embodiment. FIG. 33A is a schematic perspective view showing the waveguide 1. FIG. 33B is a plan view of the waveguide 1.

As shown in FIG. 33B, slots 10 are arranged in a line such that their longitudinal direction is consistent with the longitudinal direction of the waveguide 1. These slots 10 are arranged along the longitudinal direction of the waveguide 1, and each slot 10 extends in the longitudinal direction of the waveguide 1.

In this fifth embodiment, on the E plane of the waveguide 1, the slots 10 are formed in a line at a pitch of $\lambda g$ ($\lambda g$: waveguide wavelength) in the longitudinal direction. Each slot 10 is formed in a position where the emission characteristic of a microwave depending upon the slot 10 is contrary to the intensity distribution of a microwave propagating in the waveguide 1.

Figure 29:
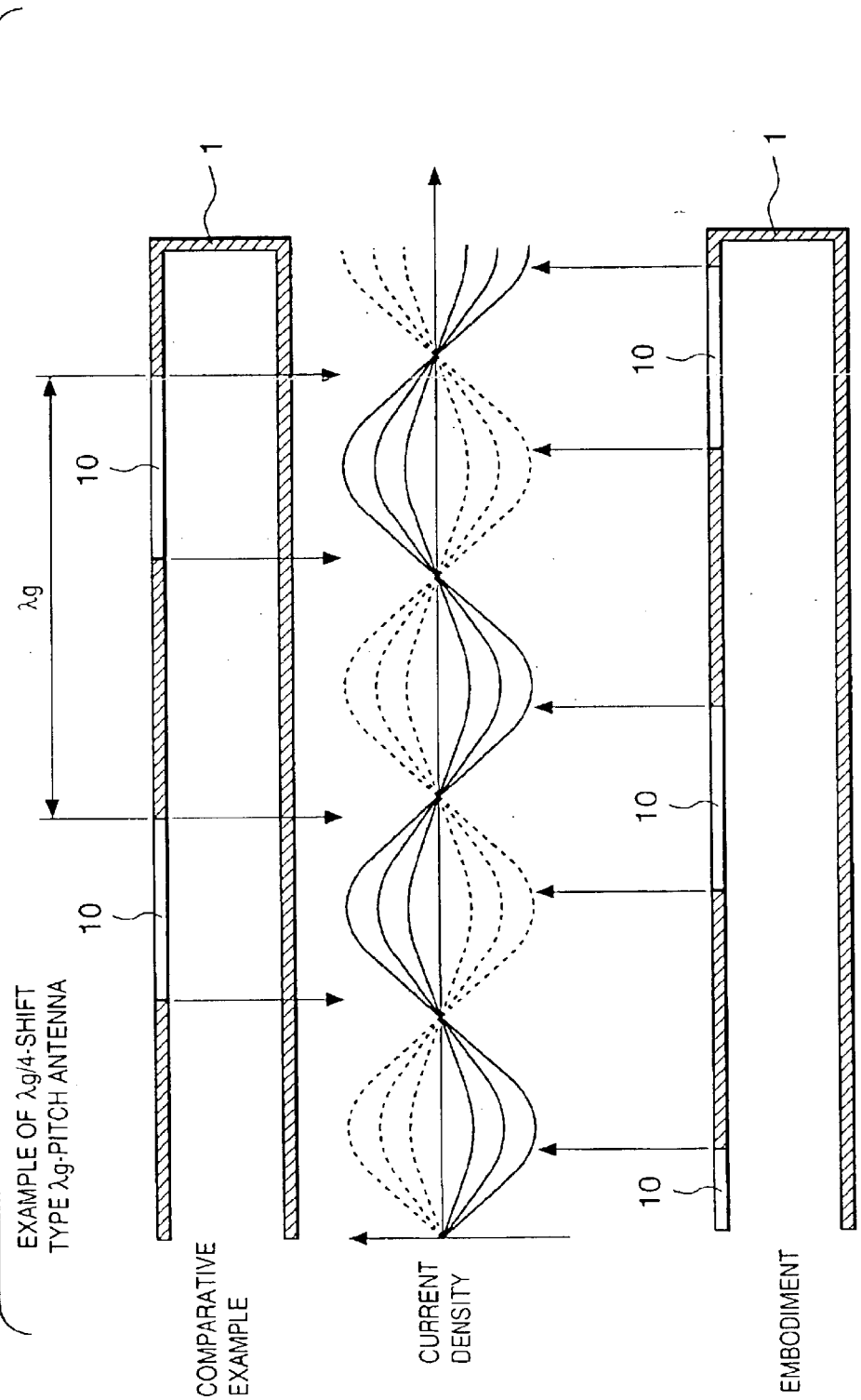
FIG. 29 is a schematic view showing the relationship between the slot formation portions in a waveguide and the density of a current flowing through the wall surface of the waveguide according to the fifth embodiment.
Figure 32A:
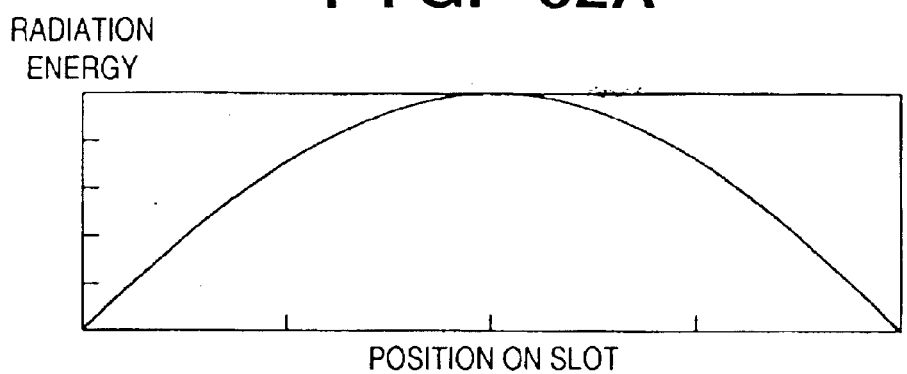
FIGS. 32A to 32C are graphs showing the relationships between the slot positions of slots formed in a waveguide and the radiation energy or the standing wave intensity according to the fifth embodiment.

FIG. 29 shows practical positions of each slot 10. As shown in FIG. 29, in a comparative example, each slot 10 is formed in a position where a maximum value of the intensity distribution of a microwave (in this example shown in FIG. 29, the density distribution of an electric current flowing on the wall surface of the waveguide 1 is indicated as an index of the intensity distribution of a microwave) is in the center of the slot 10. As described above, when this is the case the intensity distribution due to the emission characteristic of a microwave depending upon the slot 10 is in substantially agreement with the intensity distribution of a microwave propagating in the waveguide 1. Hence, the intensity distribution of a microwave is as shown in FIG. 32A.

In contrast, in this embodiment shown in FIG. 29, the slots 10 are formed in positions equally shifted $\lambda g/4$ from the positions of the comparative example in each of which a maximum value of the intensity distribution of a microwave is in the center of the slot 10.

Figure 30:
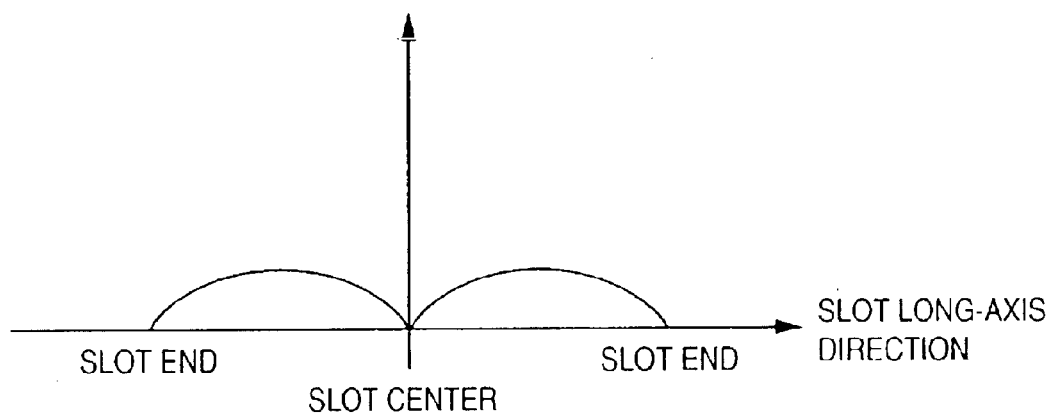
FIG. 30 is a graph showing the intensity distribution of a microwave emitted from a slot.

Accordingly, each slot 10 exists such that a minimum value of the intensity distribution of a microwave propagating in the waveguide 1 is positioned in substantially the center of the slot 10. Consequently, the intensity distribution of a microwave propagating in the waveguide 1 is influenced by the intensity distribution due to the emission characteristic of a microwave depending upon the slot 10. As shown in FIG. 30, this increases the uniformity of the intensity distribution of a microwave emitted from each slot 10.

In this embodiment, the slots 10 are formed in a so-called E plane of the waveguide 1. However, the same argument holds even when a so-called H-plane antenna in which the slots 10 are formed in the H plane is used.

As shown in FIG. 31, this embodiment is also applicable to a structure in which the slots 10 are formed in a line at a pitch of $\lambda g/2$ in the longitudinal direction. As in FIG. 29, the embodiment is shown in comparison with a comparative example. As shown in FIG. 30, the intensity distribution of a microwave emitted from each slot 10 actually increases.

More specifically, an E-plane emission antenna having La (width of the long end face)=42 mm, Lb (width of the short end face)=21 mm, and a waveguide resonator length (in the laser oscillation direction) of 220.8 mm was used to manufacture a 2.45-GHz microwave emission antenna having an aluminum alloy housing. A waveguide resonator was filled with alumina with a dielectric constant of 9.8. The wavelength in the waveguide resonator was 44.2 mm. Accordingly, the slot pitch was also set to 44.2 mm and 22.1 mm for pitches of $\lambda g$ and $\lambda g/2$, respectively.

When a slot was formed in a position corresponding to an antinode (a portion where the intensity is a maximum) of the current density, sinusoidal irradiation as shown in FIG. 32A was obtained.

Figure 32B:
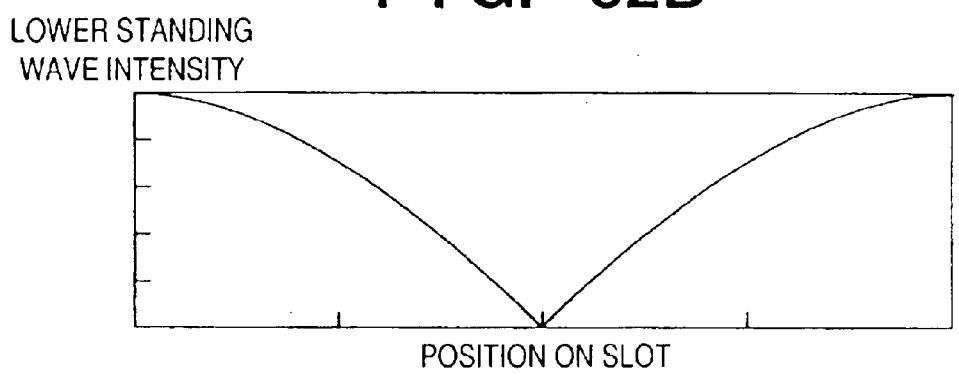

In contrast, when a slot was formed as it was shifted $\lambda g/4$, a standing-wave intensity distribution as shown in FIG. 32B was obtained.

Figure 32C:
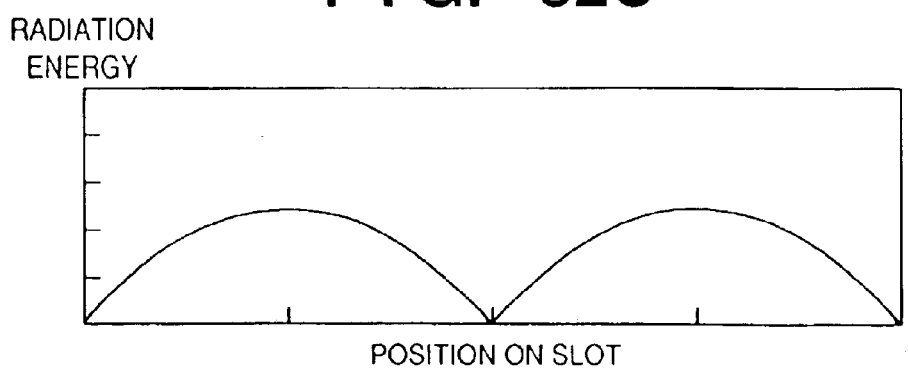

Accordingly, the intensity distribution of a microwave emitted from the slot by this excitation is given as shown in FIG. 32C, indicating irradiation with higher uniformity than in FIG. 32A.

Note that this radiation characteristic is the characteristic of a slot alone in the absence of a plasma. Since a plasma is present in practice, more uniform excitation can be expected because there is propagation in a sheath portion and the like.

As described above, the excimer laser oscillator according to this embodiment employs a slot array structure and yet realizes plasma excitation uniform as a whole over the length of each individual slot and allows uniform laser emission with minimum energy loss.

In the fifth embodiment as described above, although a slot array structure is used, it is possible to realize plasma excitation uniform as a whole over the length of each individual slot and emit uniform a laser beam with minimum energy loss.

Sixth Embodiment

The sixth embodiment will be described next. The arrangement of a laser oscillating apparatus according to the sixth embodiment is the same as the second embodiment (FIG. 14), and the structure of its waveguide is also identical with the fifth embodiment (FIGS. 33A and 33B). So, their illustration and description will be omitted.

Figure 34A:
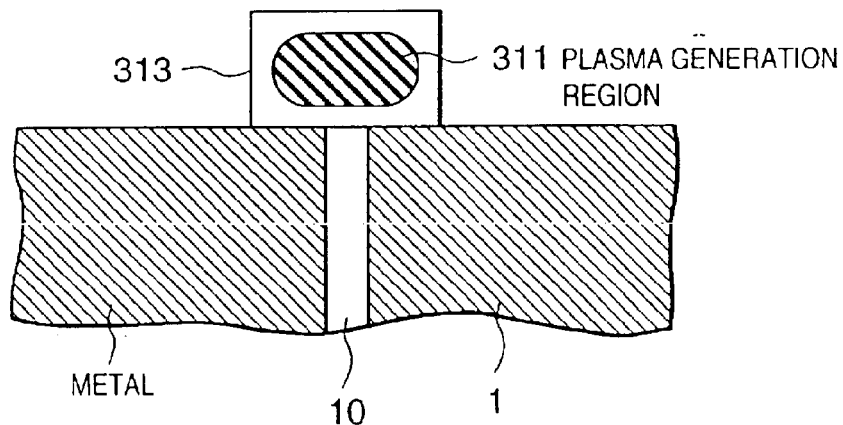
FIGS. 34A and 34B are schematic views showing shielding structures in the laser oscillating apparatus according to the sixth embodiment.

FIG. 34A shows a section near a laser tube 2 of a waveguide 1 in the sixth embodiment. That is, FIG. 34A shows a section in a direction perpendicular to the longitudinal direction of a slot 10.

As described earlier, a microwave radiated from the slot 10 excites a laser gas in the laser tube 2 to emit a plasma 311.

In this sixth embodiment, a mesh shield 313 is so formed as to surround a predetermined region over the slot 10. This mesh shield 313 is made of a metal mesh and has a function of preventing diffusion of a microwave emitted from the slot 10.

A laser gas flow path is formed over the slot 10. Since the mesh shield 313 is used, a laser gas flowing in the laser tube 2 can reach a portion above the slot 10 through this mesh shield 313.

Figure 34B:
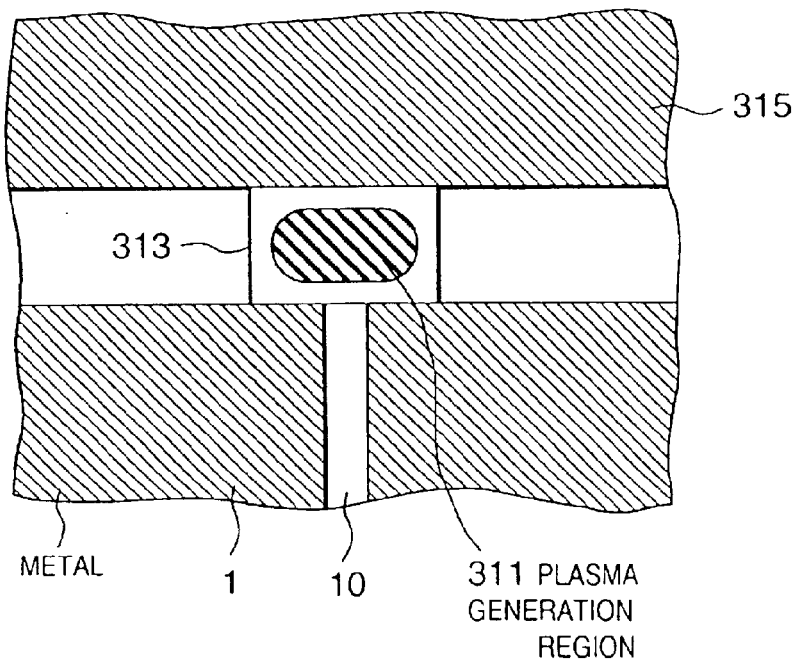

FIG. 34B shows a structure in which a metal wall 315 is additionally formed on the mesh shield 313 shown in FIG. 34A. Since no laser gas flows upward from the slot 10, a microwave can be confined more reliably by the formation of this metal wall 315.

A microwave reduces its energy by $1/e^2$ ($\approx 0.135$) times as it progresses by skin depth $\sigma$ in a plasma in a cutoff mode. Therefore, when a plasma cuts off a microwave, a region where effective plasma excitation is possible is a space of about $3\sigma$ at the emission end if propagation in a sheath region is negligible. If a plasma exists in another region, this existing plasma is a plasma generated by diffusion.

Accordingly, when a plasma is confined in a space of about $\sigma$ to $3\sigma$ from the emission end, a state in which a plasma is generated in the whole space is realized. In the structures shown in FIGS. 34A and 34B, by setting the mesh shield 313 at a distance of $\sigma$ to $3\sigma$ from the emission ends of the slot 10, a plasma can be excited in the whole area in the mesh shield 313.

When a microwave diffuses in the sheath region, the density at which energy is supplied to a plasma lowers. As a countermeasure for preventing this, microwave confinement by the mesh shield 313 is effective.

Letting $\lambda c$ be the cutoff wavelength of the basic structure of a shield and $\lambda$ be the wavelength of a microwave leaking from the sheath region, invasion length $\lambda s$ to the shield is given by $$\delta s = \frac{1}{2\pi \sqrt{\frac{1}{\lambda c^2} - \frac{1}{\lambda^2}}}$$

A ratio p of the energy of a microwave entering the shield to the energy of a microwave leaking outside the shield is $$p = \exp\left(-\frac{2d}{\delta s}\right)$$

where d is the thickness of the shield. Accordingly, the basic structure $\lambda c$ of the shield is determined, so when the shield radiation ratio p is determined a minimum value of d necessary for that can be calculated. Therefore, the lower limit of a necessary shield thickness can be calculated. The shield effect can be simply obtained by using a diameter of below ¼ the wavelength in the waveguide.

As an example, when a mesh having a shield thickness of 1 mm is used and energy leakage of an electromagnetic wave to the outside is set to 1% or less, a necessary maximum penetration length to the shield is 0.43 mm. When the basic unit of a mesh is a rectangle and its peripheral length is $\underline{a}$, $\lambda c = 2a$. When this is the case, $\underline{a}$ must be 1.4 mm or less.

The structure of this embodiment can prevent the diffusion of a microwave propagating in the sheath in a plasma generated by a microwave emitted from the slot 10. Therefore, a plasma can be generated inside the mesh shield 313.

A plasma diffusing inside the mesh shield 313 acts as internal axis of a coaxial waveguide, and consequently a portion where the plasma diffuses (the diffusion length of the plasma) operates as the coaxial waveguide. Hence, a microwave switches to a TEM mode and easily propagates.

This propagation occurs in the sheath region where the penetration length to the plasma is not negligible with respect to the sheath thickness. Since loss due to the propagation is large, the propagation attenuates within a short distance. However, this propagation sometimes still suffers a problem when confinement is performed.

That is, a microwave also propagates the diffusion length of the plasma in addition to the microwave cutoff length $\delta s$ of the shield. Hence, the shield length must be set to be equal to or larger than the cutoff length of a microwave alone+the diffusion length of a plasma.

Letting S be the surface area of a shield for performing confinement, $\alpha$ be the aperture ratio, P be the operating pressure, and k be the structure factor, conductance C (the ease with which a gas flows) of a gas passing through the shield is, in the case of a viscous fluid, given by $$C = k \frac{(\alpha S)^2 P}{d}$$

Accordingly, when the operating pressure and the shield structure are determined, the upper limit of the shield thickness can be calculated.

The shield length and conductance necessary to cut off a microwave are contrary to each other with respect to $\alpha$ and d. Therefore, optimum values of these shield length and conductance can be defined from $\alpha$ and d.

The material of the shield desirably has a low resistivity to reduce loss of a microwave. Also, the thermal resistance of the material is desirably low because the shield is in contact with a plasma and hence is at high temperature. Furthermore, the material surface can be subjected to the fluorine passivation process or covered with a fluorine-based compound.

In the sixth embodiment as described above, the mesh shield 313 is so formed as to cover a portion above the slot 10. This prevents lateral diffusion of a plasma through the sheath from the portion above the slot 10. The use of this mesh shield 313 can also realize more uniform discharge by avoiding electric field concentration in a plasma.

Seventh Embodiment

The seventh embodiment of the present invention will be described below with reference to the accompanying drawings.

Figure 35A:
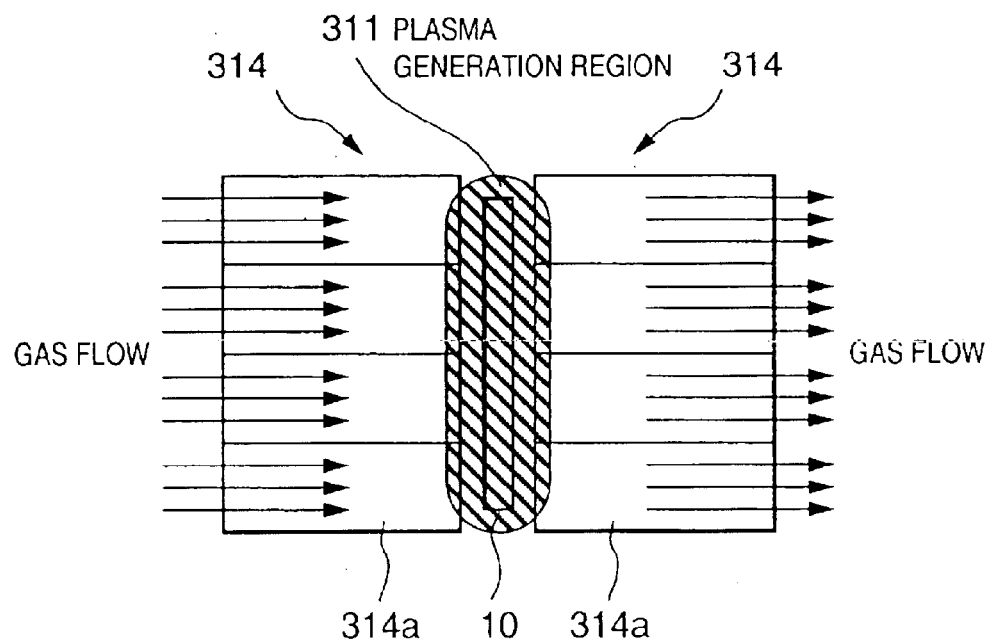
FIGS. 35A and 35B are schematic views showing a shielding structure in the laser oscillating apparatus according to the seventh embodiment.

FIG. 35A is a perspective view showing a shielding structure for confining a plasma excited over a slot 10 into a predetermined region according to the seventh embodiment. Note that the overall arrangement of an excimer laser oscillator according to the seventh embodiment is the same as the sixth embodiment, so a detailed description thereof will be omitted. Note also that in the drawings for explaining the seventh embodiment, the same reference numerals as in the sixth embodiment denote substantially the same parts, and a detailed description thereof will be omitted.

Figure 35B:
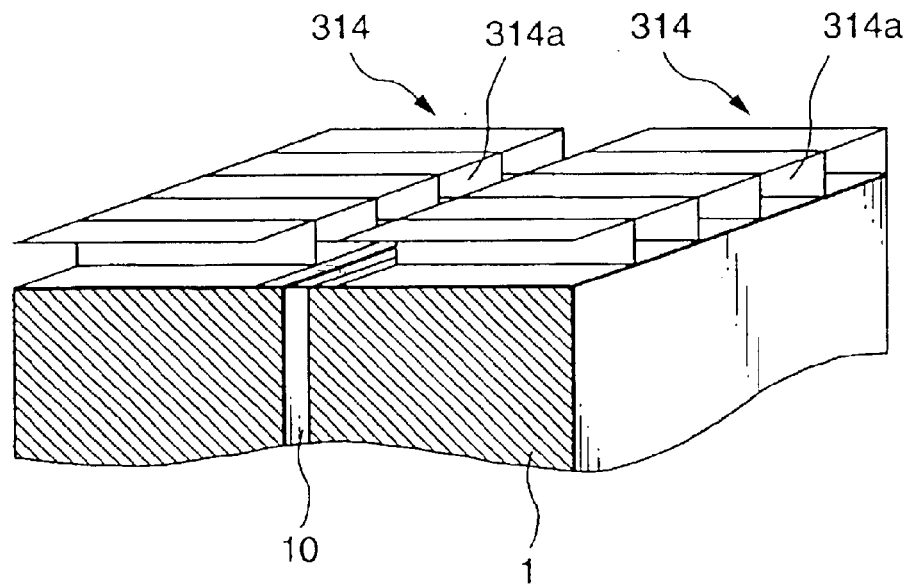

As shown in FIGS. 35A and 35B, in a laser tube 2, nozzle shields 314 are formed above the slot 10 formed in a waveguide 1. FIG. 35A is a plan view showing the nozzle shields 314 from above the slot 10. FIG. 35B is a perspective view of the nozzle shields 314.

As shown in FIGS. 35A and 35B, each nozzle shield 314 is composed of a plurality of cylindrical nozzles 314a. The interior of each nozzle 314a is a laser gas passage. The arrows shown in FIG. 35A indicate the flow of a laser gas. A laser gas flows through each nozzle 314a in a direction perpendicular to the longitudinal direction of the slot 10, and is excited by a microwave emitted from the slot 10.

This nozzle shield 314 has a property of preventing a microwave from passing through an opening smaller than a predetermined size. That is, by arraying a plurality of nozzles 314a each having an opening of a predetermined size corresponding to the frequency of a microwave to be emitted, this microwave can be spatially confined as in the case of a metal wall or the mesh shield explained in the sixth embodiment.

Since the nozzle shields 314 are arranged along the laser gas flow, the laser gas flow is not interfered with. Therefore, when ultra-high-speed gas replacement is performed, few resistance is easily generated in the laser gas flow, so the production of pressure loss can be prevented.

In the seventh embodiment, a plasma and a microwave can be confined more effectively than when the mesh shield is used. This is so because when the mesh shield is used, a microwave alone can be confined but the effect of confinement has its limits if a plasma diffuses and invades the mesh structure.

Figure 36A:
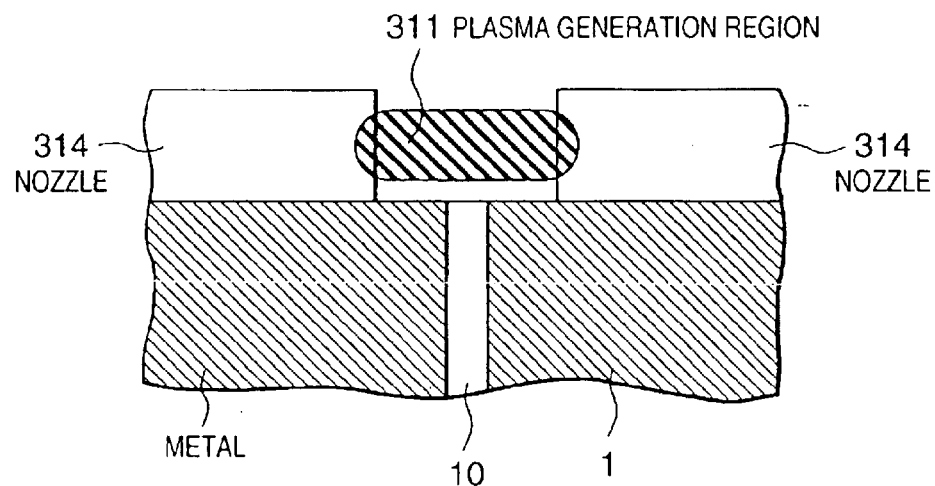
FIGS. 36A and 36B are schematic views showing shielding structures in a laser oscillating apparatus according to the seventh embodiment.

FIG. 36A is a schematic view showing a section along the direction of the gas flow shown in FIG. 35A. The nozzle shields 314 can prevent the lateral diffusion of a microwave and a plasma from the slot 10 and can thereby confine an excited plasma in a predetermined range over the slot 10.

Figure 36B:
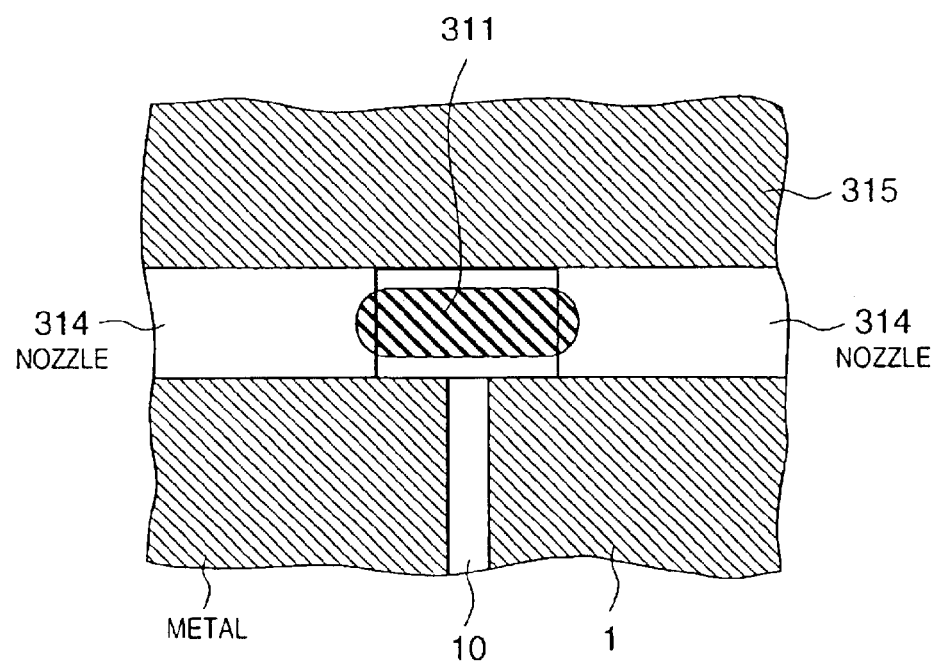

FIG. 36B shows a structure in which a metal wall 315 is formed above the slot 10 in order to prevent the upward diffusion of a microwave and a plasma. This metal wall 315 can prevent not only the lateral diffusion but also the upward diffusion of a microwave and a plasma from the slot 10. Consequently, a plasma can be confined within a predetermined distance from the opening edges of the slot 10.

A practical structure of the nozzle shield 314 will be described below. Assume that a 20-mm long nozzle is used and the leakage of an electromagnetic wave to the outside is 1% or less. A maximum invasion length to the shield required in this case is 8.7 mm.

When the basic unit of the mesh is a rectangle and the length of its long side is a, λc=2a. When this is the case, a must be 30 mm or less. Therefore, the spacing between the nozzles is 25 mm or less, i.e., a considerably wide margin can be set.

As an example, when the nozzle wall spacing is set to 20 mm, the leakage of 2.45-GHz mircrowave to the outside can be held at 1% or less even if a plasma diffuses by about 4.5 mm. This structure also has the advantage that a large conductance can be obtained. This is effective when a high-speed gas is to be supplied.

For example, the nozzle conductance of a nozzle having a 20 mm×2 mm basic structure 20 mm long is 3.3 times as high as that of a mesh having a 1-mm thick square basic structure of 1 mm side for the same sectional area, although the thickness (length) is 20 times (assuming that the thicknesses of the mesh and the nozzle wall are 1 mm, the aperture ratios of the mesh and the nozzle are 25% and 91%, respectively). That is, the use of the nozzle structure extremely improves the ease with which gasses flow. In addition, turbulence often occurs in actual gas flows. To avoid this turbulence, the structure spacing is desirably as large as possible. In the seventh embodiment as described above, a plurality of nozzles 314a each having an opening through which no a microwave can pass are arrayed to form the nozzle shield 314. Hence, a generated plasma can be confined in a predetermined region. Additionally, since a laser gas is allowed to flow through each nozzle 314a, few resistance is generated in the gas flow even though the shield structure is formed. This can minimize the production of pressure loss.

Eighth Embodiment

Figure 37A:
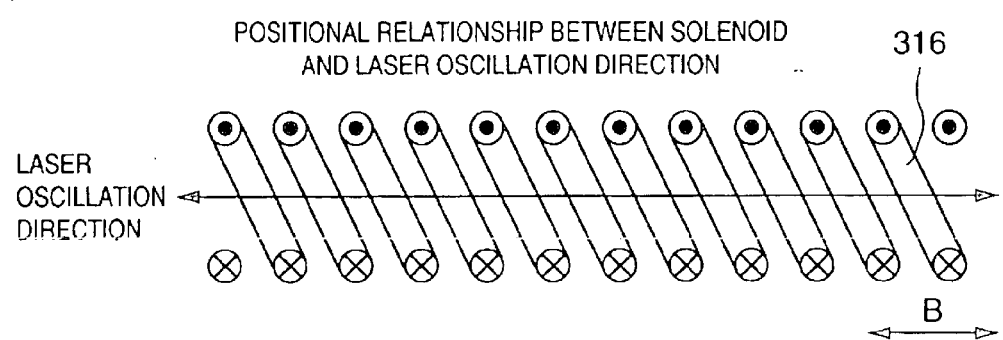
FIGS. 37A and 37B are schematic views showing shielding structures in a laser oscillating apparatus according to the eighth embodiment.
Figure 37B:
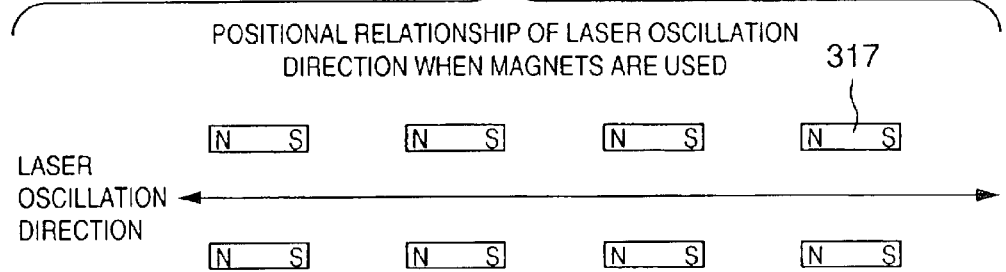
Figure 38A:
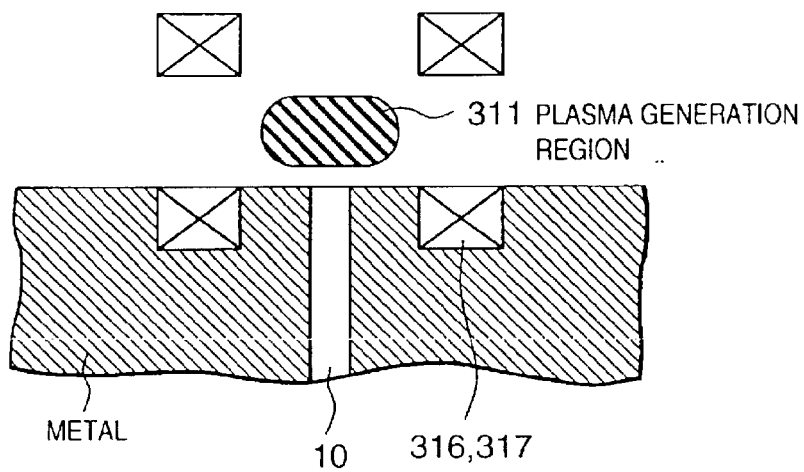
FIGS. 38A and 38B are schematic views showing shielding structures in the laser oscillating apparatus according to the eighth embodiment.
Figure 38B:
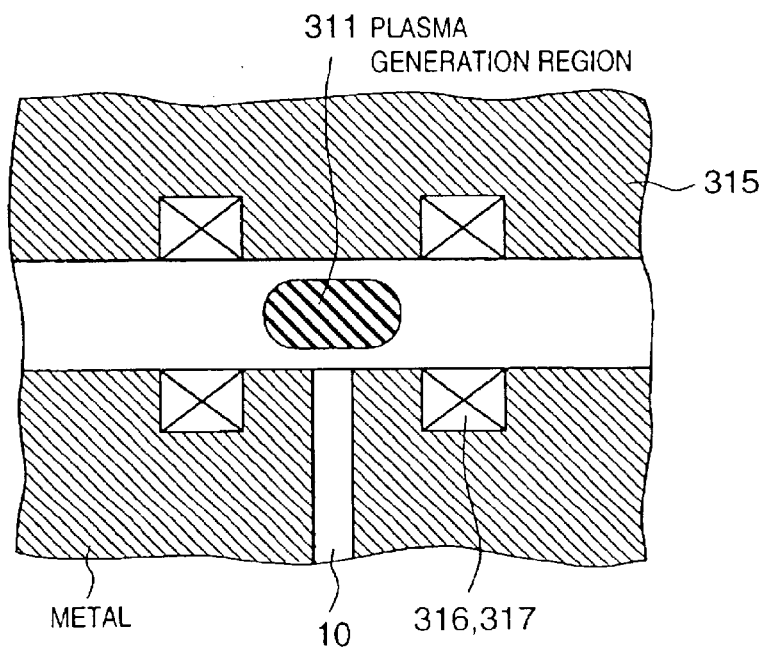
Figure 39:
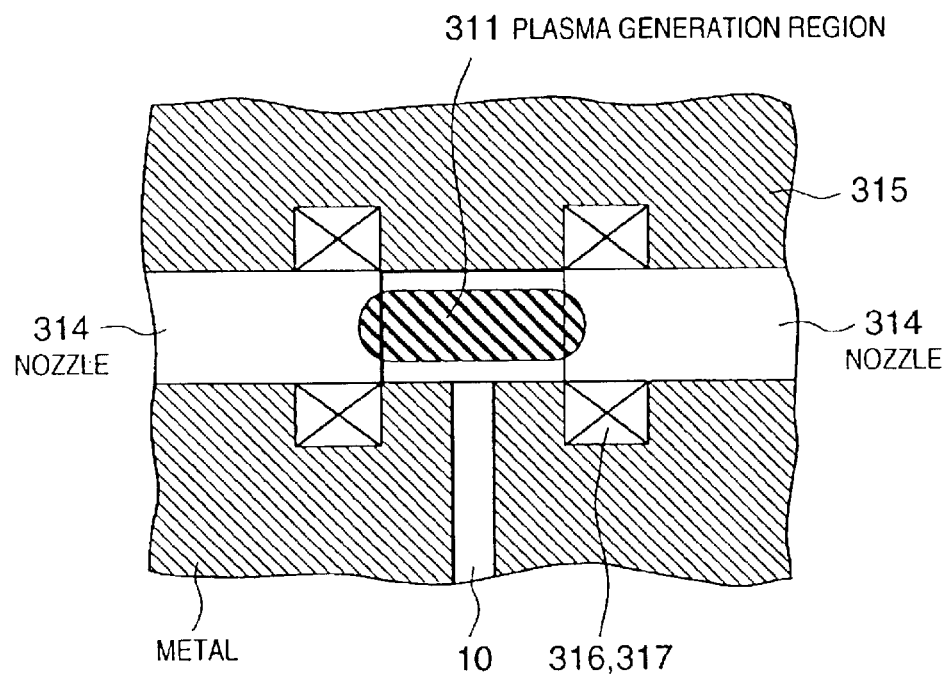
FIG. 39 is a schematic sectional view showing a shielding structure in the laser oscillating apparatus according to the eighth embodiment.

The eighth embodiment will be described below with reference to the accompanying drawings. FIGS. 37A and 37B are schematic views showing the structures of magnetic shields according to the eighth embodiment. FIGS. 38A and 38B and FIG. 39 are schematic views showing sections along a direction perpendicular to the longitudinal direction of a slot 10. Note that the overall arrangement of an excimer laser oscillator according to the eighth embodiment is identical with the sixth embodiment, so a detailed description thereof will be omitted. Note also that in the drawings for explaining the eighth embodiment, the same reference numerals as in the sixth embodiment denote substantially the same parts, and a detailed description thereof will be omitted.

In the eighth embodiment, a magnetic field is used to confine a plasma excited over the slot 10 into a predetermined range. This magnetic field can be formed by using a solenoid as shown in FIG. 37A or by arranging general magnets as shown in FIG. 37B.

FIG. 37A shows an example using a solenoid 316 to form a magnetic field. As shown in FIG. 37, this solenoid 316 is placed such that the extending direction of the solenoid 316 is the same as the laser oscillation direction. That is, the longitudinal direction of a waveguide 1 and the slot 10 shown in FIGS. 33A and 33B and the extending direction of the solenoid 316 are the same.

The field intensity is determined so that the Larmor period of an electron in the magnetic field is shorter than the collision period of an electron and an atom in a plasma (magnetic-field plasma condition). Letting B be a flux density, m be the mass of an electron, and e be elementary charge, the Larmor angular velocity of an electron is given by $$\omega_{Larmor} = \frac{eB}{m}$$

Letting n be an atomic density, r be an atomic radius, T be an electron temperature, and k be a Boltzmann coefficient, the collision angular velocity of an electron and an atom is given by $$\omega_{Collision} = 4\pi n r^2 \sqrt{\frac{2\pi kT}{m}}$$

From these equations, the flux density must be about 1 Torr or more when the operating pressure of an excimer laser and the like are taken into consideration.

When an intense magnetic field is applied by the solenoid 316, plasma electrons precess along the formed magnetic flux. Since the magnetic flux is formed in the same direction as the laser oscillation direction, the electrons do not easily diffuse in a direction perpendicular to the laser oscillation direction. This realizes plasma confinement. The same effect can be obtained when a magnetic field is formed using magnets 317 shown in FIG. 37B.

FIG. 38A is a schematic sectional view showing the arrangement of the solenoid 316 or the magnets 317 around the slot 10. To confine a plasma above the slot 10, it is desirable to place the magnets 317 in, e.g., four positions so as to surround a portion above the slot 10. In this manner, a plasma generated can be confined above the slot 10.

FIG. 38B shows an example in which a metal wall 315 is formed above the slot 10. This metal wall 315 prevents the upward diffusion of a plasma from the slot 10. Also, the solenoid 316 or the magnets 317 prevent the lateral diffusion of a plasma from the slot 10.

FIG. 39 shows a structure in which nozzle shields 314 are added to the structure shown in FIG. 38B. In this structure, the lateral diffusion of a plasma from the slot 10 can be prevented by the combined effect of the solenoid 316 or the magnets 317 and the nozzle shields 314. In the eighth embodiment as described above, to enhance the microwave confining effect, it is desirable to use the shielding structure according to the sixth or seventh embodiment jointly.

As described above, in the eighth embodiment a magnetic flux is formed in the same direction as the laser oscillation direction. This prevents electrons in plasma from diffusing in a direction perpendicular to the laser oscillation direction. Consequently, plasma confinement above the slot 10 can be realized.

In the sixth to eighth embodiments as described above, the diffusion of a plasma from above each individual slot to the outside of a predetermined range can be prevented. Accordingly, it is possible to provide a laser oscillating apparatus capable of uniform laser emission with minimum energy loss, a high-performance exposure apparatus including this laser oscillating apparatus, and a high-quality device fabrication method using this exposure apparatus.

Ninth Embodiment

The ninth embodiment will be described next. The arrangement of a laser oscillating apparatus according to the ninth embodiment is identical with the second embodiment (FIG. 14), and the structure of its waveguide is also identical with the fifth embodiment (FIGS. 33A and 33B). Therefore, their illustration and description will be omitted.

Figure 40:
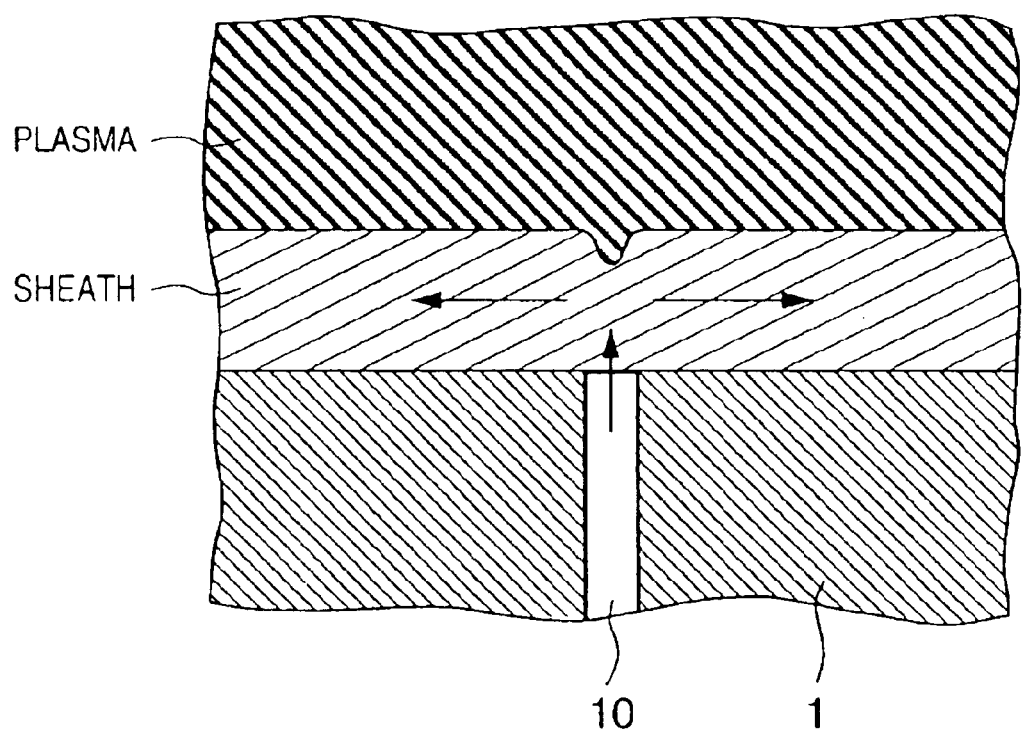
FIG. 40 is a schematic sectional view showing a slot in a laser oscillating apparatus according to the ninth embodiment.

FIG. 40 shows a section near a laser tube 2 of a waveguide 1 according to the ninth embodiment. This section shown FIG. 40 is in a direction perpendicular to the longitudinal direction of a slot 10.

A microwave is radiated from the slot 10 formed in the waveguide 1 to generate a plasma above the slot 10. A sheath is formed between this plasma and the opening edges of the slot 10. In this embodiment, the diameter (width) of the slot 10 is set to a value (10 to 100 μm) equal to or smaller than the sheath thickness in order to allow uniform propagation of a microwave. Therefore, it is possible to prevent the lateral propagation of a microwave from the slot 10 and generate a plasma only in a portion above the slot 10. The dimension of the extension of a plasma over the slot 10 is preferably 1/10 or less of the laser beam diameter, since the influence on laser oscillation is little in this case.

In the ninth embodiment of the present invention as described above, the width of the slot 10 is made smaller than the wavelength of a microwave. This prevents a plasma from diffusing laterally from over the slot 10 through a sheath.

10th Embodiment

The 10th embodiment of the present invention will be described below with reference to the accompanying drawings. In this 10th embodiment, a slot 10 is constructed of a plurality of slits 411. Note that the overall arrangement of an excimer laser oscillator according to the 10th embodiment is the same as the ninth embodiment, so a detailed description thereof will be omitted. Note also that in the drawings for explaining the 10th embodiment, the same reference numerals as in the ninth embodiment denote substantially the same parts, and a detailed description thereof will be omitted.

As explained in the ninth embodiment, when the width of the slot 10 is made very small, smaller than the wavelength of a microwave, the slot 10 is narrow in its short-side direction, so it is assumed that no enough aperture ratio can be obtained and the emission efficiency decreases. In this 10th embodiment, to prevent this, a plurality of slits 411 are arranged in parallel to form the slot 10, thereby increasing the emission efficiency. This is the difference from the ninth embodiment.

Figure 41:
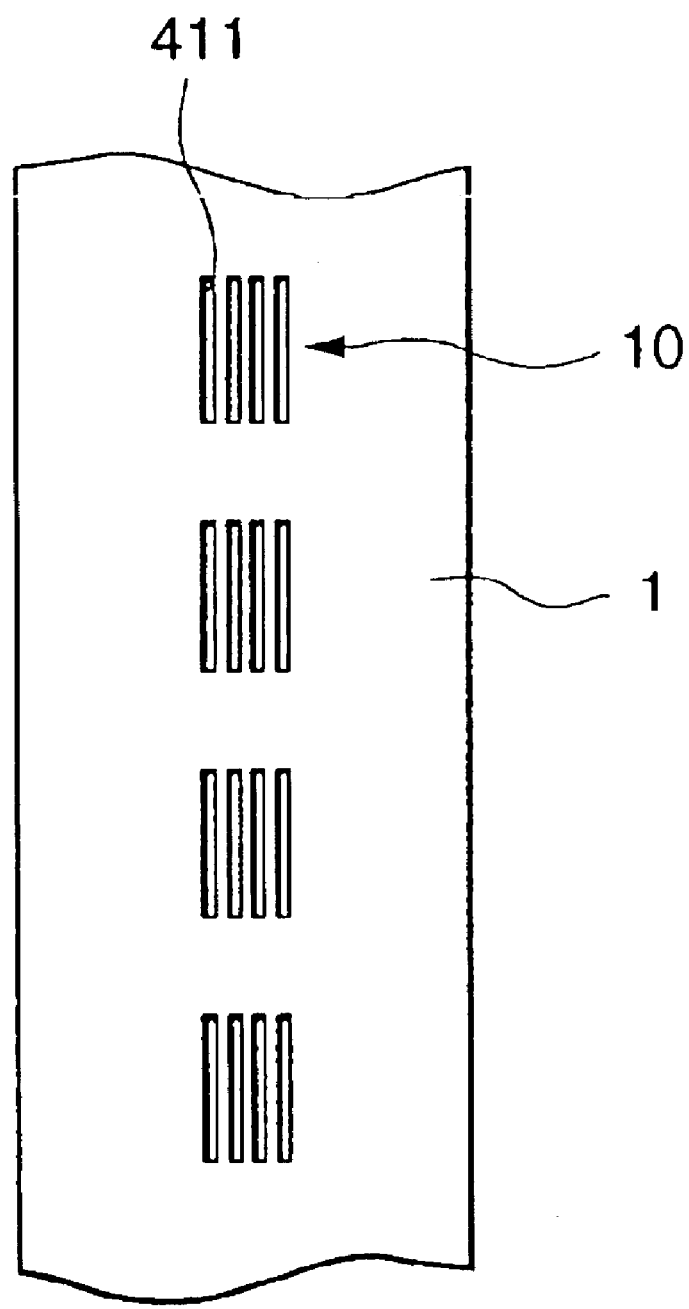
FIG. 41 is a schematic plan view showing slots in the laser oscillating apparatus according to the ninth embodiment.
Figure 42:
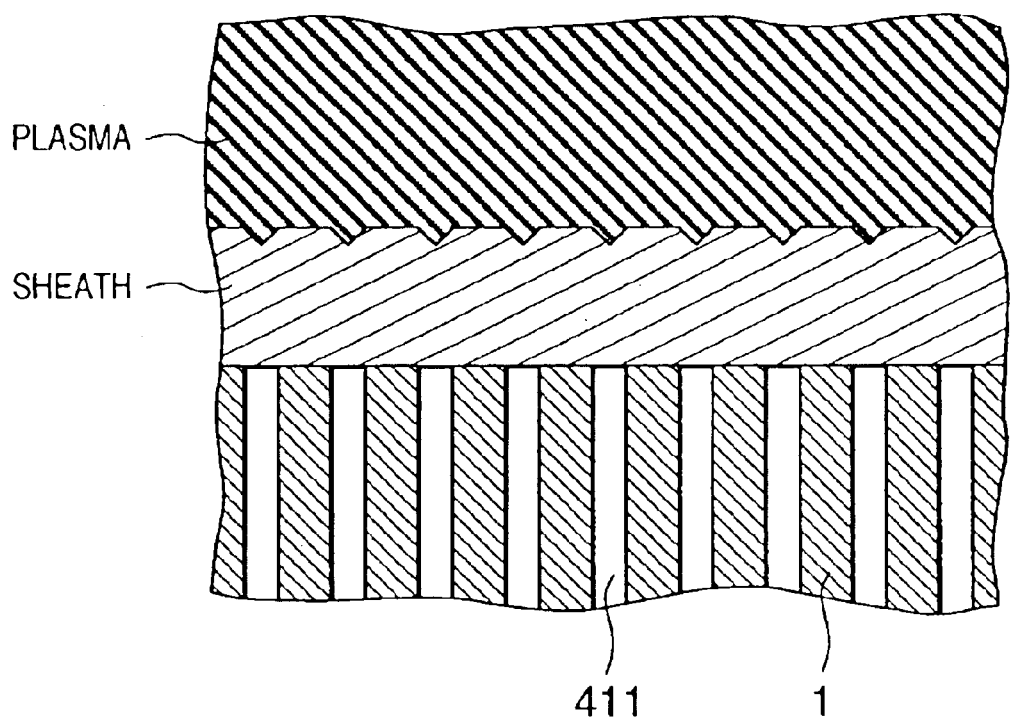
FIG. 42 is a schematic sectional view showing a slot in a laser oscillating apparatus according to the 10th embodiment.

FIG. 41 is a plan view of a waveguide 1 in which the slot 10 composed of a plurality of slits 411 is formed. FIG. 42 is a schematic view showing a section in a direction perpendicular to the longitudinal direction of the slits 411.

As described above, by arranging a plurality of very narrow slits 411 in parallel, it is possible to obtain a desired aperture ratio and uniformly generate a plasma over the slot 10 in which these slits 411 are arranged in parallel.

Figure 43:
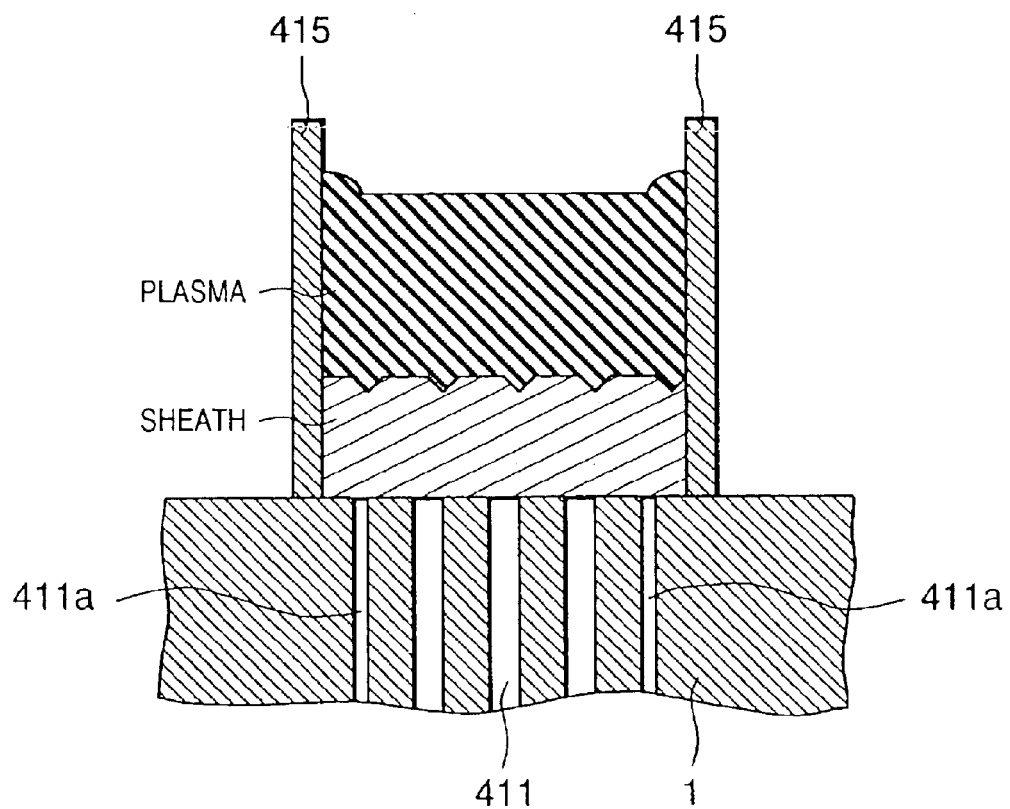
FIG. 43 is a schematic view showing a slot in the laser oscillating apparatus according to the 10th embodiment.

FIG. 43 shows an example in which when slits 411 are arranged in parallel, slits 411a in the end portions are made narrower than central slits 411.

When metal walls 415 are formed in the short-side direction of the opening edges of the slot 10 (slits 411) in order to prevent the diffusion of a plasma generated in the short-side direction of the slits 411, larger amounts of a plasma are generated in positions along these metal walls 415. This sometimes poses a problem of securing the uniformity of a plasma. As shown in FIG. 43, when the width in the short-side direction of the slits 411 in the end portions are made smaller than the width in the short-side direction of the central slits 411, the radiation intensity of a microwave radiated from these slits 411 can be decreased. Accordingly, a plasma generated over the slot 10 can be uniformized as a whole.

Figure 44:
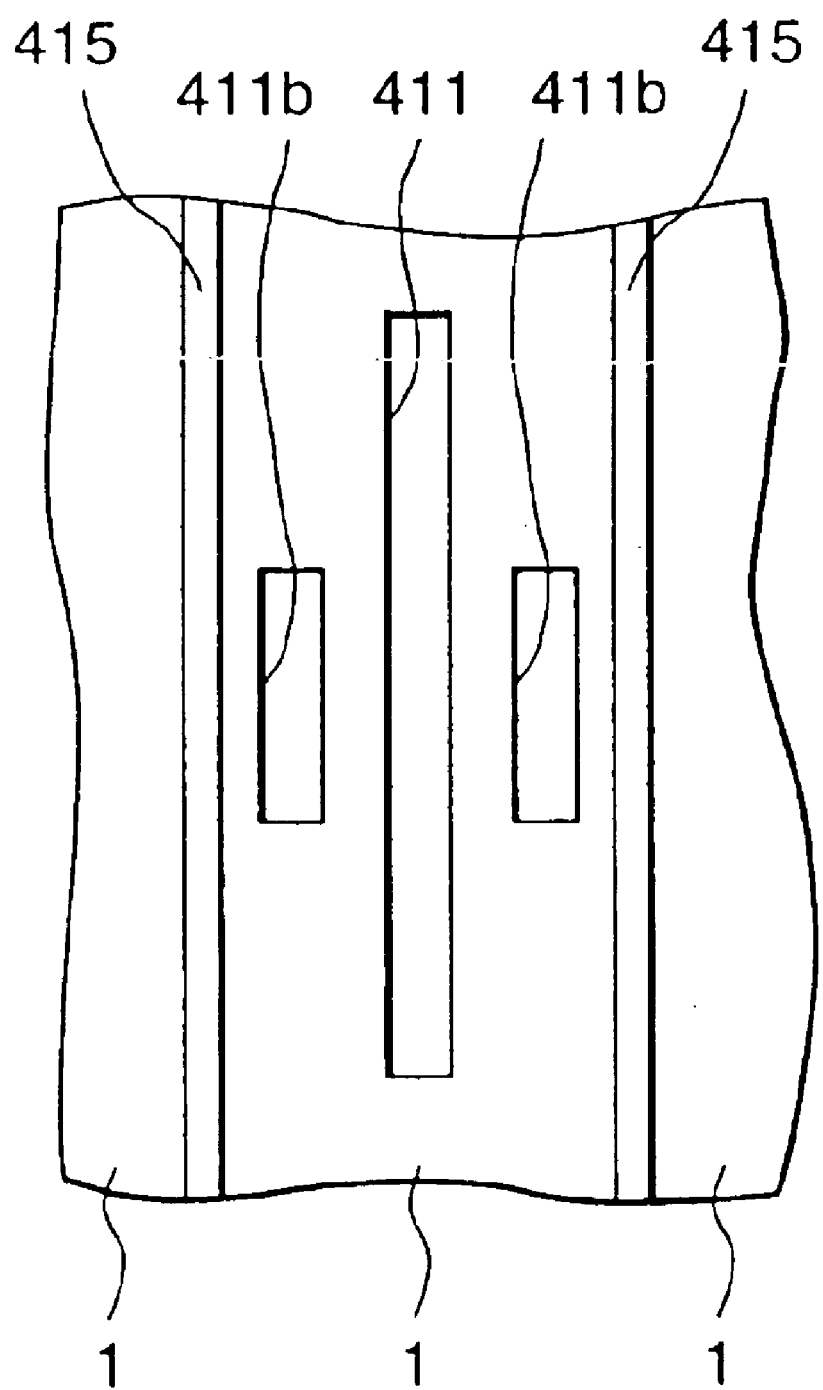
FIG. 44 is a schematic plan view showing a slot in the laser oscillating apparatus according to the 10th embodiment.

As shown in FIG. 44, it is also possible by decreasing the length of slits 411b in the end portions to suppress the generation of a plasma in the vicinities of the metal walls 415 and realize uniform plasma generation over the slot 10. Note that a similar effect can naturally be obtained by a structure equivalent, for microwaves, to the metal walls, i.e., by a structure capable of confining microwaves.

In the 10th embodiment as described above, the very narrow slits 411a are arranged in parallel. This makes it possible to increase the emission efficiency of a microwave and uniformly generate a plasma over the slot 10.

In the ninth and 10th embodiments as described above, the diffusion of a plasma from over each individual slot to the outside of a predetermined range can be prevented. Accordingly, it is possible to provide a laser oscillating apparatus capable of uniform laser emission with minimum energy loss, a high-performance exposure apparatus including this laser oscillating apparatus, and a high-quality device fabrication method using this exposure apparatus.

11th Embodiment

Figure 45:
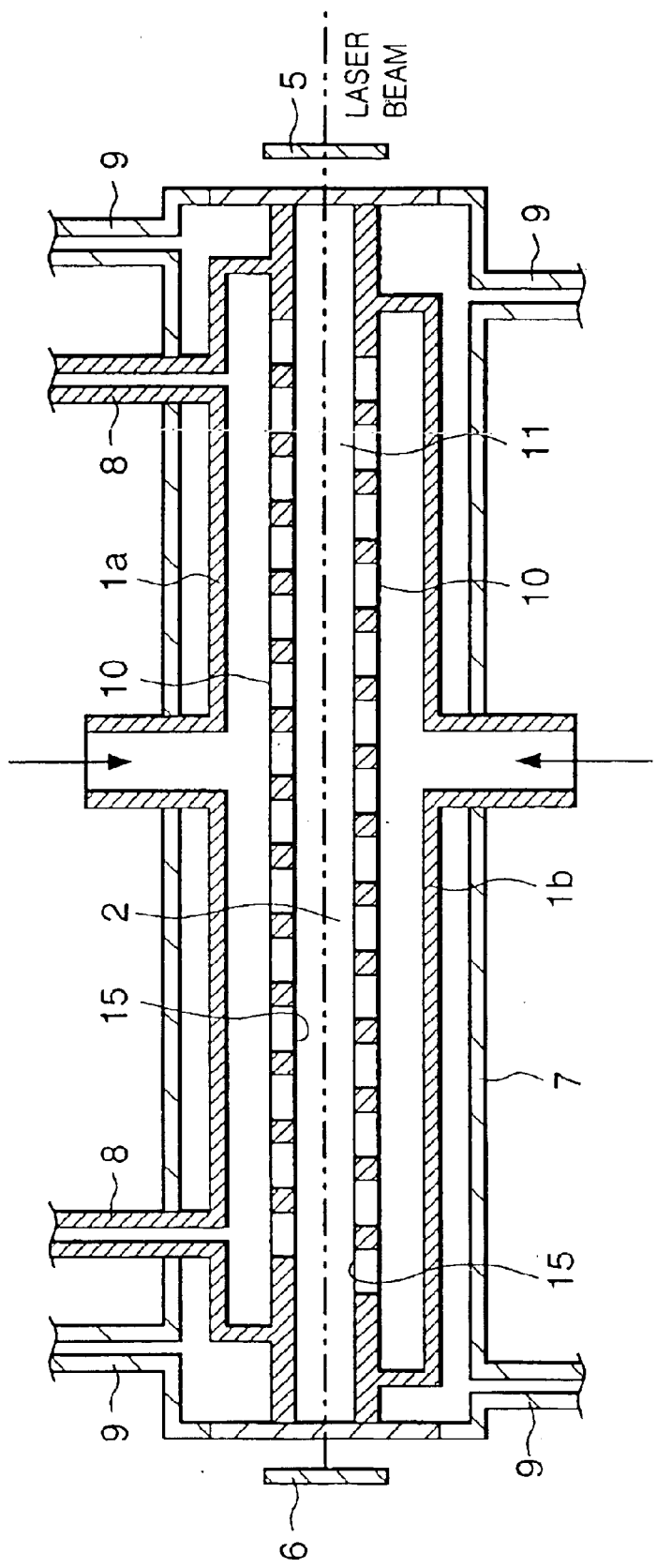
FIG. 45 is a schematic view showing the major parts of an excimer laser oscillator according to the 11th embodiment.

FIG. 45 is a schematic view showing the major components of an excimer laser oscillator according to the 11th embodiment of the present invention.

As shown in FIG. 45, this excimer laser oscillator comprises a laser tube 2, a pair of waveguides 1a and 1b, and a cooling vessel 7. The laser tube 2 emits a laser beam by resonating light emission caused by excitation of an excimer laser gas. The waveguides 1a and 1b excite the excimer laser gas in the laser tube 2 into a plasma. The cooling vessel 7 has cooling water inlet/outlet ports 9 for cooling the waveguides 1a and 1b.

The excimer laser gas as a material for generating an excimer laser beam is at least one inert gas selected from Kr, Ar, and Ne, or a gas mixture of at least one inert gas described above and $F^2$ gas. These gases can be appropriately selected and used in accordance with the wavelength of interest. For example, Kr/Ne/$F^2$ is used when laser beam with a wavelength of 248 nm is to be generated; Ar/Ne/$F^2$ is used when a laser beam with a wavelength of 193 nm is to be generated; and Ne/$F^2$ is used when a laser beam with a wavelength of 157 nm is to be generated.

The laser tube 2 has laser gas inlet/output ports 8 through which the excimer laser gas is introduced into the tube, and reflecting structures 5 and 6 at the two end portions. These reflecting structures 5 and 6 equalize the phases of light by plasma discharge and generate a laser beam.

The waveguides 1a and 1b are means for supplying a microwave to the laser gas in a gas supply passage structure 11. A plurality of long and narrow gaps (slots) 10 are formed in the internal surface. When a microwave with a frequency of a few hundred MHz to several tens of GHz is introduced from the upper portions of the waveguides 1a and 1b shown in FIG. 1, this microwave propagates in the waveguides 1a and 1b and is emitted from the slots 10 to the outside of the waveguides 1a and 1b. The emitted microwave is introduced into the laser tube 2 through a window 15 formed in this laser tube 2. The microwave thus introduced excites the excimer laser gas in the laser tube 2, thereby generating an excimer laser beam by resonance.

Figure 46:
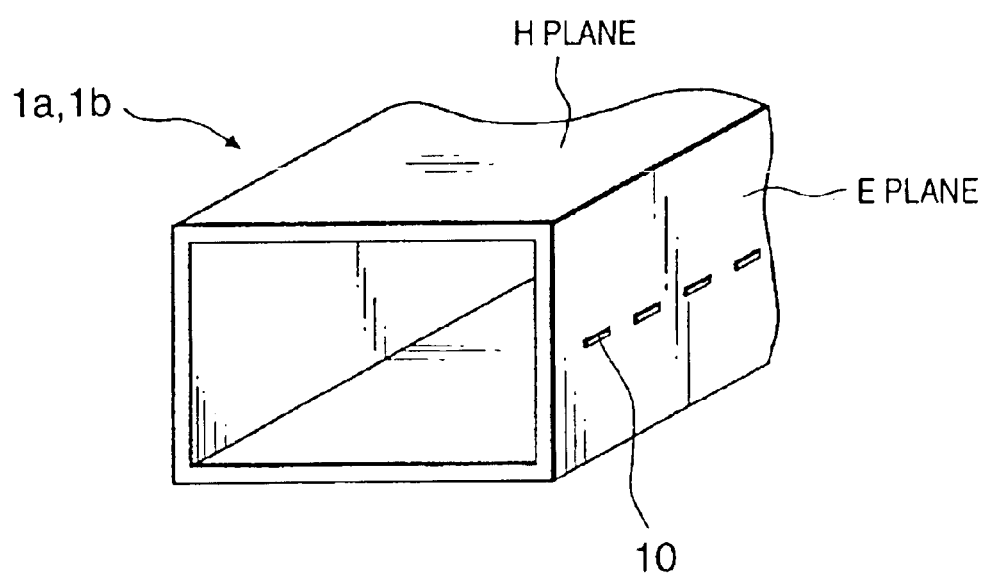
FIG. 46 is a perspective view showing the slot formation surface (E plane) of a waveguide.

In this 11th embodiment, as shown in FIG. 46, the formation surface of the slots 10 is the short end face of each of the waveguides 1a and 1b, i.e., the E plane. Also, these slots 10 are formed in a line at equal intervals in the longitudinal direction.

In the 11th embodiment, the waveguides 1a and 1b as described above are so formed as to vertically sandwich the laser tube 2. These waveguides 1a and 1b are arranged such that the slots 10 corresponding to each other between the opposing slot formation surfaces are shifted a predetermined distance relative to each other (spatial shift; to be simply expressed as "shift" in the following tables). Furthermore, a phase adjusting shifter is used to shift the phases of microwaves supplied into the waveguides 1a and 1b relative to each other (phase shift; to be expressed as "shifter" in the following tables).

Figure 47:
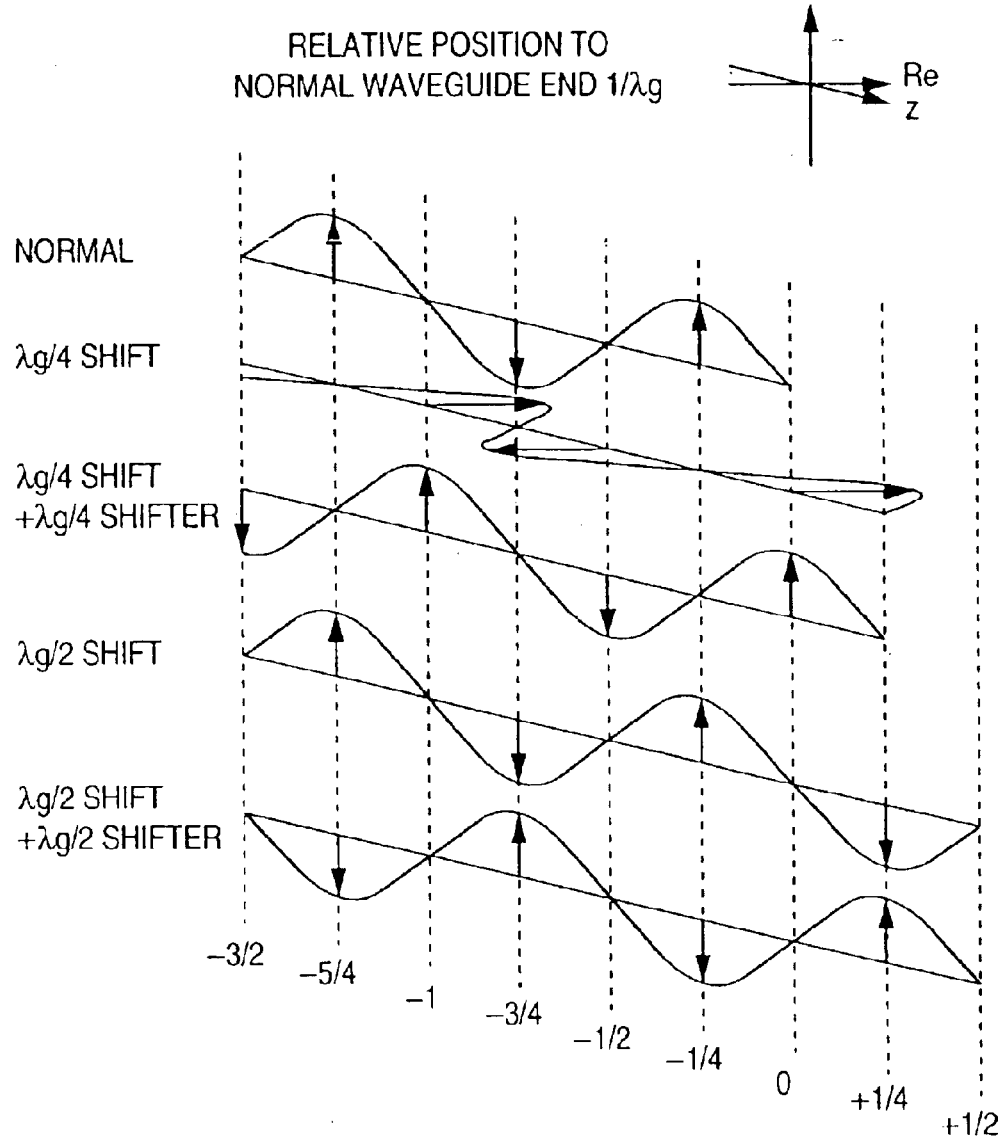
FIG. 47 is a graph showing the relationship between the standing waves of a microwave when space shift and phase shift are performed.

FIG. 47 is a graph showing the standing waves of microwaves in the waveguides 1a and 1b when the slots 10 are normally opposed (with no spatial shift and no phase shift), when the slots 10 are shifted a distance of $\lambda g/4$ ($\lambda g$: waveguide wavelength), when the slots 10 are shifted a distance of $\lambda g/4$ and the phases are shifted by $\lambda g/4$, when the slots 10 are shifted a distance of $\lambda g/2$, and when the slots 10 are shifted a distance of $\lambda g/2$ and the phases are shifted by $\lambda g/2$.

Calculations for deriving the phase relationship between the standing waves in each case will be represented by the following equations.

Assuming that an incident wave passing through the phase adjusting shifter and shifted in phase by θ is $$\exp(i(\omega t - \beta z + -\theta \pi/2))$$

a reflected wave is $$\exp(i(\omega t + \beta z + \theta + \pi/2 - 2\beta d))$$

by taking account of a path length difference 2d produced because the waveguide end moves a distance d and phase inversion due to reflection at the waveguide end. Accordingly, assuming there is no attenuation, the standing wave generated is $$2 \exp(i(\omega t + \theta - \beta d)) \sin(\beta z - \beta d)$$

for $\omega = 2\pi/T$ and $\beta = 2\pi/\lambda g$.

When d=0 and θ=0 (normal slot)

$$2 \exp(i\omega t) \sin \beta z$$

When d=$\lambda g/4$ and θ=0 ($\lambda g/4$ shift)

$$2 \exp[i\omega(t-T/4)] \sin \beta(z-\lambda g/4)$$

When d=$\lambda g/4$ and θ=π/2 ($\lambda g/4$ shift+$\lambda g/4$ shifter)

$$2 \exp(i\omega t) \sin \beta(z-\lambda g/4)$$

When d=$\lambda g/2$ and θ=0 ($\lambda g/2$ shift)

$$2 \exp[i\omega(t-T/2)] \sin \beta(z-\lambda g/2)$$

When d=$\lambda g/2$ and θ=0 ($\lambda g/2$ shift+$\lambda g/2$ shifter)

$$2 \exp(i\omega t) \sin \beta(z-\lambda g/2)$$

From these relationships, the intensity phase relationship between the standing waves is obtained.

When a waveguide in which the slots 10 are formed in the E plane at a pitch of $\lambda g/2$ is used, microwaves emitted from adjacent slots are in opposite phases, so a space in which microwaves do not oscillate is formed between these slots. When a waveguide in which the slots 10 are formed in the E plane at a pitch of $\lambda g$ is used, microwaves emitted from adjacent slots are in phase with each other and hence do not cancel out each other. However, the uniformity in the slot longitudinal direction decreases because the slot interval is twice that when the pitch is $\lambda g/2$.

In this embodiment, a laser oscillating apparatus is so constructed that predetermined space shift and predetermined phase shift are performed by using a pair of waveguides having a pitch of $\lambda g$, thereby complementing the microwave emission characteristics of the waveguides 1a and 1b described above.

A case in which the waveguides 1a and 1b are normally opposed with not space shift and no phase shift, a case in which the waveguides 1a and 1b are spatially shifted relative to each other, and a case in which both space shift and phase shift are performed will be described below for each of the pitches $\lambda g/2$ and $\lambda g$ of the slots 10 of the waveguides 1a and 1b.

First, an example of the normal opposing arrangement is shown in Table 2 (pitch$\lambda g/2$) and Table 3 (pitch $\lambda g$). In Tables 2 and 3, the distribution in the laser resonance direction of a microwave in the upper waveguide 1a and the distribution of a microwave in the lower waveguide 1b are indicated in upper and lower cells for each time. The + and − signs indicate the polarity in an antinode of the standing wave of a microwave. Hatched portions in each table indicate the slots 10 actually formed in the upper and lower waveguides 1a and 1b. Note that hatched portions in Tables 4 to 11 (to be described later) have the same meaning as in Tables 2 and 3.

TABLE 2

Normal slots (pitch $\lambda g/2$)

| z \ t | -3/2 | -5/4 | -1 | -3/4 | -1/2 | -1/4 | 0 | 1/4 | 1/2 |
|---|---|---|---|---|---|---|---|---|---|
| +0 |  | 0 |  | 0 |  | 0 | + | None | None |
|  |  | 0 | + | 0 |  | 0 |  | None | None |
| +1/4 | 0 | 0 | 0 | 0 | 0 | 0 | 0 | None | None |
|  | 0 | 0 | 0 | 0 | 0 | 0 | 0 | None | None |
| +1/2 | + | 0 |  | 0 | + | 0 |  | None | None |
|  | + | 0 |  | 0 | + | 0 |  | None | None |
| +3/4 | 0 | 0 | 0 | 0 | 0 | 0 | 0 | None | None |
|  | 0 | 0 | 0 | 0 | 0 | 0 | 0 | None | None |

TABLE 3

Normal slots (pitch $\lambda g/2$)

| z \ t | -3/2 | -5/4 | -1 | -3/4 | -1/2 | -1/4 | 0 | 1/4 | 1/2 |
|---|---|---|---|---|---|---|---|---|---|
| +0 | − | 0 | + | 0 | − | 0 | + | None | None |
|  | − | 0 | + | 0 | − | 0 | + | None | None |
| +1/4 | 0 | 0 | 0 | 0 | 0 | 0 | 0 | None | None |
|  | 0 | 0 | 0 | 0 | 0 | 0 | 0 | None | None |
| +1/2 | + | 0 | − | 0 | + | 0 | − | None | None |
|  | + | 0 | − | 0 | + | 0 | − | None | None |
| +3/4 | 0 | 0 | 0 | 0 | 0 | 0 | 0 | None | None |
|  | 0 | 0 | 0 | 0 | 0 | 0 | 0 | None | None |

Each of the waveguides 1a and 1b has the aforementioned properties, and identical standing waves exist in the upper and lower portions. Therefore, the intensity of a microwave increases. In Table 2, however, the polarity inverts in a z direction for each $\lambda g/2$, and cancellation necessarily occurs in a middle portion between slots. Hence, the uniformity of the wavefront as a whole is not so high.

In Table 3, the phases are the same in the z direction. However, since the pitch is $\lambda g/2$, the uniformity is of a problem although no cancellation takes place.

Figure 48:
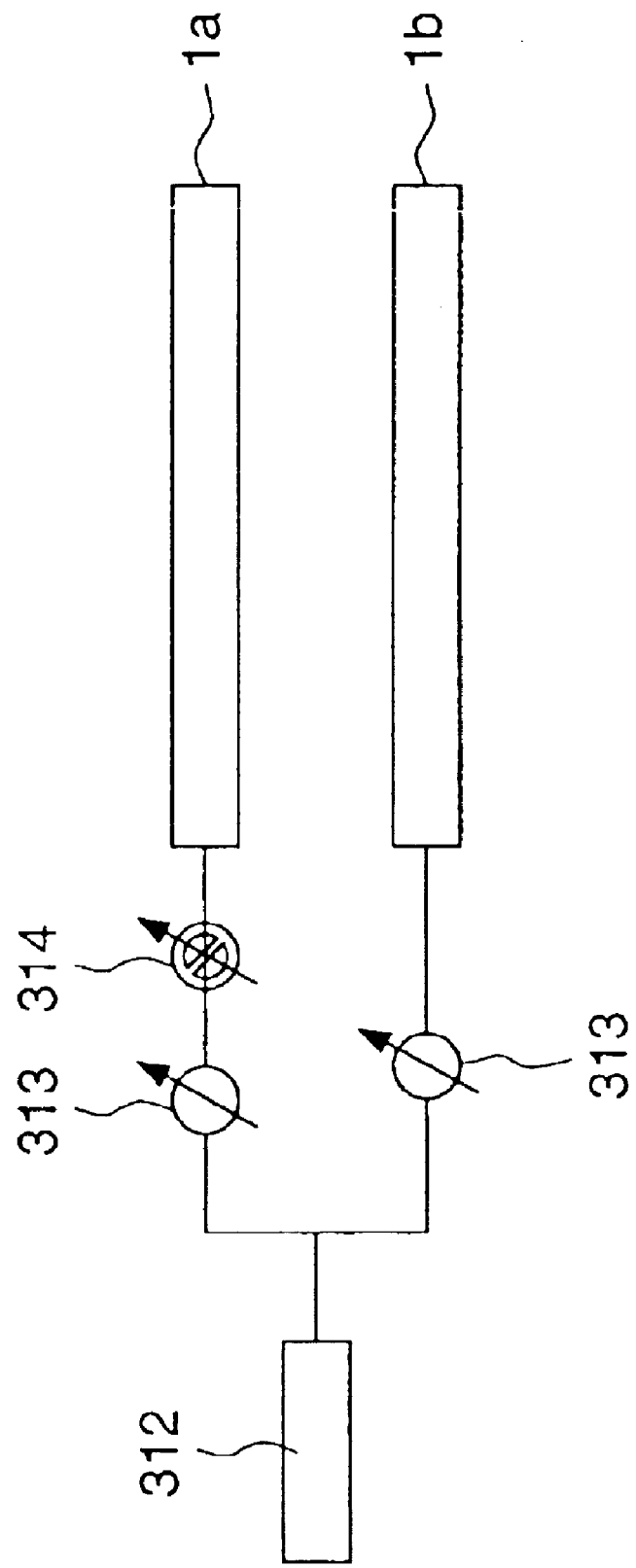
FIG. 48 is a schematic view showing waveguides normally arranged in the excimer laser oscillator according to the 11th embodiment.

A case in which space shift and phase shift are performed will be described below. FIG. 48 is a schematic view showing the vicinities of the waveguides 1a and 1b when these shift operations are performed.

In FIG. 48, reference numeral 312 denotes a microwave source connected to both of the waveguides 1a and 1b; and 313, tuners respectively connected to the waveguides 1a and 1b. These tuners 313 are, e.g., 3-stab tuners, E-H tuners or 4E turners and have a function of minimizing reflections from the waveguides 1a and 1b to the a microwave source 312. Reference numerals 314 denotes a phase adjusting shifter for shifting the phases of microwaves supplied into the waveguides 1a and 1b relative to each other. This phase shifter 314 is connected to one of the waveguides 1a and 1b, in this embodiment, to the waveguide 1a.

Figure 49:
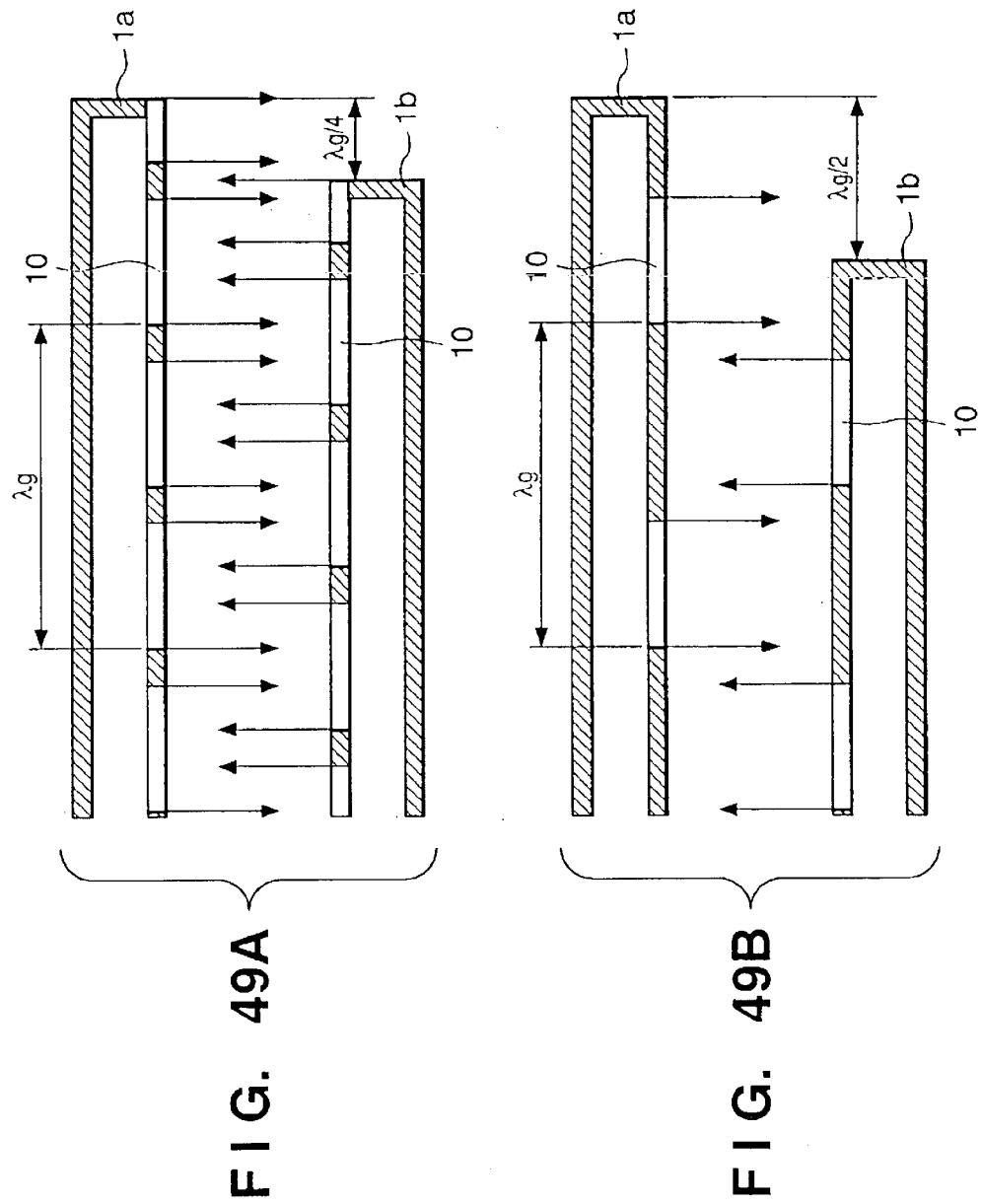
FIGS. 49A and 49B are schematic views showing the waveguides when $\lambda g/2$ space shift and $\lambda g/2$ phase shift are performed at a pitch of $\lambda g$ in the excimer laser oscillator according to the 11th embodiment.

A case in which λg/4 space shift is performed at a pitch of λg/2 is shown in Table 4, and a case in which λg/4 space shift and λg/4 phase shift are performed at the same pitch is shown in Table 5. FIG. 49A shows these cases (FIG. 49A is an enlarged view of the waveguides 1a and 1b in FIG. 48). Also, a case in which λg/2 space shift is performed is shown in Table 6, and a case in which λg/2 space shift and λg/2 phase shift are performed is shown in Table 7.

TABLE 4

λg/4 shift slots

| z \ t | -3/2 | -5/4 | -1 | -3/4 | -1/2 | -1/4 | 0 | 1/4 | 1/2 |
|---|---|---|---|---|---|---|---|---|---|
| +0 | 0 |  | 0 |  | 0 |  | 0 |  | None |
|  |  | 0 |  | 0 |  | 0 |  | None | None |
| +1/4 | 0 |  | 0 |  | 0 |  | 0 |  | None |
|  | 0 |  | 0 |  | 0 |  | 0 | None | None |
| +1/2 | 0 |  | 0 |  | 0 |  | 0 |  | None |
|  |  | 0 |  | 0 |  | 0 |  | None | None |
| +3/4 | 0 |  | 0 |  | 0 |  | 0 |  | None |
|  | 0 |  | 0 |  | 0 |  | 0 | None | None |

TABLE 5

λg/4 shift + λg/4 shifter slots

| z \ t | -3/2 | -5/4 | -1 | -3/4 | -1/2 | -1/4 | 0 | 1/4 | 1/2 |
|---|---|---|---|---|---|---|---|---|---|
| +0 | 0 |  | 0 |  | 0 |  | 0 |  | None |
|  |  | 0 |  | 0 |  | 0 |  | None | None |
| +1/4 | 0 | 0 | 0 | 0 | 0 | 0 | 0 | 0 | None |
|  | 0 | 0 | 0 | 0 | 0 | 0 | 0 | None | None |
| +1/2 | 0 |  | 0 |  | 0 |  | 0 |  | None |
|  |  | 0 |  | 0 |  | 0 |  | None | None |
| +3/4 | 0 | 0 | 0 | 0 | 0 | 0 | 0 | 0 | None |
|  | 0 | 0 | 0 | 0 | 0 | 0 | 0 | None | None |

TABLE 6

λg/2 shift slots

| z \ t | -3/2 | -5/4 | -1 | -3/4 | -1/2 | -1/4 | 0 | 1/4 | 1/2 |
|---|---|---|---|---|---|---|---|---|---|
| +0 |  | 0 |  | 0 |  | 0 |  | 0 | - |
|  |  | 0 |  | 0 |  | 0 | None | None |  |
| +1/4 |  | 0 |  | 0 |  | 0 |  | 0 | 0 |
|  |  | 0 |  | 0 |  | 0 |  | None | None |
| +1/2 |  | 0 |  | 0 |  | 0 |  | 0 | + |
|  |  | 0 |  | 0 |  | 0 |  | None | None |
| +3/4 |  | 0 |  | 0 |  | 0 |  | 0 | 0 |
|  |  | 0 |  | 0 |  | 0 |  | None | None |

TABLE 7

λg/2 shift + λg/2 shifter slots

| z \ t | -3/2 | -5/4 | -1 | -3/4 | -1/2 | -1/4 | 0 | 1/4 | 1/2 |
|---|---|---|---|---|---|---|---|---|---|
| +0 |  | 0 |  | 0 |  | 0 |  | 0 | + |
|  |  | 0 |  | 0 |  | 0 |  | None | None |
| +1/4 |  | 0 |  | 0 |  | 0 |  | 0 | 0 |
|  |  | 0 |  | 0 |  | 0 |  | None | None |
| +1/2 |  | 0 |  | 0 |  | 0 |  | 0 | - |
|  |  | 0 |  | 0 |  | 0 |  | None | None |
| +3/4 |  | 0 |  | 0 |  | 0 |  | 0 | 0 |
|  |  | 0 |  | 0 |  | 0 |  | None | None |

When λg/4 space shift is performed, the phase relationship between the upper and lower slots 10 is shifted by $\pi/2$, the plasma excitation has a double period. When λg/2 space shift is performed, the plasma excitation has only one period, so the problem of the double period is avoided. However, sufficient intensity is usually difficult to obtain owing to the aforementioned properties of the pitch λg/2 that adjacent slots 10 in the waveguides 1a and 1b have opposite phases.

A case in which λg/4 space shift is performed at a pitch of λg is shown in Table 8, and a case in which λg/4 space shift and λg/4 phase shift are performed at the same pitch is shown in Table 9. Also, a case in which λg/2 space shift is performed is shown in Table 10, and a case in which λg/2 space shift and λg/2 phase shift are performed is shown in Table 11. FIG. 49B shows these cases (FIG. 49B is an enlarged view of the waveguides 1a and 1b in FIG. 48).

TABLE 8

λg/4 shift slots

| z \ t | -3/2 | -5/4 | -1 | -3/4 | -1/2 | -1/4 | 0 | 1/4 | 1/2 |
|---|---|---|---|---|---|---|---|---|---|
| +0 | 0 | 0 | 0 | 0 | 0 | 0 | 0 | 0 | None |
|    | - | 0 | + | 0 | - | 0 | + | None | None |
| +1/4 | 0 | - | 0 | + | 0 | - | 0 | + | None |
|    | 0 | 0 | 0 | 0 | 0 | 0 | 0 | None | None |
| +1/2 | 0 | 0 | 0 | 0 | 0 | 0 | 0 | 0 | None |
|    | + | 0 | - | 0 | + | 0 | - | None | None |
| +3/4 | 0 | + | 0 | - | 0 | + | 0 | - | None |
|    | 0 | 0 | 0 | 0 | 0 | 0 | 0 | None | None |

TABLE 9

λg/4 shift slots + λg/4 shifter slots

| z \ t | -3/2 | -5/4 | -1 | -3/4 | -1/2 | -1/4 | 0 | 1/4 | 1/2 |
|---|---|---|---|---|---|---|---|---|---|
| +0 | 0 | - | 0 | + | 0 | - | 0 | + | None |
|    | - | 0 | + | 0 | - | 0 | + | None | None |
| +1/4 | 0 | 0 | 0 | 0 | 0 | 0 | 0 | 0 | None |
|    | 0 | 0 | 0 | 0 | 0 | 0 | 0 | None | None |
| +1/2 | 0 | + | 0 | - | 0 | + | 0 | - | None |
|    | + | 0 | - | 0 | + | 0 | - | None | None |
| +3/4 | 0 | 0 | 0 | 0 | 0 | 0 | 0 | 0 | None |
|    | 0 | 0 | 0 | 0 | 0 | 0 | 0 | None | None |

TABLE 10

λg/2 shift slots

| z \ t | -3/2 | -5/4 | -1 | -3/4 | -1/2 | -1/4 | 0 | 1/4 | 1/2 |
|---|---|---|---|---|---|---|---|---|---|
| +0 | + | 0 | + | 0 | + | 0 | + | 0 | + |
|    | - | 0 | + | 0 | - | 0 | + | None | None |
| +1/4 | 0 | 0 | 0 | 0 | 0 | 0 | 0 | 0 | 0 |
|    | 0 | 0 | 0 | 0 | 0 | 0 | 0 | None | None |
| +1/2 | + | 0 | - | 0 | + | 0 | - | 0 | + |
|    | + | 0 | - | 0 | + | 0 | - | None | None |
| +3/4 | 0 | 0 | 0 | 0 | 0 | 0 | 0 | 0 | 0 |
|    | 0 | 0 | 0 | 0 | 0 | 0 | 0 | None | None |

TABLE 11

λg/2 shift slots + λg/2 shifter slots

| z \ t | -3/2 | -5/4 | -1 | -3/4 | -1/2 | -1/4 | 0 | 1/4 | 1/2 |
|---|---|---|---|---|---|---|---|---|---|
| +0 | + | 0 | - | 0 | + | 0 | - | 0 | + |
|    | - | 0 | + | 0 | - | 0 | + | None | None |
| +1/4 | 0 | 0 | 0 | 0 | 0 | 0 | 0 | 0 | 0 |
|    | 0 | 0 | 0 | 0 | 0 | 0 | 0 | None | None |
| +1/2 | + | 0 | + | 0 | + | 0 | + | 0 | + |
|    | + | 0 | - | 0 | + | 0 | - | None | None |
| +3/4 | 0 | 0 | 0 | 0 | 0 | 0 | 0 | 0 | 0 |
|    | 0 | 0 | 0 | 0 | 0 | 0 | 0 | None | None |

When λg/4 space shift is performed, the plasma excitation has a double period as described previously. However, when the polarity of one of upper and lower corresponding slots 10 is + or − (when plasma is excited), the other polarity is 0 (no plasma is excited). Additionally, adjacent slots 10 in the waveguides 1a and 1b are in phase with each other. Accordingly, although there is a slight problem in the uniformity of light emission over the length of the waveguides 1a and 1b, emission uniformity to some extent can be expected.

Also, when λg/4 space shift and λg/4 phase shift are performed, the problem of the double period of light emission is avoided as described above. Additionally, adjacent slots 10 in the waveguides 1a and 1b are in phase with each other. Accordingly, although there is a slight problem in the uniformity of light emission over the length of the waveguides 1a and 1b, emission uniformity to some extent can be expected.

When $\lambda g/2$ space shift is performed, adjacent slots 10 in the waveguides 1a and 1b are in phase with each other. However, the upper and lower slots 10 have alternate polarities over the length of the waveguides 1a and 1b, so these upper and lower slots 10 may cancel out each other.

When $\lambda g/2$ space shift and $\lambda g/2$ phase shift are performed, the problem of the double period of plasma excitation is avoided as described above. Additionally, not only adjacent slots 10 in the waveguides 1a and 1b are in phase with each other, but also the upper and lower slots 10 are in phase with each other over the length of the waveguides 1a and 1b. Accordingly, all the upper and lower slots 10 uniformly emit a microwave in phase with each other. This realizes uniform plasma discharge over the length of the laser tube 2.

As described above, plasma discharge can be uniformized most optimally when $\lambda g/2$ space shift and $\lambda g/2$ phase shift are performed at the pitch $\lambda g$. Note that as described above, even in other cases, the uniformization of plasma discharge can be suitably realized depending on, e.g., the shape of the waveguide or the properties of a microwave.

Modification

A modification of the 11th embodiment will be described below. The same reference numerals as in the embodiment denote the same parts, and a detailed description thereof will be omitted.

Figure 50:
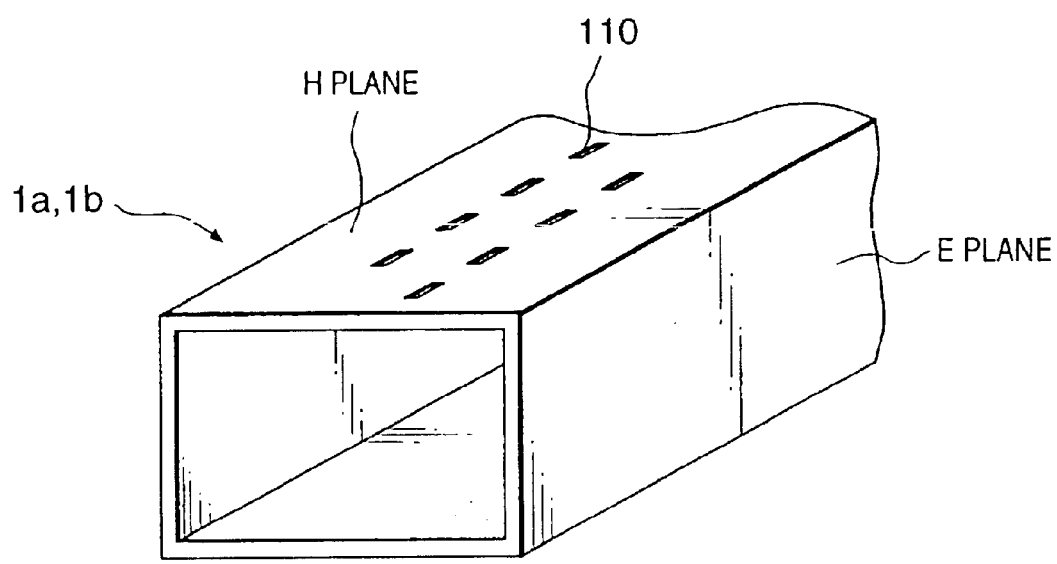
FIG. 50 is a perspective view showing the slot formation surface (H plane) in the waveguide.

In this embodiment, as shown in FIG. 50, the formation surface of the slots 10 is the lone end face, i.e., the H plane, of each of the waveguides 1a and 1b. These slots 10 are formed at equal intervals d on the right- and left-hand sides at a predetermined pitch (in this modification, a pitch of $\lambda g/2$) along the central line in the longitudinal direction of the H plane.

Figure 51:
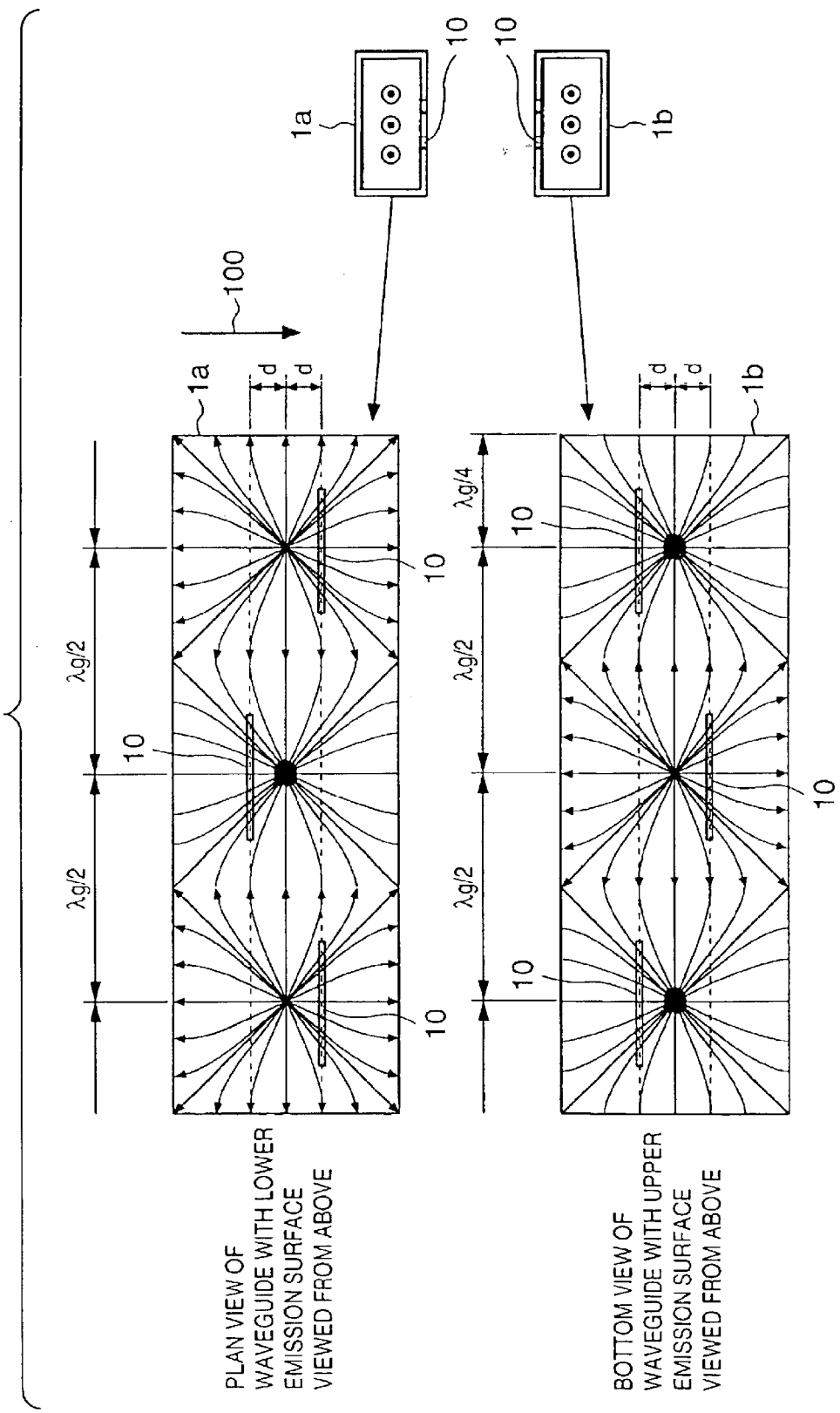
FIG. 51 is a schematic view showing the waveguides normally arranged in a modification of the excimer laser oscillator according to the 11th embodiment.

In this modification, as shown in FIG. 51, the pair of waveguides 1a and 1b are so formed as to vertically sandwich the laser tube 2 such that the corresponding slots 10 are positioned on the right- and left-hand sides between the opposing formation surfaces. Basically, this structure does not require any space shift or phase shift as in the above embodiment.

The arrows in FIG. 51 indicate electric currents flowing in the waveguide walls. A microwave exists as a standing wave in a propagation space defined by the distance in the longitudinal direction of the waveguides 1a and 1b. Owing to this standing wave, the currents in the waveguide walls also take the form of a standing wave. However, the form of the standing wave of a microwave is three-dimensional and complicated. So, it is convenient to consider only the electric field of a transient progressive wave (or reflected wave).

That is, between the upper and lower corresponding slots 10, the directions of currents flowing in the waveguides indicated by the arrows in FIG. 51 are the same (the direction indicated by an arrow 100). Also, the current directions are the same between adjacent upper and lower, right and left slots 10 of the waveguides 1a and 1b. Accordingly, microwaves emitted from the slots 10 are in phase with each other, so their standing waves do not cancel out each other.

In this modification, therefore, with a simpler arrangement than that of the above embodiment, microwaves are uniformly radiated in phase with each other from the upper and lower slots 10. This realizes uniform plasma discharge over the length of the laser tube 2.

As described above, the excimer laser oscillators of the 11th embodiment and its modification employ a slot array structure and yet realize uniform electromagnetic wave radiation over the length of a laser tube and allow uniform laser emission with minimum energy loss.

Note that the 11th embodiment is generally based on the assumption that the three-dimensional circuit from the waveguide resonator end to the microwave power supply is symmetrical in terms of a microwave. If this three-dimensional circuit is asymmetrical, phase shift or the like for compensating for this asymmetry is naturally required.

In the 11th embodiment as described above, although a slot array structure is used, it is possible to realize uniform electromagnetic wave radiation over the length of a laser tube and allow uniform laser emission with minimum energy loss.

12th Embodiment

Figure 52:
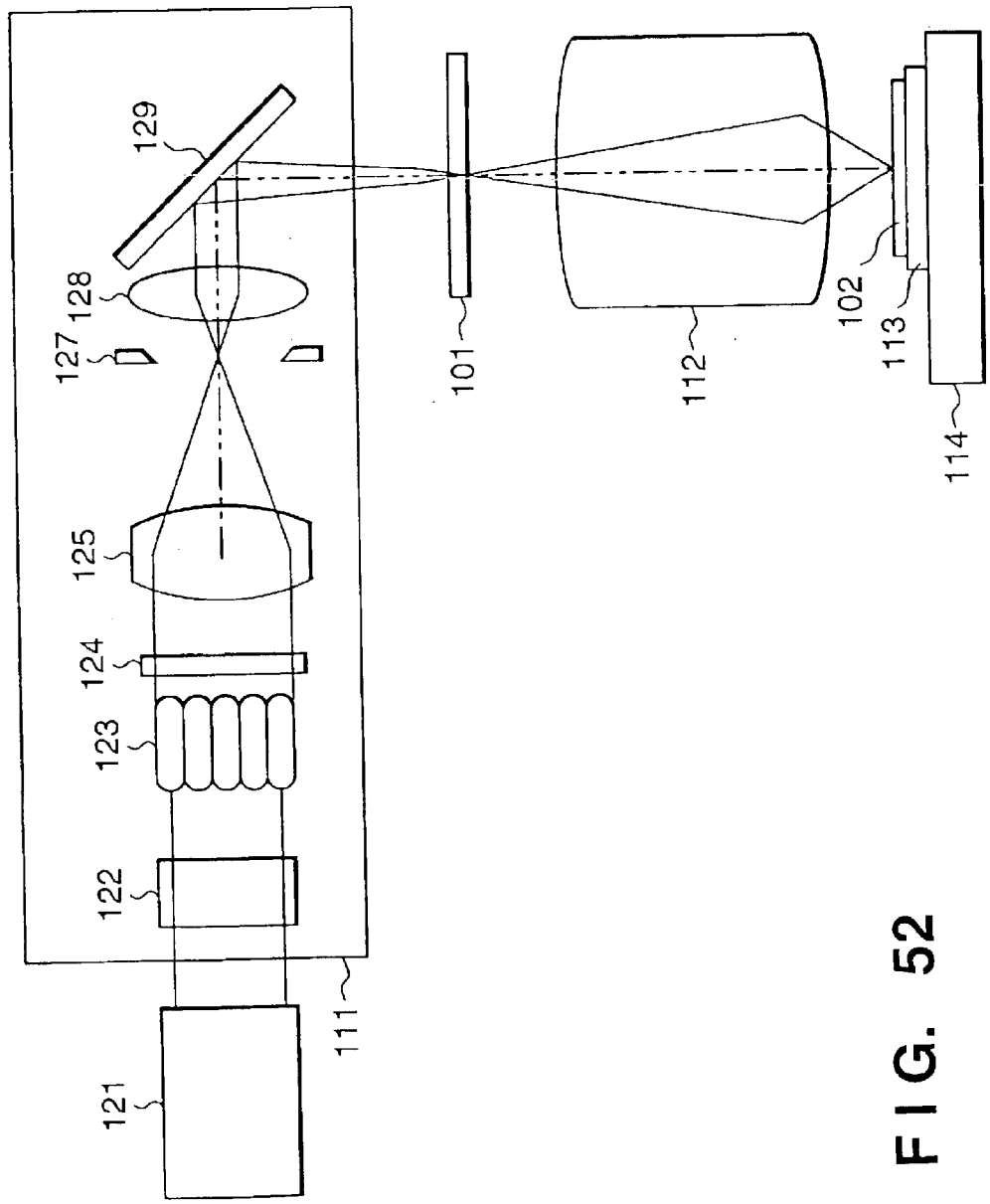
FIG. 52 is a schematic view showing a stepper according to the 12th embodiment.

The 12th embodiment will be described below. In this 12th embodiment, an exposure apparatus (stepper) having the excimer laser oscillator described in any of the first to 11th embodiments as a laser source will be explained. FIG. 52 is a schematic view showing the main components of this stepper.

This stepper comprises an optical system 111, projecting optical system 112, wafer chuck 113, and wafer stage 114. The optical system 111 irradiates a reticle 101 on which a desired pattern is drawn with illuminating light. The projecting optical system 112 receives the illuminating light through the reticle 101 and projects the pattern on the reticle 101 onto the surface of a wafer 102 in a reduced scale. The wafer chuck 113 mounts and fixes the wafer 102. The wafer stage 114 fixes the wafer chuck 113. Note that not only a transmission type reticle (reticle 101) shown in FIG. 52 but also a reflection type reticle can be used as a reticle.

The optical system 111 includes an excimer laser oscillator 121 of the first embodiment, beam shape converting means 122, optical integrator 123, stop member 124, condenser lens 125, blind 127, image forming lens 128, and reflecting mirror 129. The excimer laser oscillator 121 is a light source for emitting a high-luminance excimer laser beam as illuminating light. The beam shape converting means 122 converts the illuminating light from the light source 121 into a desired beam shape. The optical integrator 123 is formed by two-dimensionally arranging a plurality of cylindrical lenses or microlenses. The stop member 124 is placed near the position of secondary sources formed by the optical integrator 123 and can be switched to an arbitrary aperture value by a switching means (not shown). The condenser lens 125 condenses the illuminating light passing through the stop member 124. The blind 127 is constructed of, e.g., four variable blades and placed on the conjugate plane of the reticle 101 to determine an arbitrary illuminating range on the surface of the reticle 101. The image forming lens 128 projects the illuminating light formed into a predetermined shape by the blind 127 onto the surface of the reticle 101. The reflecting mirror 29 reflects the illuminating light from the image forming lens 128 toward the reticle 101.

An operation of projecting the pattern on the reticle 101 onto the surface of the wafer 102 in a reduced scale by using the stepper constructed as above will be described below.

First, the illuminating light emitted from the light source 121 is converted into a predetermined shape by the beam shape converting means 122 and directed to the optical integrator 123. Consequently, a plurality of secondary sources are formed near the exit surface of the optical integrator 123. Illuminating light from these secondary sources is condensed by the condenser lens 125 via the stop member 124 and formed into a predetermined shape by the blind 127. After that, the illuminating light is reflected by the reflecting mirror 129 via the image forming lens 128 and enters the reticle 101. Subsequently, the illuminating light enters the projecting optical system 122 through the pattern of the reticle 101. As the illuminating light passes through the projecting optical system, the pattern is reduced into predetermined dimensions and projected onto the surface of the wafer 102 to expose it.

The stepper of this embodiment uses the excimer laser oscillator of the first embodiment as a laser source. Therefore, a high-output and uniform excimer laser beam can be emitted for a relatively long time period. This allows rapid exposure of the wafer 102 with an accurate exposure amount.

Next, a semiconductor device fabrication method using the projecting exposure apparatus explained with reference to FIG. 52 will be described below.

Figure 53:
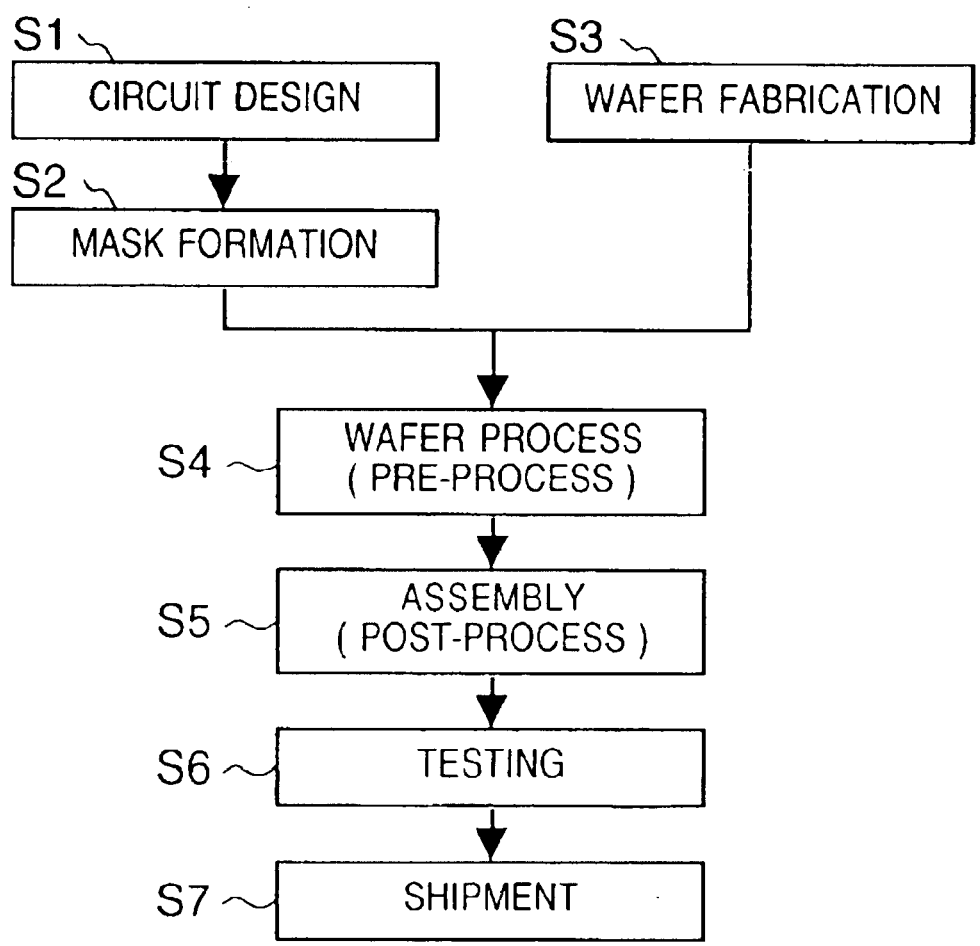
FIG. 53 is a flow chart showing semiconductor device fabrication steps using the stepper according to the 12th embodiment.

FIG. 53 shows the flow of fabrication steps of semiconductor devices (e.g., semiconductor chips such as ICs and LSIs, liquid crystal panels, or CCDs). First, in step 1 (circuit design), circuits of semiconductor devices are designed. In step 2 (mask formation), a mask having the designed circuit patterns is formed. In step 3 (wafer fabrication), wafers are fabricated by using materials such as silicon. Step 4 (wafer process) is called a pre-process in which actual circuits are formed on the wafers by the photolithography technique by using the mask and wafers prepared as above. Step 5 (assembly) is called a post-process in which semiconductor chips are formed from the wafers formed in step 4. This process includes steps such as an assembly step (dicing and bonding) and a packaging step (chip encapsulation). In step 6 (testing), tests such as an operation test and a durability test are conducted on the semiconductor devices fabricated in step 5. The semiconductor devices are completed through these steps and shipped (step 7).

Figure 54:
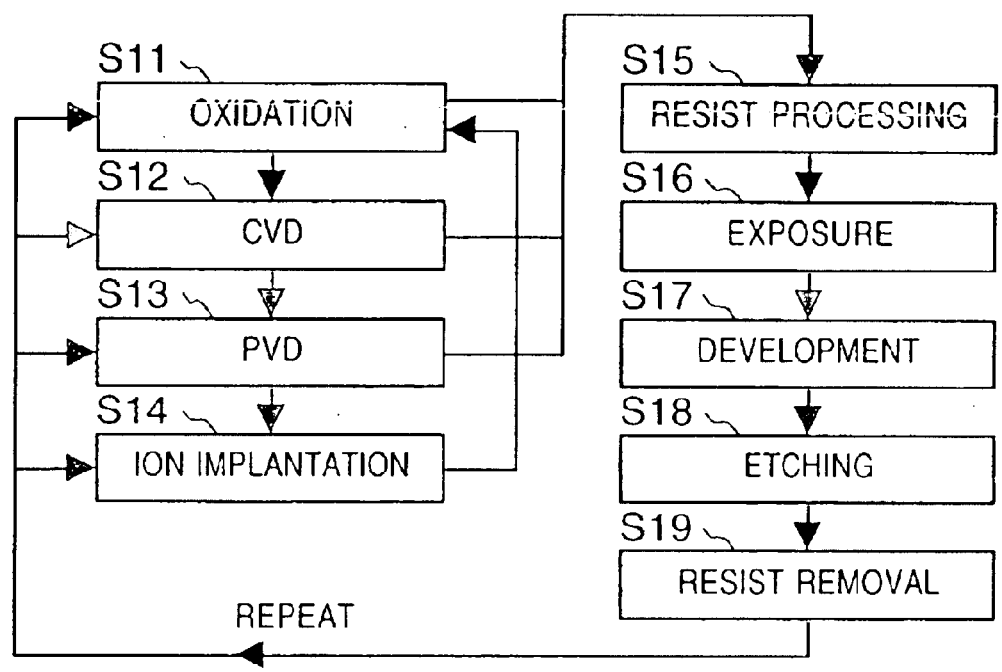
FIG. 54 is a flow chart showing details of a wafer process shown in FIG. 53.
Figure 55:
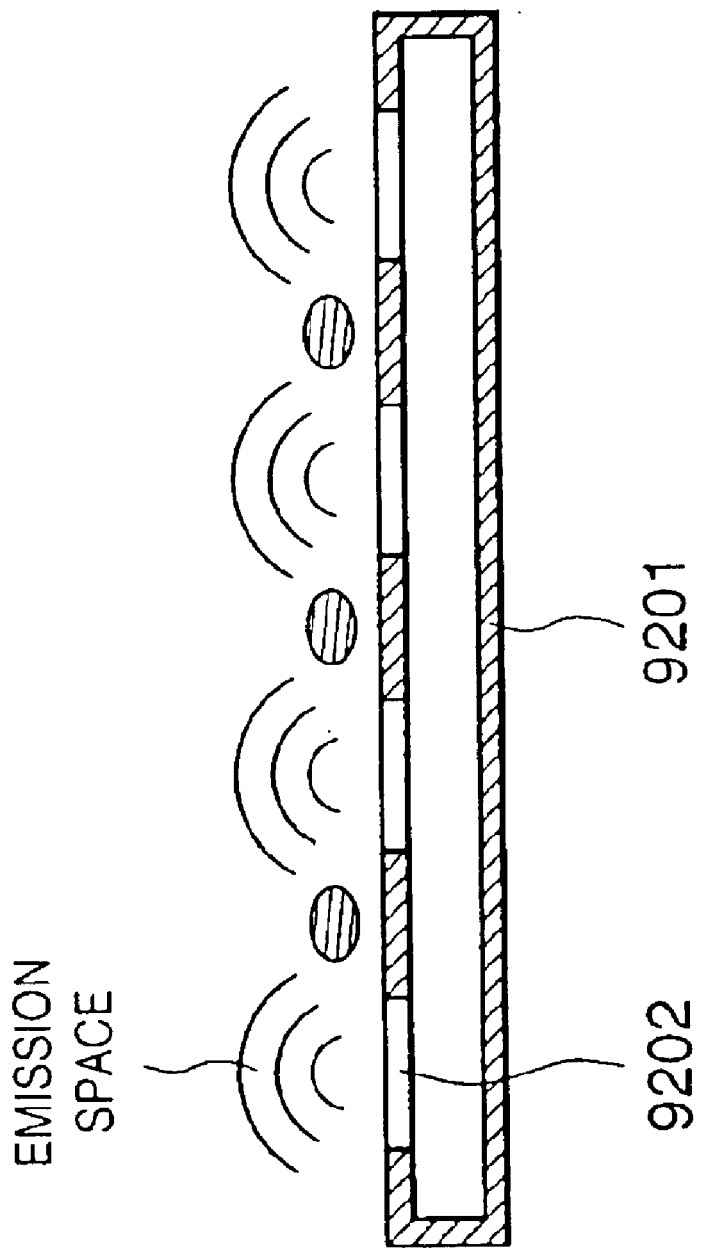
FIG. 55 is a schematic sectional view showing a practical structure of a general waveguide.
Figure 56A:
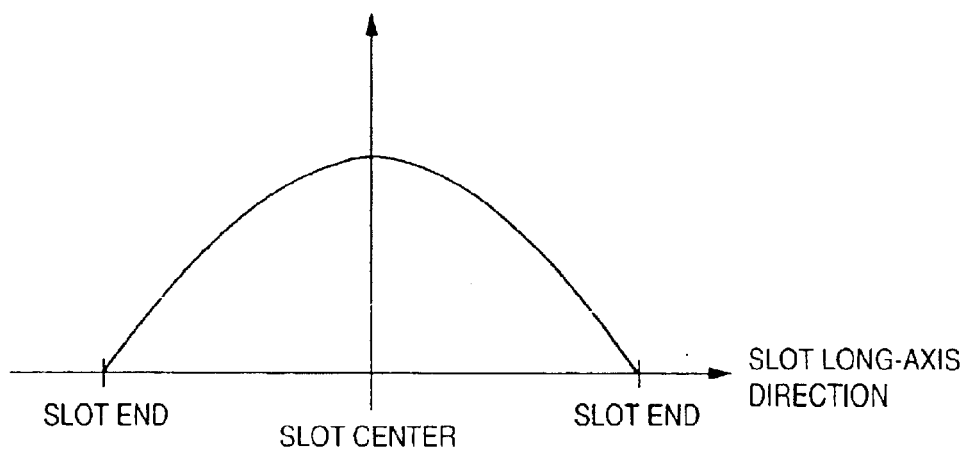
FIGS. 56A and 56B are graphs showing the intensity distributions of a microwave emitted from a slot in the general waveguide.
Figure 56B:
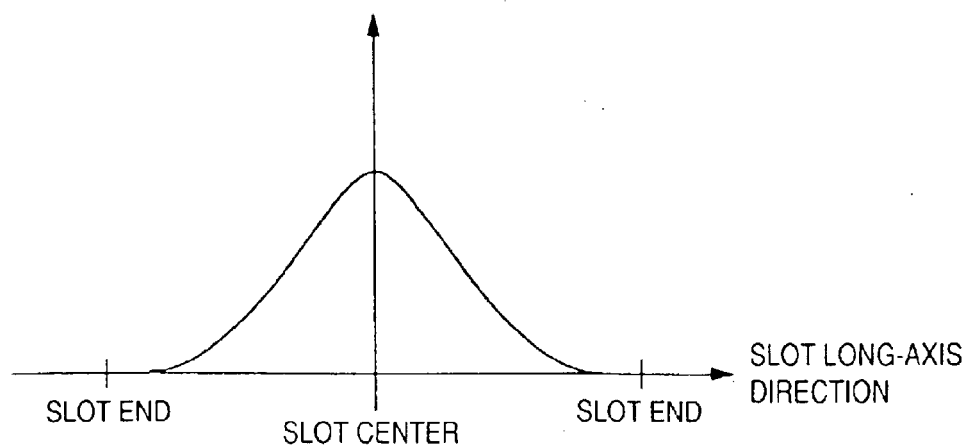
Figure 57:
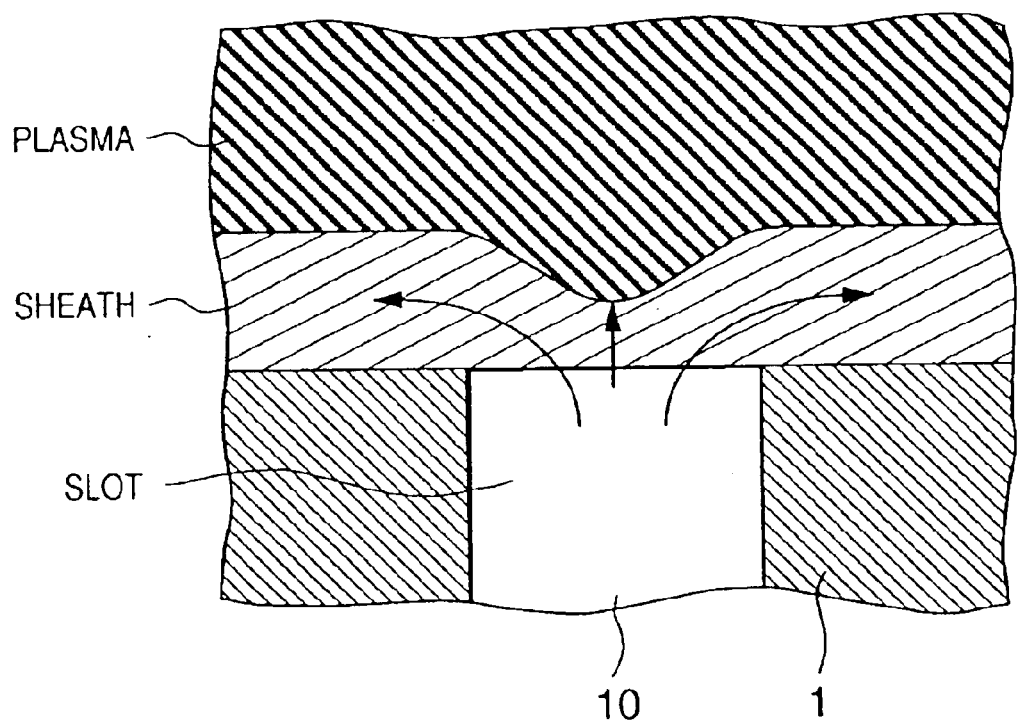
FIG. 57 is a schematic sectional view for explaining a sheath formed on a slot in a general laser oscillating apparatus.

FIG. 54 shows a detailed flow of the wafer process described above. Instep 11 (oxidation), the surfaces of the wafers are oxidized. In step 12 (CVD), conductive films and insulating films are formed on the wafer surfaces by using vapor phase reaction. In step 13 (PVD), conductive films and insulating films are formed on the wafers by sputtering or vapor deposition. In step 14 (ion implantation), ions are implanted into the wafers. In step 15 (resist processing), the wafers are coated with a photosensitive agent. In step 16 (exposure), the projecting exposure apparatus explained above is used to expose the wafers to the circuit patterns of the mask. In step 17 (development), the exposed wafers are developed. In step 18 (etching), portions except for the developed resist image are etched away. In step 19 (resist removal), the unnecessary resist after the etching is removed. Multiple circuit patterns are formed on the wafers by repeating these steps.

This fabrication method can easily and reliably fabricate, with high yield, highly integrated semiconductor devices which are conventionally difficult to fabricate.

As many apparently widely different embodiments of the present invention can be made without departing from the spirit and scope thereof, it is to be understood that the invention is not limited to the specific embodiments thereof except as defined in the appended claims.

What is claimed is:

1. A laser oscillating apparatus for generating a laser beam comprising:

a laser tube which is filled with a laser gas; and a waveguide which has a plurality of slots formed in a waveguide wall and introduces electromagnetic waves into said laser tube through said slots, wherein the width of longitudinal end portions of each of said slots are made larger than the width of a central portion thereof.

2. The apparatus according to claim 1, wherein said end portions have circular shapes with a diameter larger than the width of said central portion.

3. The apparatus according to claim 1, wherein the laser gas is one of at least one inert gas selected from the group consisting of Kr, Ar, He and Ne, and a gas mixture of the inert gas and $F_2$ gas.

4. A laser oscillating apparatus for generating a laser beam comprising:

a laser tube which is filled with a laser gas; and a waveguide which has a plurality of slots formed in a waveguide wall and introduces electromagnetic waves into said laser tube through said slots, wherein said slots are formed apart from a central axis along a longitudinal direction of said waveguide and each of said slots is curved such that longitudinal end portions of the slot are closer to the central axis than a central portion of the slot.

5. The apparatus according to claim 4, wherein said electromagnetic waves are radiated from said waveguide in the direction of a long end face of said waveguide.

6. The apparatus according to claim 4, wherein the laser gas is one of at least one inert gas selected from the group consisting of Kr, Ar, He and Ne, and a gas mixture of the inert gas and $F_2$ gas.

7. A laser oscillating apparatus for generating a laser beam comprising:

a laser tube which is filled with a laser gas; and a waveguide which has a plurality of slots formed in a waveguide wall and introduces electromagnetic waves into said laser tube through said slots, wherein an air-gap of resonating electromagnetic waves to be radiated from said slot to increase radiation efficiency is formed in said waveguide wall in which said slots are formed, said air gap being in flow communication with a slot and wider than an opening of that slot.

8. The apparatus according to claim 7, wherein said air-gap structure includes an air-gap portion formed near end portions of said slots within a range from said end portions to a distance of $\lambda g/4$ ($\lambda g$ is the waveguide wavelength of the electromagnetic wave).

9. The apparatus according to claim 7, wherein said air-gap structure includes an air-gap portion formed near end portions of said slots within a range from said end portions to a distance of $\lambda g/2$ ($\lambda g$ is the waveguide wavelength of the electromagnetic wave).

10. The apparatus according to claim 7, wherein an air-gap portion of said air-gap structure in a central portion of one of said slots is made smaller than an air-gap portion near end portions of said slot.

11. The apparatus according to claim 7, wherein in a direction perpendicular to a longitudinal direction of said slots, said air-gap structure is formed with a width equal to an integral multiple of $\lambda g/2$ ($\lambda g$ is the waveguide wavelength of the electromagnetic wave).

12. The apparatus according to claim 7, wherein the laser gas is one of at least one inert gas selected from the group consisting of Kr, Ar, He and Ne, and a gas mixture of the inert gas and $F_2$ gas.

13. A laser oscillating apparatus for generating a laser beam comprising:

a laser tube which is filled with a laser gas; and a waveguide which has a plurality of slots formed in a waveguide wall and introduces electromagnetic waves into said laser tube through said slots, wherein each of said plurality of slots has a tapered shape on a cross section parallel to the direction of introduction of an electromagnetic wave, whose sectional shape narrows toward said laser tube.

14. The apparatus according to claim 13, wherein the laser gas is one of at least one inert gas selected from the group consisting of Kr, Ar, He and Ne, and a gas mixture of the inert gas and $F_2$ gas.

15. A laser oscillating apparatus for generating a laser beam comprising:

a laser tube which is filled with a laser gas; and a waveguide which has a plurality of slots formed in a waveguide wall and introduces electromagnetic waves into said laser tube through said slots, wherein the widths of end portions in a longitudinal direction of each of said slots are made smaller than the width of a central portion thereof.

16. The apparatus according to claim 15, wherein the laser gas is one of at least one inert gas selected from the group consisting of Kr, Ar, He and Ne, and a gas mixture of the inert gas and $F_2$ gas.

17. A laser oscillating apparatus for generating a laser beam comprising:

a laser tube which is filled with a laser gas; and a waveguide which has a plurality of slots formed in a waveguide wall and introduces electromagnetic waves into said laser tube through said slots, wherein the length of said waveguide is substantially equal to an integer multiple of a half-wavelength of the electromagnetic wave in said waveguide so as to form a standing wave and each of said slots is formed so as to make the center of the slot substantially coincident with a node of the standing wave.

18. The apparatus according to claim 17, wherein said slots are formed in a line at a pitch equal to one of the wavelength or the half-wave length of an electromagnetic wave in said waveguide.

19. The apparatus according to claim 17, wherein an electromagnet wave introduced from said waveguide is a microwave.

20. The apparatus according to claim 17, wherein the laser gas is one of at least one inert gas selected from the group consisting of Kr, Ar, He and Ne, and a gas mixture of the inert gas and $F_2$ gas.

21. A laser oscillating apparatus for generating a laser beam comprising:

a laser tube which is filled with a laser gas;

a waveguide which has a plurality of slots formed in a waveguide wall and introduces electromagnetic waves into said laser tube through said slots; and a shielding structure provided in said laser tube, and formed on said waveguide wall in which said slots are formed, for shielding each of the electromagnetic waves emitted from said slots in order to prevent plasma generated by the electromagnetic waves from diffusing.

22. The apparatus according to claim 21, wherein said shielding structure is formed to prevent diffusion of the electromagnetic wave in a direction perpendicular to a longitudinal direction of said slots.

23. The apparatus according to claim 21, wherein said shielding structure comprises a metal wall spaced apart from said slots by a predetermined distance.

24. The apparatus according to claim 21, wherein said shielding structure is made from a mesh-like plate member.

25. The apparatus according to claim 21, wherein said shielding structure comprises a plurality of nozzle structures having predetermined openings.

26. The apparatus according to claim 25, wherein said nozzle is a passage of the laser gas.

27. The apparatus according to claim 21, wherein said shielding structure is formed by a magnetic field.

28. The apparatus according to claim 21, wherein the laser gas is one of at least one inert gas selected from the group consisting of Kr, Ar, He and Ne, and a gas mixture of the inert gas and $F_2$ gas.

29. A laser oscillating apparatus for generating a laser beam comprising:

a laser tube which is filled with a laser gas; and a waveguide which has a plurality of slots formed in a waveguide wall and introduces electromagnetic waves into said laser tube through said slots, wherein a plurality of slots are arranged in the short-side direction of the waveguide to form a row of slots, and a plurality of the rows are disposed in the long-side direction of the waveguide.

30. The apparatus according to claim 29, wherein a shielding structure for suppressing diffusion of plasma is formed inside said laser tube.

31. The apparatus according to claim 29, wherein the laser gas is one of at least one inert gas selected from the group consisting of Kr, Ar, He and Ne, and a gas mixture of the inert gas and $F_2$ gas.

32. A laser oscillating apparatus for generating a laser beam comprising:

a laser tube which is filled with a laser gas; and a pair of waveguides, each of which has a plurality of slots formed in a waveguide wall and introduces electromagnetic waves into said laser tube through said slots, wherein said pair of waveguides sandwich said laser tube and are constructed such that intensity distributions of electromagnetic waves introduced therefrom are shifted from each other.

33. The apparatus according to claim 32, wherein the surfaces having said slots are short end faces of said waveguides, and said slots are formed in a line at equal intervals in a longitudinal direction of said slots.

34. The apparatus according to claim 33, wherein said waveguides are arranged such that slots corresponding to each other between the opposing surfaces are shifted relative to each other by a predetermined distance.

35. The apparatus according to claim 34, wherein said slots are formed at a pitch equal to half of a wavelength in said waveguides, and the predetermined distance is ¼ of the wavelength.

36. The apparatus according to claim 34, wherein said slots are formed at a pitch equal to one wavelength in said waveguides, and the predetermined distance is half of said wavelength.

37. The apparatus according to claim 34, further comprising phase adjusting means for shifting phases of electromagnetic waves supplied into said waveguides relative to each other.

38. The apparatus according to claim 33, wherein each of said waveguides comprises tuning means for tuning an electromagnetic wave.

39. The apparatus according to claim 32, wherein an electromagnetic wave introduced from said waveguide is a microwave.

40. The apparatus according to claim 32, wherein the laser gas is one of at least one inert gas selected from the group consisting of Kr, Ar, He and Ne, and a gas mixture of the inert gas and $F_2$ gas.

41. The apparatus according to claim 29, wherein the width of said slots in end rows is smaller than the width of said slots near the center.

42. The apparatus according to claim 29, wherein the length of said slots in end rows is smaller than the length of said slots near the center.

* * * * *

UNITED STATES PATENT AND TRADEMARK OFFICE
CERTIFICATE OF CORRECTION

PATENT NO.     : 6,829,279 B1
DATED          : December 7, 2004
INVENTOR(S)    : Tadahiro Ohmi et al.

It is certified that error appears in the above-identified patent and that said Letters Patent is hereby corrected as shown below:

<u>Title page,</u>
Item [56], References Cited, FOREIGN PATENT DOCUMENTS,
"DE     263648" should read -- DD     263648 --.

<u>Column 5,</u>
Lines 18 and 27, "waves" should read -- wave --.

<u>Column 14,</u>
Line 5, "am" should read -- $\mu$m --; and
Line 11, "a" should read -- $\alpha$ --.

<u>Column 22,</u>
Line 44, "z = JZ$_0$ tan (2π•L/λg)" should read -- Z = jZ$_0$ tan (2π•L/λg) --.

<u>Column 25,</u>
Line 39, "depth σ" should read -- depth $\delta$ --;
Lines 46 and 49, "σ to 3σ" should read -- $\delta$ to 3$\delta$ --; and
Line 58, "λs" should read -- $\delta$s --.

<u>Column 26,</u>
Line 38, "alone+the" should read -- alone + the --.

<u>Column 28,</u>
Line 3, "<u>a</u>must" should read -- <u>a</u> must --;
Line 7, "mircowave" should read -- microwave --; and
Line 25, "a microwave" should read -- microwave --.

<u>Column 31,</u>
Line 38, "F$^2$gas." should read -- F$_2$ gas. --;
Line 40, "Kr/Ne/F$^2$" should read -- Fr/Ne/F$_2$ --;
Line 41, "Ar/Ne/F$^2$" should read -- Ar/Ne/F$_2$ --; and
Line 43, "Ne/F$^2$" should read -- Ne/F$_2$ --.

UNITED STATES PATENT AND TRADEMARK OFFICE
CERTIFICATE OF CORRECTION

PATENT NO. : 6,829,279 B1
DATED : December 7, 2004
INVENTOR(S) : Tadahiro Ohmi et al.

It is certified that error appears in the above-identified patent and that said Letters Patent is hereby corrected as shown below:

Column 33,
Line 24, "not space" should read -- no space --.

Signed and Sealed this

Nineteenth Day of July, 2005

JON W. DUDAS
*Director of the United States Patent and Trademark Office*